United States Patent [19]

Mahoney

[11] Patent Number: 5,068,603
[45] Date of Patent: Nov. 26, 1991

[54] STRUCTURE AND METHOD FOR PRODUCING MASK-PROGRAMMED INTEGRATED CIRCUITS WHICH ARE PIN COMPATIBLE SUBSTITUTES FOR MEMORY-CONFIGURED LOGIC ARRAYS

[75] Inventor: John E. Mahoney, San Jose, Calif.

[73] Assignee: Xilinx, Inc., San Jose, Calif.

[21] Appl. No.: 351,888

[22] Filed: May 15, 1989

Related U.S. Application Data

[63] Continuation-in-part of Ser. No. 106,750, Oct. 7, 1987, Pat. No. 4,855,669.

[51] Int. Cl.$^5$ .............................................. G01R 1/00
[52] U.S. Cl. ............................ 324/158 R; 324/158 T; 371/22.3
[58] Field of Search ....................... 371/22.3, 23.62; 324/158 R, 158 T

[56] References Cited

U.S. PATENT DOCUMENTS

| | | |
|---|---|---|
| 3,761,695 | 9/1973 | Eichelberger . |
| 3,783,254 | 1/1974 | Eichelberger . |
| 3,784,907 | 1/1974 | Eichelberger ...................... 324/617 |
| 4,177,452 | 12/1979 | Balasubramanian et al. . |
| 4,293,917 | 10/1981 | Dasgupta et al. . |
| 4,495,629 | 1/1985 | Zasio et al. . |
| 4,635,261 | 1/1987 | Anderson et al. . |
| 4,638,246 | 1/1987 | Blank et al. ............................ 371/62 |
| 4,642,487 | 2/1987 | Carter ................................. 307/468 |
| 4,695,740 | 9/1987 | Carter ................................. 307/475 |
| 4,706,216 | 11/1987 | Carter ................................. 365/154 |
| 4,713,557 | 12/1987 | Carter ................................. 307/475 |
| 4,746,822 | 5/1988 | Mahoney ............................ 307/605 |
| 4,821,233 | 4/1989 | Hsieh ................................... 365/154 |
| 4,835,418 | 5/1989 | Hsieh ................................... 307/475 |
| 4,868,825 | 9/1989 | Koeppe ................................ 371/23 |
| 4,902,910 | 2/1990 | Hsieh ................................... 307/350 |
| 4,907,180 | 3/1990 | Smith ................................... 371/25 |
| 4,963,824 | 10/1990 | Hsieh et al. ..................... 324/158 P |
| 4,980,636 | 12/1990 | Romamofsky et al. ......... 324/158 F |

FOREIGN PATENT DOCUMENTS 0205870 11/1983 Japan .................................... 371/23

OTHER PUBLICATIONS

"A Variation of LSSD and its Implications of Design and Test Pattern Generation in VLSI", by S. DasGupta et al., IEEE Internat. Test Conf., 1982, pp. 63–65.

"A Design for Complete Testability of Programmable Logic Arrays", by Ramanatha, IEEE Internat. Test Conf., 1982, pp. 67–74.

"Incomplete Scan Path with an Automatic Test Generat. Methodology", by Trischler, IEEE, Internat. Test Conf., 1980, pp. 153–161.

"High Speed PROMs with On-Chip Registers and Diagnostics", by Coli et al., Monolithic Memories System Des. Handbook, 1985, pp. (3–14)–(3–26).

(List continued on next page.)

Primary Examiner—Kenneth A. Wieder
Assistant Examiner—William J. Burns
Attorney, Agent, or Firm—Skjerven, Morrill, MacPherson, Franklin & Friel

[57] ABSTRACT

A structure and method for producing mask-configured integrated circuits which are pin compatible substitutes for user-configured logic arrays is disclosed. Mask-defined routing lines having resistive/capacitive characteristics simulating those of user-configurable routing paths in the user-configurable logic array are used in the mask-defined substitutes to replace the user-configurable routing paths. Scan testing networks are formed in the metal-configured substitutes to test the operability of logical function blocks formed on such chips. The scan testing networks comprise a plurality of test blocks each including three field effect pass transistors formed of four adjacent diffusion regions. Proper connection of the gates of these pass transistors to control lines controlling the transistors is tested by transmitting alternating high/low signals through serial conduction paths including the gate electrodes of these transistors.

14 Claims, 42 Drawing Sheets

OTHER PUBLICATIONS

"Diagnostic Devices and Algor. for Testing Dig. Systems", by Bengali et al., Monolithic Memories Sys. Des. Handbook, 1985, pp. 3/3-13.

"Design for Testability of the IBM System/38", by Stolte et al., IEEE Test Conf., 1979, pp. 29-36.

"Designing Digital Circuits with Easily Testable Consideration", by Fumatsu et al, IEEE Semicond. Test Conf., 1978, pp. 98-102.

"Design of Programmable Logic Arrays for Testability", by Son et al., IEEE Test Conf., 1980, pp. 163-166.

"CMOS is Most Testable", by Levi, IEEE Internat. Test Conf., 1981, pp. 217-220.

"Fault Diagnosis in an LSSD Environment", by Arzoumanian et al., IEEE Inter. Test Conf., 1981, pp. 86-88.

"Testing and Debugging Custom Integ. Circuits", by Frank et al., Computing Surveys, vol. 13, #4, 12/81, pp. 425-451.

"Testability Analysis of MOS VLSI Circuits", by Singer, IEEE Internat. Test Conf., 1984, pp. 690-696.

"Fault Simulation for Pass Transistor Circuits Using Logic Simulation Machines", by Barzilai et al., IBM Tech. Dist. Bull, vol. 27, #5, 10/84, pp. 2861-2864.

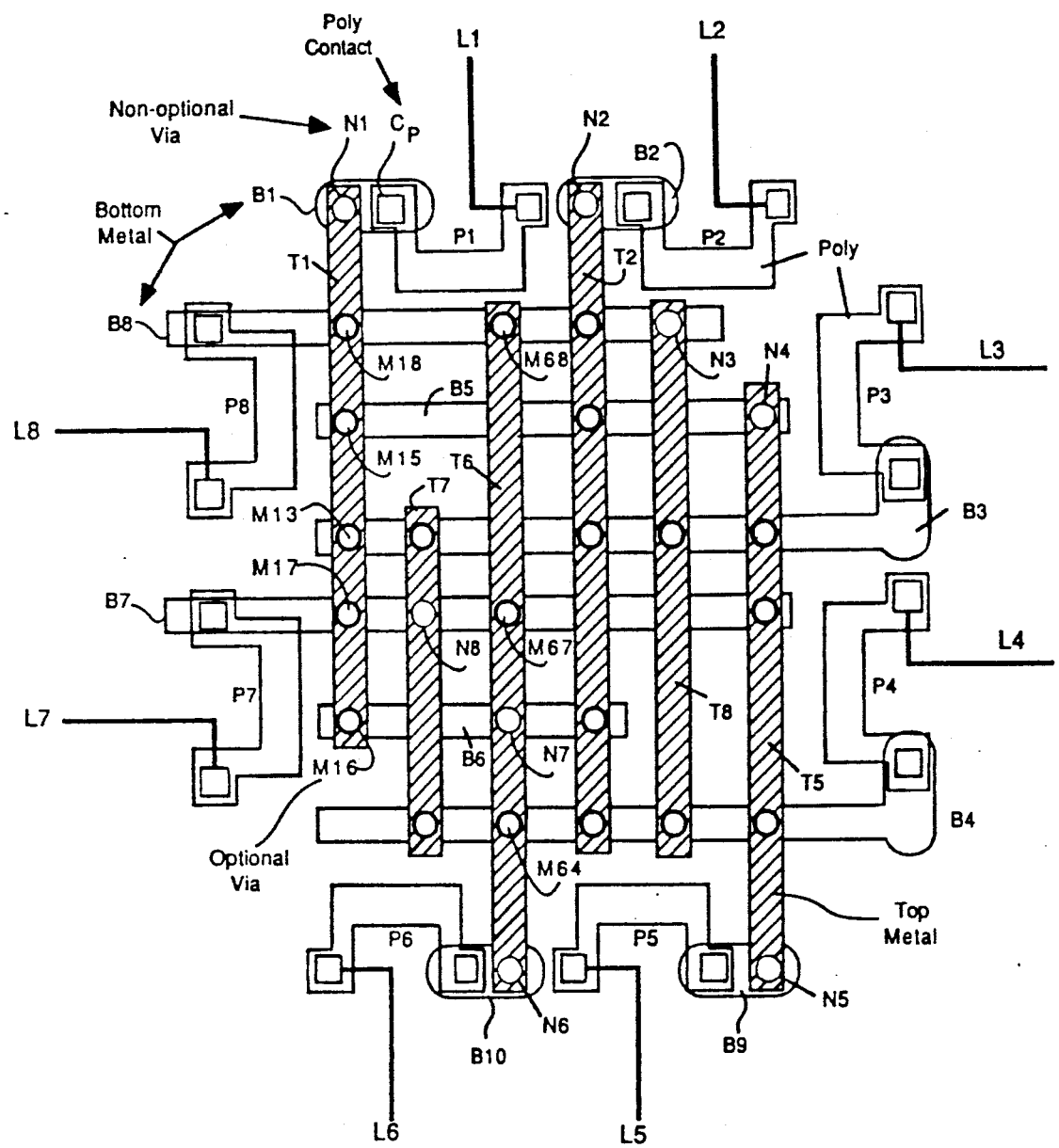

ALLOWED INTERCONNECTS

FROM LINE NUMBER

|   | 1 | 2 | 3 | 4 | 5 | 6 | 7 | 8 |
|---|---|---|---|---|---|---|---|---|
| 1 | ■ | N | Y | N | Y | Y | Y | Y |
| 2 | N | ■ | Y | Y | Y | Y | N | Y |
| 3 | Y | Y | ■ | N | Y | N | Y | Y |
| 4 | N | Y | N | ■ | Y | Y | Y | Y |
| 5 | Y | Y | Y | Y | ■ | N | Y | N |
| 6 | Y | Y | N | Y | N | ■ | Y | Y |
| 7 | Y | N | Y | Y | Y | Y | ■ | N |
| 8 | Y | Y | Y | Y | N | Y | N | ■ |

TO LINE NUMBER

Y = yes
N = no

LEGEND FOR FIG. 4B

| FIG. 4B-1 | FIG. 4B-2 |

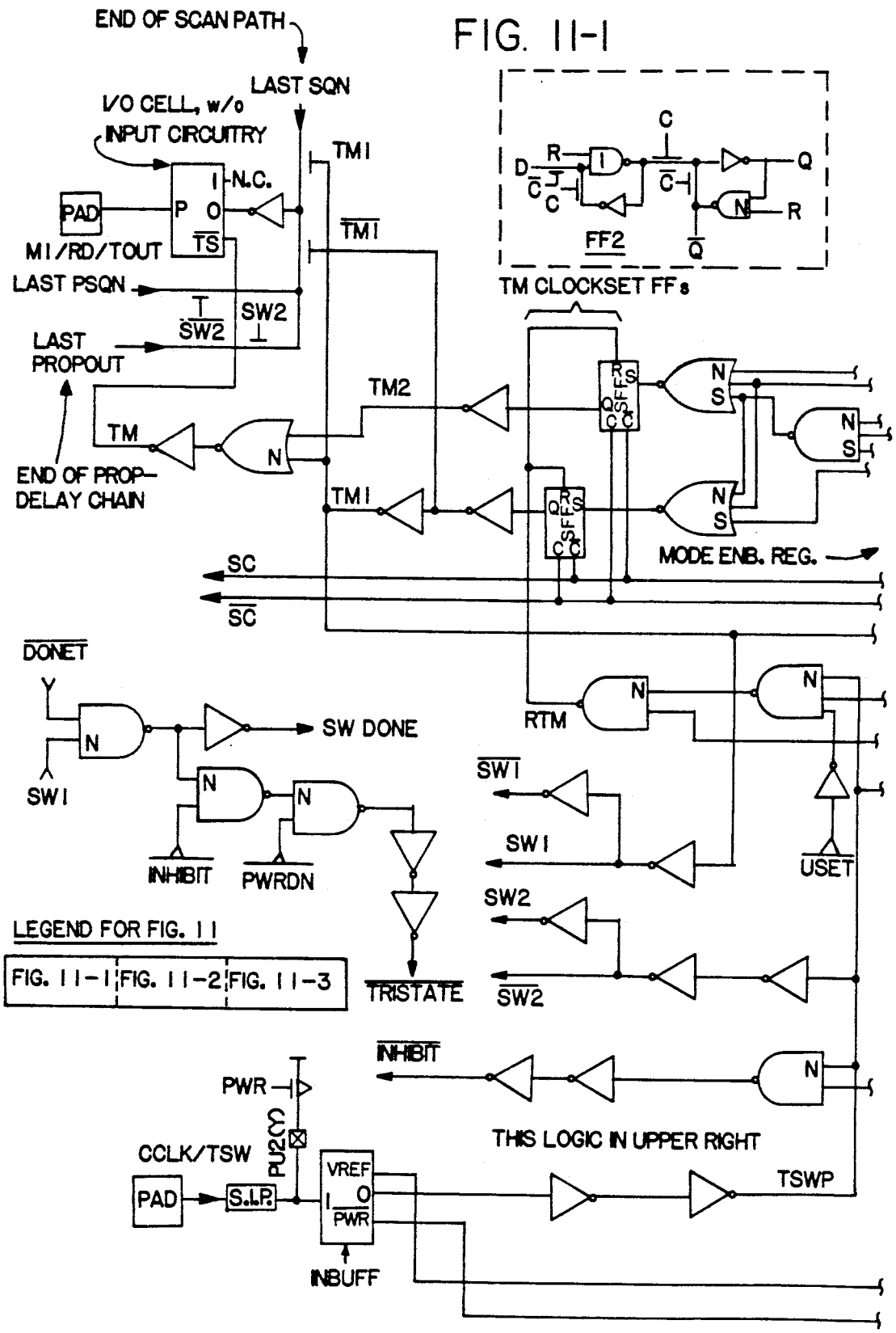

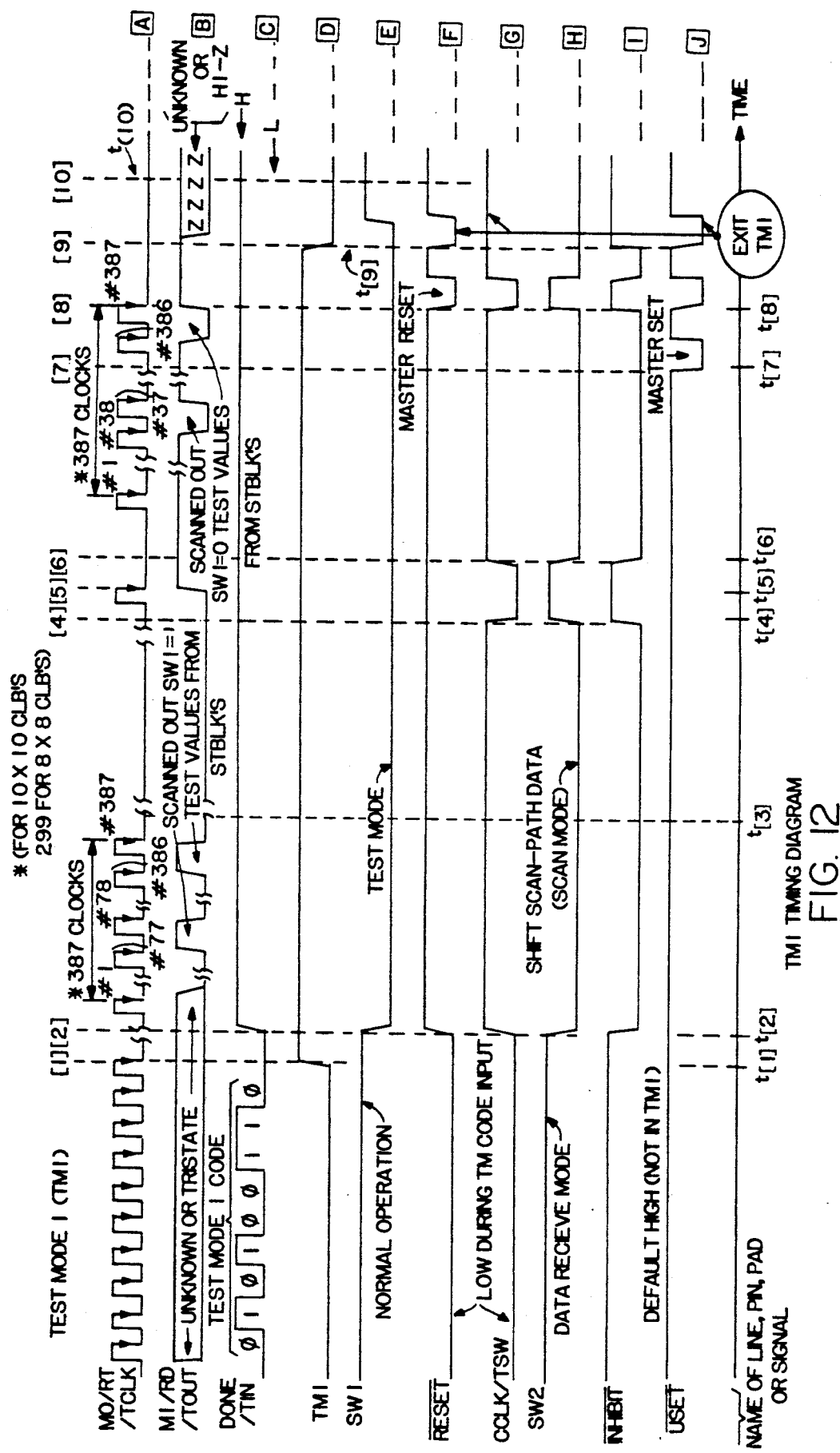
FIG. 12 TMI TIMING DIAGRAM

TM2 TIMING DIAGRAM

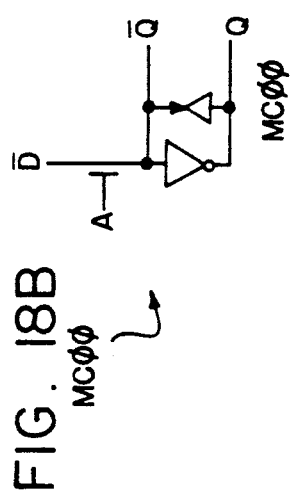
FIG. 18B MCØØ
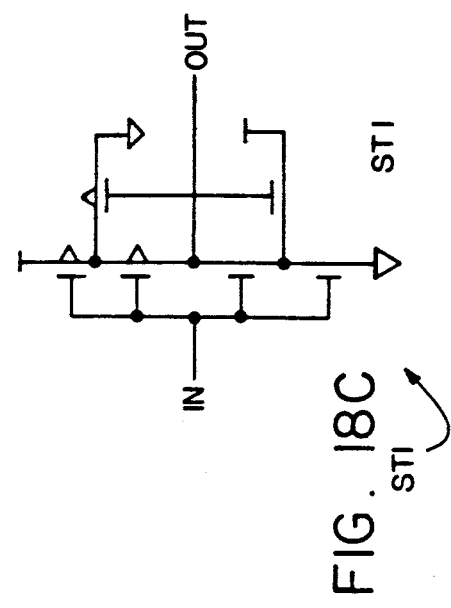
FIG. 18C STI
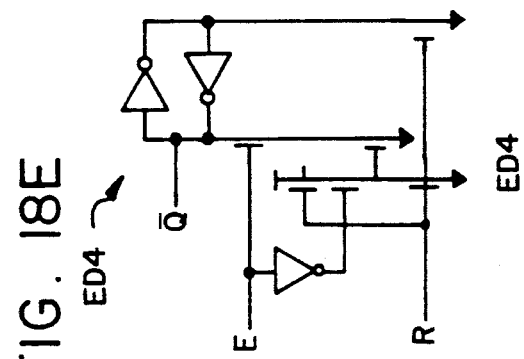
FIG. 18E ED4
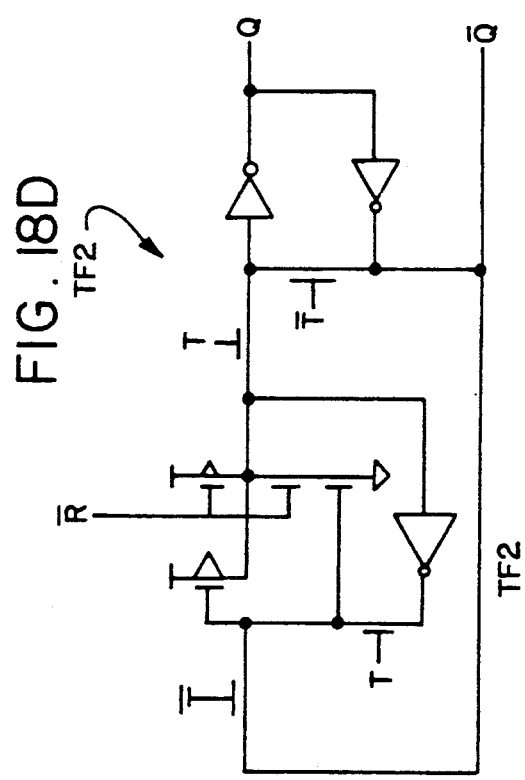
FIG. 18D TF2

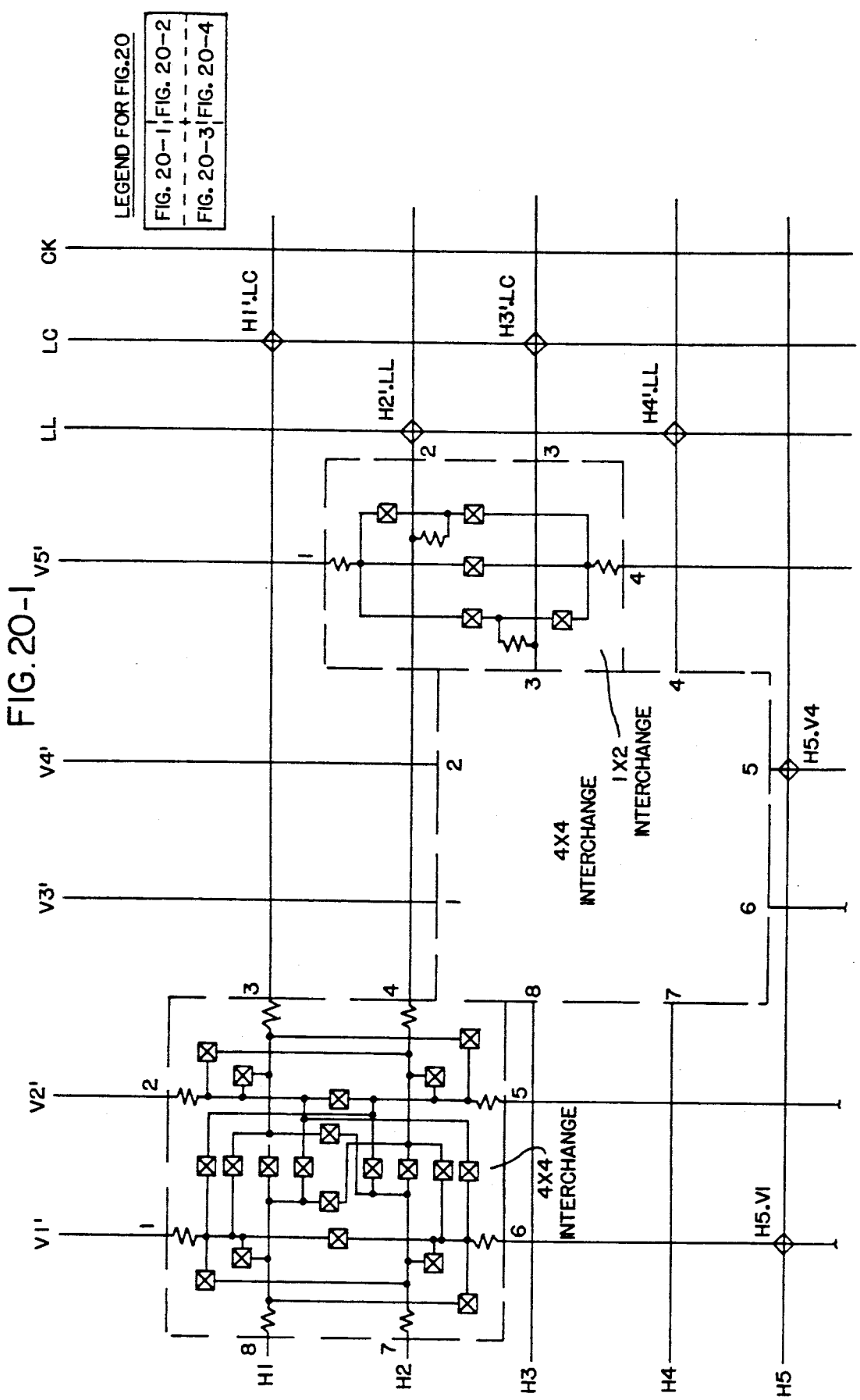

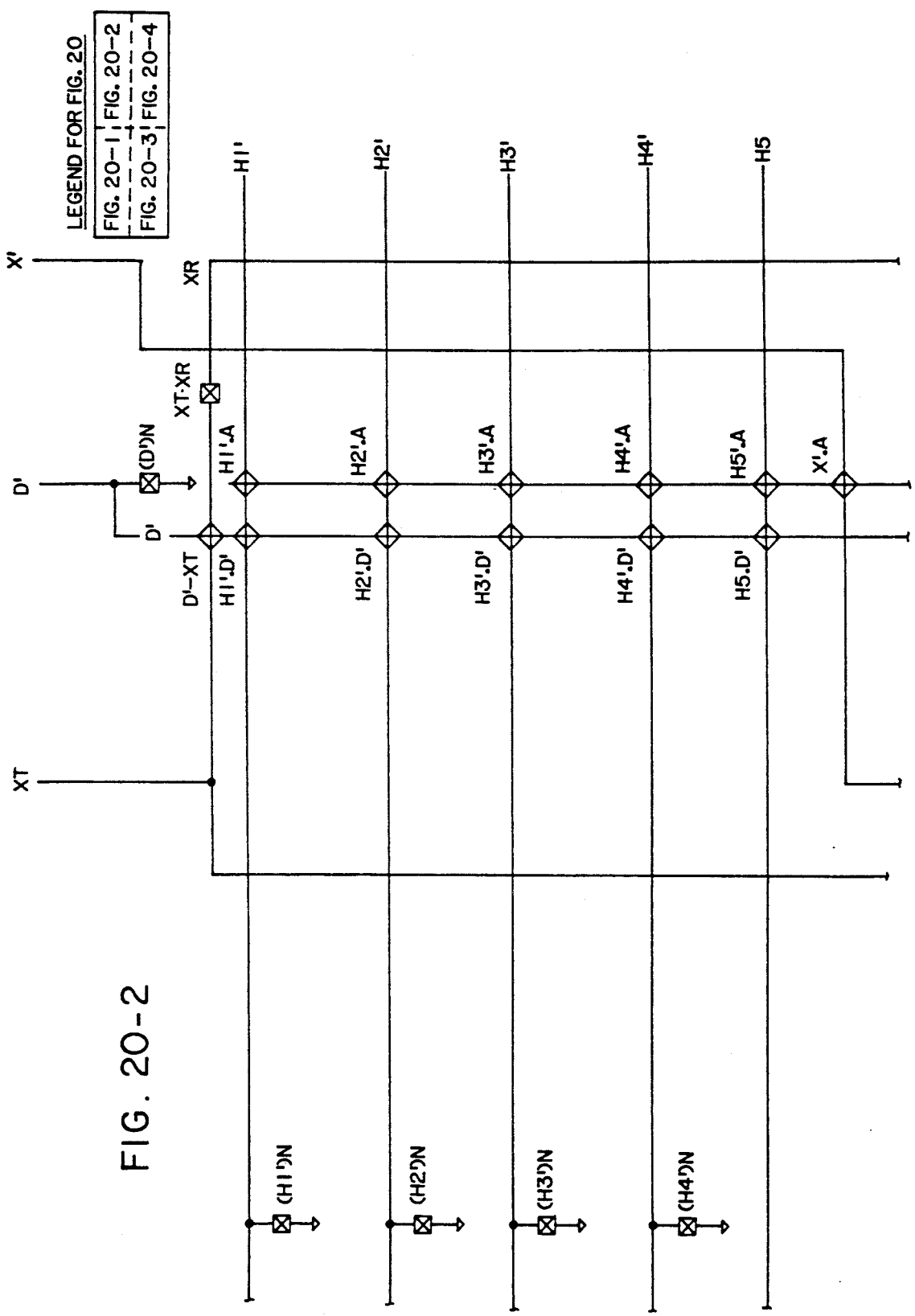

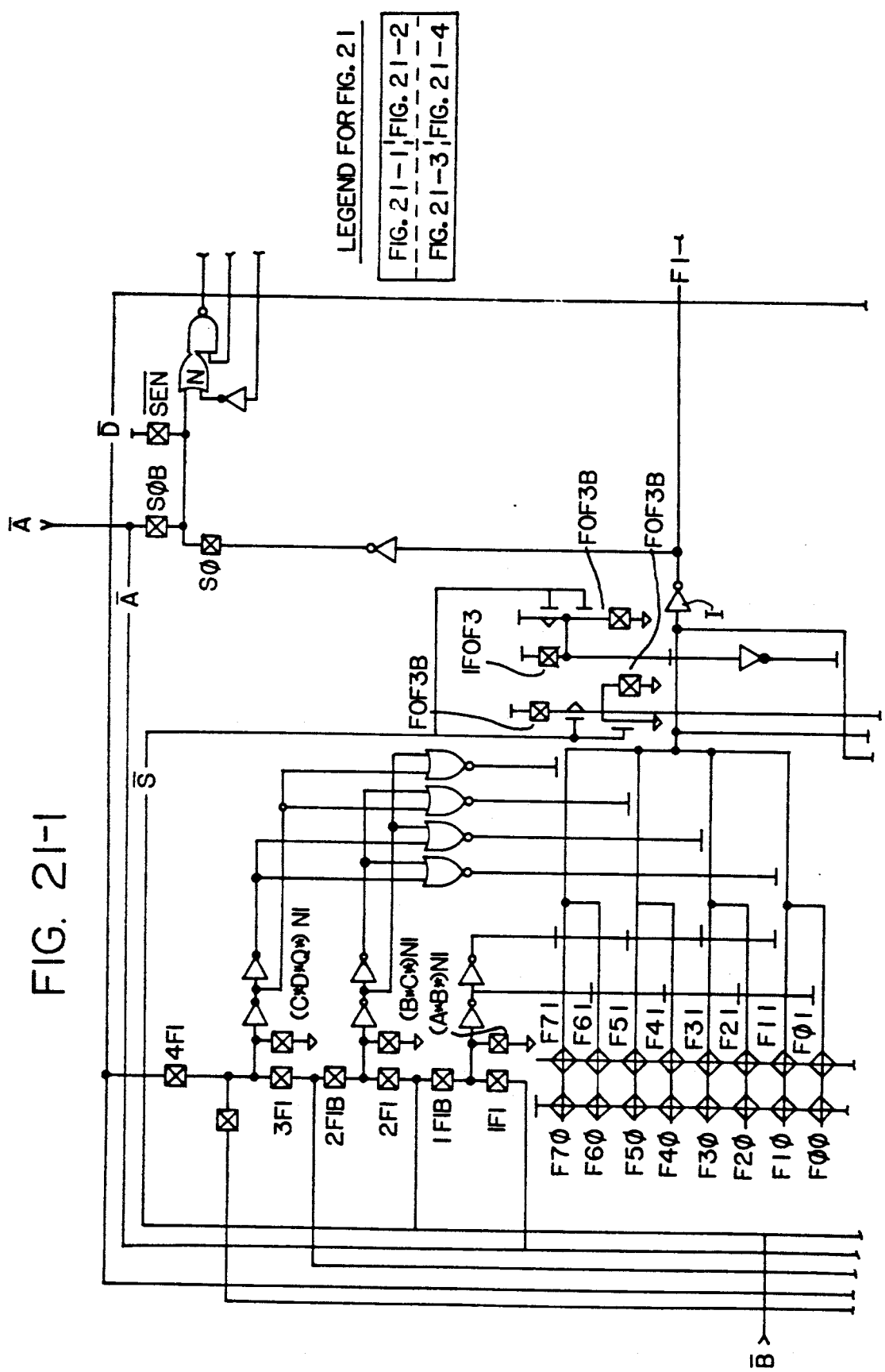

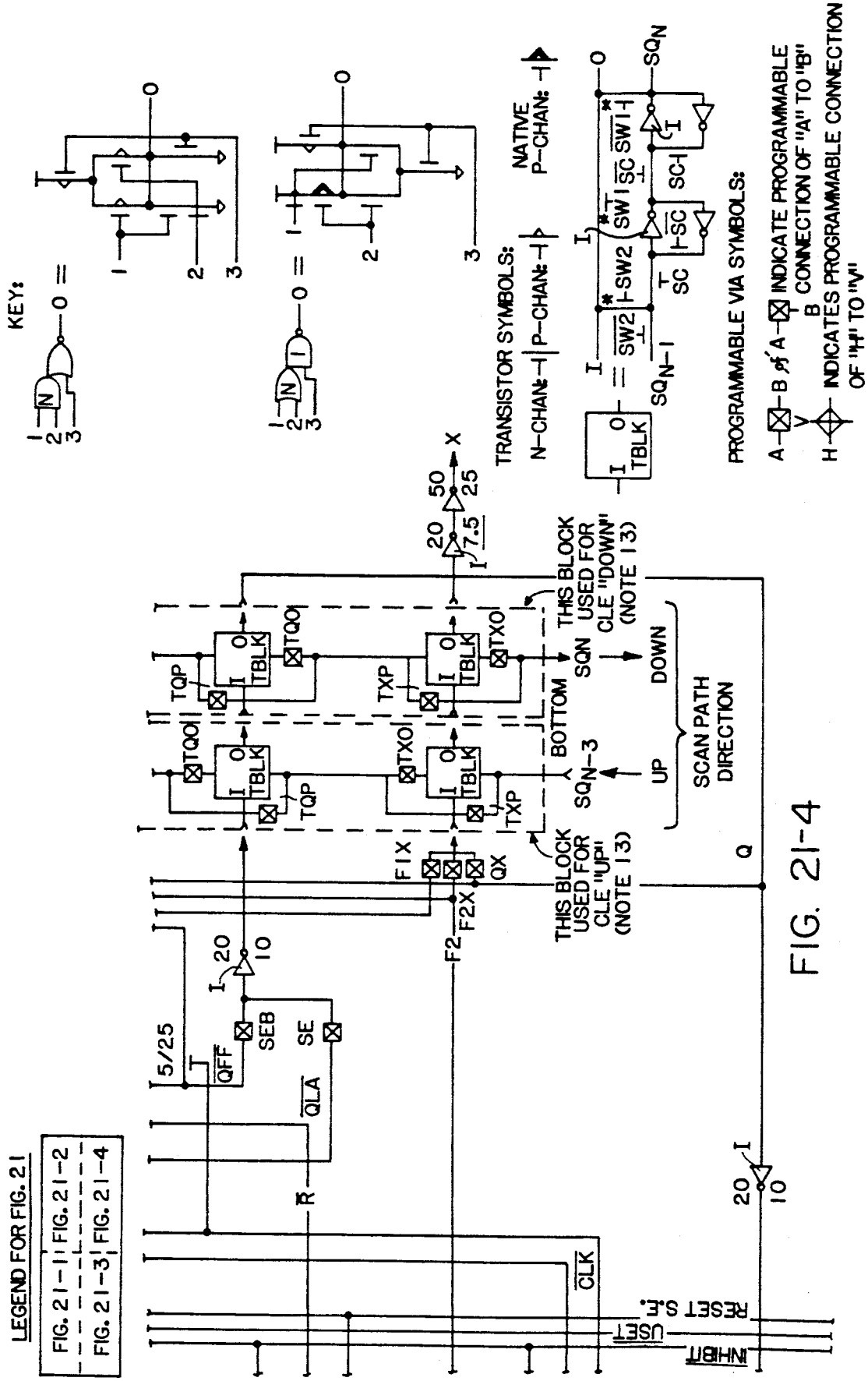

STRUCTURE AND METHOD FOR PRODUCING MASK-PROGRAMMED INTEGRATED CIRCUITS WHICH ARE PIN COMPATIBLE SUBSTITUTES FOR MEMORY-CONFIGURED LOGIC ARRAYS

BACKGROUND OF THE INVENTION

1. Cross Reference to Other Applications

This is a continuation in part of application Ser. No. 07/106,750 filed Oct. 7, 1987, now U.S. Pat. No. 9,855,669 by Mahoney, entitled "System For Scan Testing of Logic Networks" whose disclosure is incorporated herein by reference.

2. Field of the Invention

The present invention relates to high density arrays of digital logic gates and more specifically to a structure and method for producing mask-interconnected integrated circuit substitutes for high density memory-configured logic arrays.

3. Description of the Prior Art

Advancements in the technology of integrated circuits have enabled designers to place relatively large numbers of digital logic gates on a single integrated circuit chip (IC) By way of example, so-called Large Scale Integration (LSI) and Very Large Scale Integration (VSLI) technologies give designers the ability to place roughly 1,000–9,000 or more logic gates on a standard size IC.

Numerous approaches have evolved for interconnecting the logic gates of such high density, digital logic IC's. A first approach, which may be described by terms such as "hard-wired interconnection", "metal interconnection", etc. and is referred to herein as "mask-configured interconnection" or more simply MCI, uses the fixed layout of various conductive paths in the IC, that are either diffused in the substrate or patterned in metallization layers of the IC, to interconnect input and output terminals of logic gates one to the next. Because the layout design of these paths is at the heart of the chip fabrication process, the MCI approach usually requires that employees at large-volume chip manufacturers (chip foundries) become intimately involved, not only with the design and fabrication of the metalized or diffused conductive lines themselves, but also with the logic flow of the overall digital circuit, the latter aspect being referred to sometimes as the "firmware" portion of the IC design. Such involvement by personnel of the chip manufacturer may be undesirable from the point of view of independent, application-specific type of firmware developers (ASIC developers) who often wish to use the chip manufacturer simply as a "silicon foundry" and do not wish to have the involvement of foundry personnel expand beyond a blind stamping out of mask-defined IC's. If access is granted to all portions of the IC design, proprietary portions of the firmware might be compromised.

In contrast to the MCI approach, there has evolved a second approach for interconnecting the logic gates of a high density digital IC, which may be described as "soft-wiring", "software configured interconnection", etc. and is referred to herein as "user-configured interconnection" or more simply UCI. The UCI approach allows chip manufacturers to sell generic chips that have arrays of predesigned logic function blocks (sometimes referred to as "configurable logic elements" (CLE's) or "configurable logic blocks" (CLB's)) and programmable interconnection portions (i.e., fusible links). The generic chips have user accessible programming pins which enable the chip purchaser (user) to programmably make or break connections in the programmable interconnection portions of the chips and to thereby define circuit paths between the logical function blocks. A desired firmware configuration can be "programmed" into the generic IC in either a volatile or nonvolatile manner without participation by the generic chip manufacturer or other parties.

Products belonging to the UCI approach include so-called "field programmable logic arrays" (FPLA's), "logic cell arrays" (LCA's) and "programmable logic devices" (PLD's). In these UCI types of products the chip user is given the option of programmably blowing a fusible link, shorting an antifuse, or activating a plurality of pass transistors whose individual ON/OFF states are controlled by an on-chip memory array. The UCI approach is advantageous in that, unlike the MCI approach, it allows the user to quickly develop application specific integrated circuits (ASIC's) without having to rely on an outside chip manufacturer for meeting production deadlines. The UCI approach is further advantageous in that it gives the user freedom to experiment with different firmware configurations, optimize the firmware design and keep the optimized firmware design as proprietary information. As such the UCI approach is more desirable than the MCI approach during initial phases of product development.

The UCI approach loses its advantage over the MCI approach in later phases of a product's life cycle when demand for the product grows and chips need to be produced in relatively large volumes (i.e., 1,000 units or more). The total cost of the product at such a point in its life cycle tends to be greater when the mass produced item is in the form of a user-configured IC rather than a mask configured chip. One reason user configurable chips have larger overall cost is that small-volume users of UCI chips generally do not possess the same type of expertise as large volume chip manufacturers in identifying and correcting numerous failure mechanisms which may develop in the mass production of IC's. A need exists for allowing users to develop their firmware designs in privacy at the early stages of product development, and at the same time, for allowing large volume manufacturers to quickly step in, generate mask interconnected substitutes for user developed devices, and exercise their expertise in fault identification and correction at later stages in product development when a design is taken from a prototype version to a mass production version.

SUMMARY OF THE INVENTION

It is an object of the invention to provide a structure and method whereby developers of application specific integrated circuits (ASIC's) may convert from a user configured design to a mask configured design with relative ease and whereby manufacturers of the latter design can test integrated circuits of that latter design with relative ease.

In accordance with the invention there is provided a mask-configured integrated circuit chip (MCI chip) which is pin compatible with a user-configured integrated circuit chip (UCI chip). User-configured circuit interconnection paths in the UCI chip, which were characterized as having substantial signal transmission delays, are preferably replaced in the MCI chip by resistive metal and/or resistive polysilicon routing lines characterized by signal transmission delays (i.e., RC time constants) of roughly the same order of magnitude as those of the replaced user-configured circuit interconnection paths The preservation in the MCI chip of at least some signal delays which inherently arose in the user-configurable interconnection paths of the UCI chip helps to replicate the signal ripple-through timing relationships of the UCI chip in the MCI chip.

Pins on the UCI chip, which were available to the user for programming the user configurable interconnection paths, but are no longer needed for configuring nonprogrammable interconnection paths of the MCI chip, are instead coupled to one or more on-chip scan-testing networks. Each scan-testing network includes a plurality of scan-test blocks integrally formed on the MCI chip together with the logical function blocks of the chip. Serial chains of scan-test blocks are interposed between output terminals of a first set of logical function blocks and input terminals of a second set of logical function blocks on the MCI chip so that signal transmission between the sets of logical function blocks can be temporarily interrupted, test input signals can be injected into the input terminals, test output signals extracted from the output terminals of the logical function blocks, and the functionality of the logical function blocks can be analyzed on an individual basis. The scan test pins of the MCI chip provide manufacturers with a convenient means for accessing and independently testing each of the logical function blocks on the chip.

Each scan-test block on the MCI chip preferably includes first through third N-channel, field effect type, pass transistors formed of respective first through third spaced apart polysilicon gate lines and first through fourth diffusion regions. The first through third gate lines are formed simultaneously with and in close proximity to each other such that the first and third gate lines are spaced relatively close to opposed first and second edges of the second gate line (e.g., less than a few microns away). Adjacent segments of the first through third gate lines serve as respective gate electrodes of the first through third pass transistors. The close proximity of the first through third gate lines helps to assure that the gate electrodes of the three pass transistors are formed under substantially identical conditions. The second gate electrode is preferably interposed between the first and third gate electrodes. If it is shown that the first and third gate electrodes are well formed, because the first and third pass transistors operate to both block and pass signals, it can be concluded that the second gate electrode, which is interposed between the first and third gate electrodes, is probably also well formed even if the operability of the second gate electrode is not tested directly.

The first through fourth diffusion regions are preferably formed in the chip substrate simultaneously using edges of the first through third polysilicon gate lines as implant masks so that the four diffusion regions are formed under substantially identical conditions and so that the four diffusion regions are self-aligned to the gate electrodes of the first through third pass transistors. The first of the four diffusion regions serves as the drain of the first pass transistor. The second of the diffusion regions serves as the source of the first pass transistor and also as the source of the second pass transistor. The third of the diffusion regions serves as the drain of the second pass transistor and also as the drain of the third pass transistor. The fourth diffusion region serves as the source of the third pass transistor.

Under such conditions, the integrity of the second and third diffusion regions (which serve as the source and drain of the second pass transistor) and the integrity of substrate contacts attached thereto may be verified by attempting to pass test vector signals (i.e., serial signals comprising of alternating bits such as 10101100. . . . ) through the first and third pass transistors and comparing the input test vector signals with the output signals of the first and third pass transistors. If the input and output signals correspond, it can be assumed that the first and third pass transistors are good. Once it is assumed that the first and third pass transistors are good, it can be further assumed that the source and drain regions of the second transistor are in functional condition. The second pass transistor does not have to be turned ON (rendered conductive) to test the ability of its source and drain regions to transmit signals.

A first end of a serial conduction path, including the second gate line, is coupled to a test signal providing means and an opposed second end of the serial conduction path is coupled to a test signal detecting means. The continuity of the second gate line and remaining portions of the serial conduction path can be verified by comparing test signals input into the first end of the serial conduction path with test signals detected at the opposed second end of the serial conduction path. If the signals match, it can be concluded that the second gate line is continuous and well formed (i.e., it has no open segments or shorts, it is suitably insulated from the chip substrate).

From the above, it can be seen that the second pass transistor does not have to be actually turned ON (rendered conductive) during testing in order to assure that the second pass transistor can pass logic signals during a subsequent nontesting mode. Instead, the integrity of the second gate line, the integrity of the second and third diffusion regions, and the integrity of contacts attached thereto can be checked indirectly by testing the functionality of the first and third pass transistors and the continuity of the second gate line.

During a testing mode, the second pass transistor is turned OFF, so that a first logic circuit, connected to the source of the second pass transistor, and a second logic circuit, connected to the drain of the second pass transistor, are decoupled from one another. The first and second logic circuits are tested independently with suitable scan test signals while they remain decoupled. During a subsequent normal-use mode, an activating voltage level is applied to the second gate line so that the second pass transistor will turn ON, recouple the first and second logic circuits, and pass signals between those circuits. Indirect verification of the integrity of the second pass transistor simplifies testing of the MCI chip and post-testing utilization (normal-use) of the chip. Specifically, a special test sequence is not required for testing the ability of the second pass transistor to pass signals and special clock signals are not needed to enable the second pass transistor to transmit signals between the first and second logic circuits. If the source and drain regions of the second pass transistor are unintentionally shorted together, signals will be able to pass between the first and second logic circuits despite such a defect in the second pass transistor.

The ability of the third pass transistor to block signal transmission between its source and drain during a normal use mode is tested by generating opposed logic levels at its source and drain to create a condition wherein output contention would occur if the third pass transistor were not blocking signal transmission. The current draw of the circuit under test is then measured while the chip is in a low power mode. A defect in the third transistor is detected as excessive current draw.

BRIEF DESCRIPTION OF THE DRAWINGS

FIG. 3D is a top plan view of a via configured eight line interchange, structure including resistive signal routing segments.

FIG. 4B-1 and 4B-2 are schematic diagrams of one embodiment of a structure such as shown in FIG. 4A.

FIGS. 5-1 and 5-2 are block diagrams of a scan testing network according to the invention.

FIGS. 7-1 and 7-2 are perspective views of a substrate layout for an FET based test block.

FIGS. 9-1 and 9-2 are block diagrams of a contention test circuit according to the invention.

FIGS. 11-1 through 11-3 are schematics of a test mode control circuit according to the invention.

FIG. 12 is a first timing diagram for explaining the operation of the circuit shown in FIG. 11.

FIGS. 17-1 and 17-2 are schematics of an I/O cell.

FIGS. 18A-1, 18A-2, and 18B-E are a schematics of a power-on reset circuit.

FIGS. 20-1 through 20-4 are schematics of a hardwired configurable logic (HWCLB) in accordance with the invention.

FIGS. 21-1 through 21-4 are schematics of a hardwired configurable logic element (HWCLE) incorporated within the HWCLB of FIG. 20.

DETAILED DESCRIPTION OF THE PREFERRED EMBODIMENTS

The following is a detailed description of the best presently contemplated modes for carrying out the invention. The description is intended to be merely illustrative of the invention and should not be taken in a limiting sense.

Figure 1:
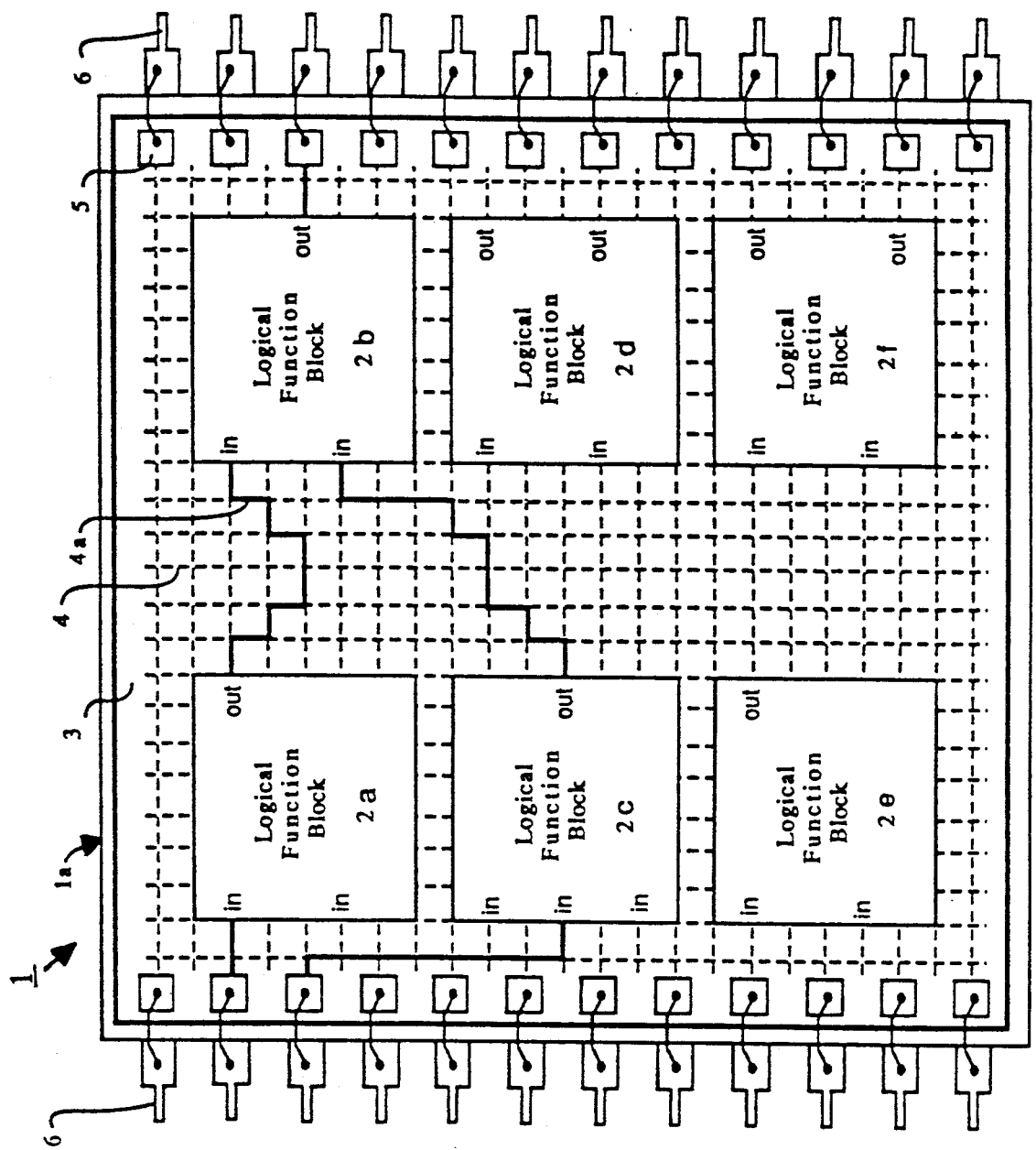
FIG. 1 is a block diagram of a high density digital logic integrated circuit (IC).

FIG. 1 is a block diagram of a typical high density digital integrated circuit (IC) chip 1. The IC chip 1 includes a plurality of digital logic function blocks 2 (individually denoted as 2a through 2f) which are provided on a monolithic semiconductor substrate 3, an interconnection means 4 (represented as a gridwork of signal routing lines) for routing signals between various nodes on the substrate 3, a plurality of wire bonding pads 5 for connecting portions of the chip substrate with external circuitry, and chip access pins 6 for coupling conductors external of a substrate encapsulating package (chip package) 1a to the pads 5.

The interconnection means 4 is configured to include signal routing paths 4a which connect preselected input and output terminals, "in" and "out", of the function blocks 2 one to the other and to the pads 5. In an MCI type of device, the interconnection means 4 is formed primarily of metal and/or substrate diffused routing lines. In a UCI type of device, the interconnection means 4 can include user programmable fuses and/or other user controllable signal routing elements, such as pass transistors, for selecting desired signal routing paths 4a. The positioning of the logical function blocks 2 on the substrate 3 and the routing of interconnection paths 4a between the function blocks may be entirely different in a chip of the MCI type as compared to that of a UCI type but the general requirements in both types of devices, for interconnecting preselected LFB input/output terminals one to the other with interconnect paths 4a, may be appreciated in general by reference to FIG. 1. The above explanation of FIG. 1 serves as a useful foundation for the remaining discussion which describes advantages and disadvantages of MCI and UCI devices. It will be noted that similar reference numerals are used in subsequent drawings to refer to like elements.

Figure 2:
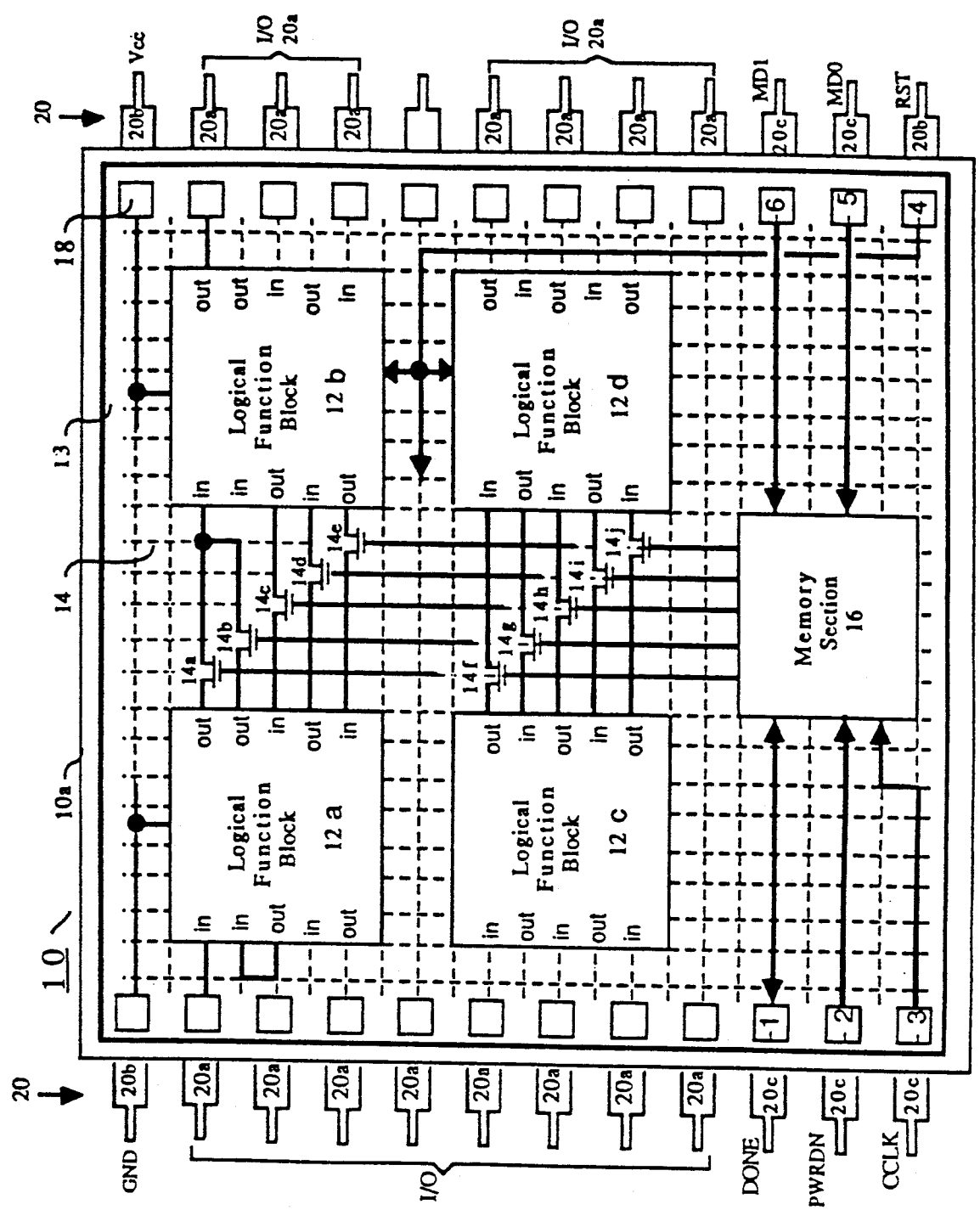
FIG. 2 is a block diagram of a user configurable IC chip.

FIG. 2 is a block diagram of a so-called logic cell array device (LCA) 10 which is a UCI type of device. The LCA 10 has a large plurality of predesigned logical function blocks (LFB's) 12 distributed across the surface of an integrated circuit substrate 13 according to a predetermined distribution (placement) pattern. The LFB's 12 are predesigned to provide various digital logic functions which could be of a fixed truth-table nature (hardwired combinatorial logic circuit) or of an internally configurable nature ("soft-wirable") in accordance with a user's desires. By way of example, the LFB's 12 can include plural AND, OR and NOT circuits arranged in combinatorial fashion for producing desired sum-of-products or product-of-sums terms. The LFB's 12 may further include, again by way of example, digital storage elements such as latches and flip flops for implementing elemental portions of a sequential state machine. A master reset line, RST, is preferably included for resetting the storage elements to a known state (i.e., binary zero).

Soft-wirable LFB's are sometimes referred to as "configurable logic blocks" (CLB's) and internal elements of the CLB's are sometimes referred to as "configurable logic elements" (CLE's) or "configurable combinatorial logic elements". The specific designation of "in" and "out" terminals on the LFB's of FIG. 2 is provided merely for the sake of example. LFB terminals can be designed for bidirectional signal flow as well as unidirectional signal flow. Those skilled in the art will appreciate that when power conservation is to be an important feature of the chip 10, the LFB's 12 can be formed using CMOS technology (complementary N-channel and P-channel FET transistors) and that when high speed operation is desired, the LFB's 12 may be formed with bipolar technology such as ECL (emitter-coupled logic), CML (common-mode logic) or the like, as needed. It will be assumed here that the LFB's 12 (and other LFB's discussed later) are formed in CMOS.

An array of programmably actuatable field-effect-type (FET) pass transistors 14a, 14b, 14c, . . . , 14j are included in an interconnection matrix 14 of the LCA 10 for programmably coupling various input and output terminals (I/O terminals) of the logic function blocks 12 one to the other. While only one pass transistor is shown in each of the routing paths defined by transistors 14a-14j, it should be appreciated that each routing path may be formed by activating suitable ones of plural pass transistors connected in a series/parallel pattern to define a complex switching matrix, and as such, that each of the illustrated routing paths preferably includes multiple transistors connected in series one to the next rather than one. The arrangement shown in FIG. 2 is merely illustrative of the general concept of using pass transistors to "soft-wire" (programmably define) a signal routing path. By way of example, either of pass transistors 14a and 14b may be rendered conductive on a mutually exclusive basis so that only one of the two "out" terminals on LFB 12a connected to transistors 14a and 14b is allowed to drive the single "in" terminal on LFB 12b, the latter being common to the routing paths of both pass transistors, 14a and 14b.

A user accessible memory section 16 is provided on the substrate 30 of the LCA 10 to control the individual ON/OFF states of the plural pass transistors 14a, . . ., 14j and thereby define a desired set of "soft-wired" routing paths. The memory section 16 does not have to be confined in a specific area of the chip substrate 13 as might appear from FIG. 2, but can rather be composed of memory cells that are distributed across the entire area of the chip substrate 13 so that each memory cell is near a corresponding pass transistor. FIG. 2 is provided more for illustrating a basic concept rather than a specific embodiment.

A limited number of wire bonding pads 18 and through-package connection pins 20 are provided around the periphery of the substrate 30 for coupling the internal circuitry of the chip package 10a to external circuits (not shown). In commercial devices of the high density type, the number of pins 20 is usually much less than the number of logic gates and/or LFB's 12 available on the substrate 13. In order to optimize utilization of the available on-chip gates, it is desirable to be able to use as many as possible of the pins 20 for transmitting digital logic signals (for I/O) between the on-chip LFB's 12 and external circuits and as few pins as possible for functions which exclude such an I/O function. Multi-mode (multi-function) pins can, of course, be utilized to realize this goal but it is usually necessary to designate some pins for the exclusive function of selecting either a programming mode or a normal-use mode therefore excluding the I/O function at such pins.

A first subset 20a of the pins 20 shown in FIG. 2 is designated to operate as user selectable input/output lines (I/O) during normal operation and as memory data/address lines for addressing and loading the memory section 16 during a chip configuring mode. A second subset 20b of the pins is designated for supplying power to the chip (GND and $V_{cc}$) and global signals such as a a global reset signal RST for setting or resetting flip flops on the chip 10 to desired initial states. A third, mode-selecting, subset 20c of the pins is provided for switching the LCA chip from a normal-use mode (wherein the circuitry of the LCA is already configured) to a programming mode, the latter being a mode which allows the user to program the memory section 16 of the LCA 10 in various ways (i.e., parallel or serial loading) and thereby set/reset a plurality of routing control bits that are output from the memory section 16 to the gates of the pass transistors 14a-14j. The high/low (H/L) logic levels of the control bits have corresponding high/low voltage levels associated with them for operating the pass transistors. The high/low voltage levels are coupled to individual gates of the pass transistors 14a-14j to establish the ON/OFF states (conductive/nonconductive states) of individual ones of the pass transistors, and thereby soft-wire a desired signal routing path.

The mode-selecting pin subset 20c shown in FIG. 2 consists of five pins: two (20c-5 and 20c-6) for supplying various configuration mode select bits, MD0 and MD1, to the chip, one (20c-3) for supplying a configuration clock signal CCLK to the chip, one (20c-1) for carrying a bidirectional reconfiguration DONE/REDO flag/control signal and one (20c-2), a PWRDN pin, for placing the memory section 16 and other portions of the chip which could draw static (D.C.) current of substantial magnitude in a low power, data saving mode when the chip 10 is not being used. By way of example, one product of the described LCA type is designated as the XC2064 Logic Cell Array , manufactured by Xilinx, Inc. of San Jose, Calif. and described in the 1986 edition of the Programmable Gate Array Design Handbook published by Xilinx, Inc. By way of further example, a UCI type integrated circuit is described in U.S. Pat. 4,642,487, issued to W. S. Carter, Feb. 10, 1987, and assigned to Xilinx, Inc. The patent discloses a circuit for interconnecting a configurable logic array (CLA). The disclosure of the Carter patent is incorporated herein by reference. Additional publications dealing with configurable logic arrays are:

(1) U.S. Pat. No. 4,821,233 issued Apr. 11, 1989 to Hung-Cheng Hsieh;

(2) U.S. Pat. No. 4,820,937 issued Apr. 11, 1989 to Hung-Cheng Hsieh;

(3) U.S. Pat. No. 4,783,607 issued Nov. 8, 1988 to Hung-Cheng Hsieh;

(4) U.S. Pat. Appln. Ser. No. 07/121,963, filed Feb. 24, 1989, inventor Hung-Cheng Hsieh;

(5) U.S. Pat. Appln. Ser. No. 07/121,542, filed Jan. 27, 1989, inventor Hung-Cheng Hsieh;

(6) U.S. Pat. Appln. Ser. No. 07/121,962, filed Apr. 17, 1989, inventor Hung-Cheng Hsieh;

(7) U.S. Pat. No. 4,758,958 issued July 19, 1988 to W. S. Carter;

(8) U.S. Pat. No. 4,750,155 issued June 7, 1988 to H. C. Hsieh;

(9) U.S. Pat. No. 4,746,822 issued May 24, 1988 to J. Mahoney;

(10) U.S. Pat. No. 4,713,557 issued Dec. 15, 1987 to W. S. Carter;

(11) U.S. Pat. No. 4,706,216 issued Nov. 10, 1987 to W. S. Carter; and

(12) U.S. Pat. No. 4,695,740 issued Sept. 22, 1987 to W. S. Carter;

whose disclosures are further incorporated herein by reference.

As explained previously with respect to UCI devices in general, and as will be appreciated in more detail with respect to the specific case of the LCA 10 shown in FIG. 2, several problems can develop when such a user-configurable device is considered for use in high volume manufacturing. The problems include how to minimize the cost of manufacturing the LCA 10 when it is to be produced in very large numbers and how to test the mass produced devices 10 in a reliable manner. It should be understood that most users (i.e., ASIC firmware developers) do not want to be bothered with the details of cost reduction or mass production testing. They want to have a turn-key process through which their ASIC firmware can be converted from a "soft-wired" prototype version to a mass producible "hard-wired" version with as little bother as possible, the latter version being one that is designed for easy testing (quality control) and production at minimum cost.

If the circuitry of an LCA chip 10 is to be soft-wired (in accordance with a user-developed firmware design) so that the LCA chip 10 includes a relatively large number of combinatorial AND/OR/NOT levels and/or it implements a sequential state machine having a relatively large number of different states, the LCA chip 10 will usually not be suitable for low cost mass production and ease of quality control. An extremely large number of input signal combinations may have to be supplied and output signal combinations analyzed in order to verify that: (a) every one of the LFB's 12 functions properly, (b) each of the interconnect transistors 14a, ..., 14j which is supposed to be in the conductive state is indeed ON, and (c) each of the transistors 14a, ..., 14j which is supposed to be in the nonconductive state is indeed OFF. If there is a defect in the memory section 16 or in any one of the pass transistors 14a, ..., 14j, or any one of the LFB's 12, the LCA 10 may fail to function as intended. It is desirable to have a mass producible substitute IC which avoids as many of these yield-reducing problems as possible.

Figure 3A:
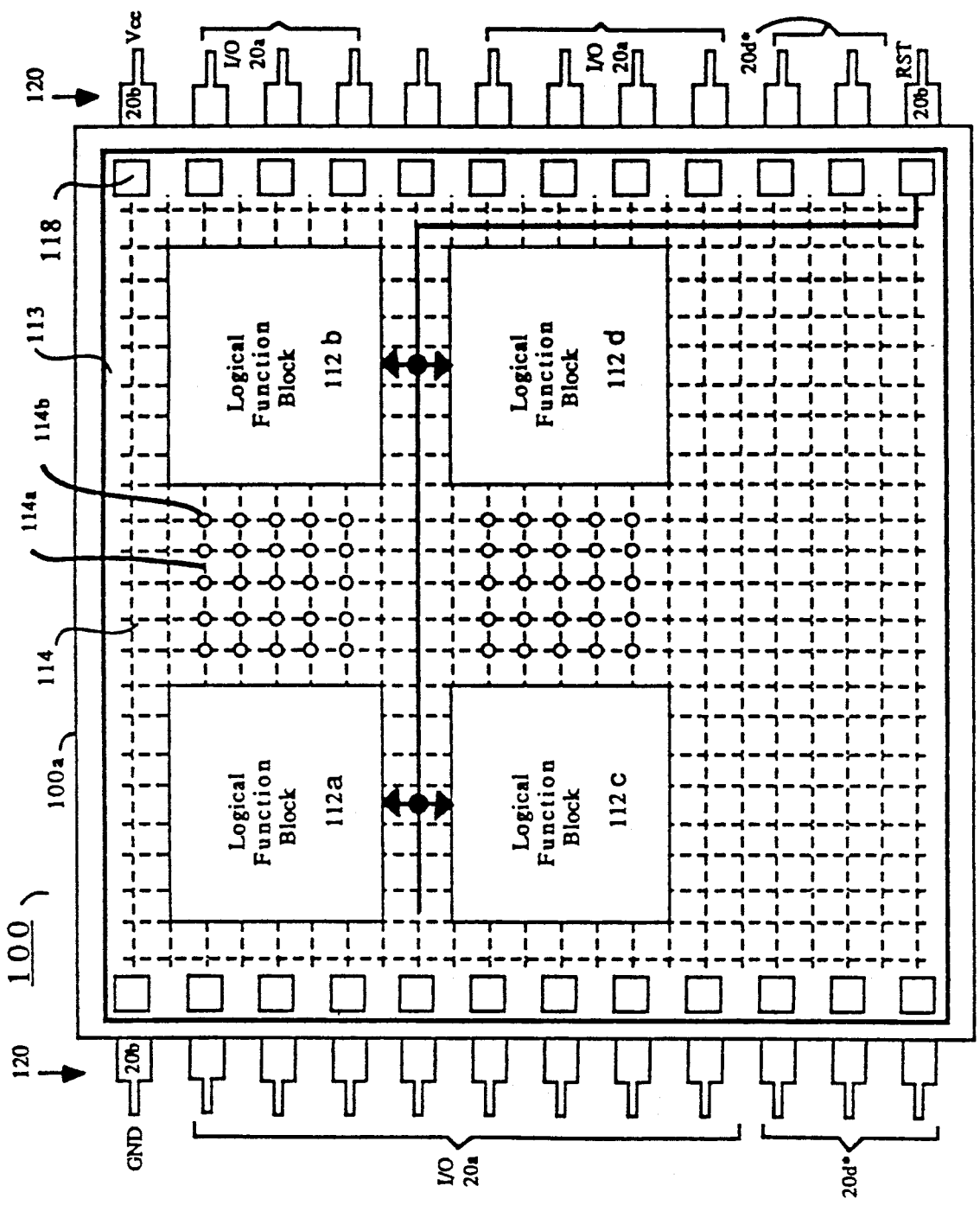
FIG. 3A is a block diagram of a metallization layer configured IC in accordance with the invention.

Referring to FIG. 3A, there is shown the block diagram of a metallization layer configured chip (MLCC) 100 having a plurality of logic function blocks 112 of the same general type and number as the LFB's 112 of the LCA chip 10 shown in FIG. 2. The LFB's 112 of FIG. 3A are individually referenced as 112a, 112b, 112c and 112d. While these LFB's 112a-112d are shown to be schematically positioned at substrate locations corresponding to those of FIG. 2, there should be no inference drawn that they are physically positioned in locations on a substrate identical to those of their corresponding UCI blocks 12a-12d.

The MLCC 100 has connection pads 118 and pins 120 corresponding to similarly referenced elements in FIG. 2 and a substrate encapsulating package 100a (chip package) which is substantially identical to the chip package 10a of FIG. 2.

The MLCC 100 further comprises a mask-defined, metalized interconnection array 114 which, unlike the transistor-based interconnection array 14 of FIG. 2, constitutes a multi-plane gridwork of metal-based routing lines 114a, and mask programmed interconnect segments 114b. The mask programmed interconnect segments 114b are preferably included within or excluded from the MLCC 100 in an automated fashion according to a computer-coded instruction tape (or other form of computerized file data) provided by the user of the LCA circuit 10 to a volume chip manufacturer. The process by which interconnect segments 114b are included or excluded may be structured in such a manner (as will be seen later) that the high volume manufacturer does not need to know all the details of the user's firmware design (i.e., more than the fact that certain conductive lines are routed (hard-wired) in a specific manner from one function block to the next on the chip). The high volume manufacturer needs to know only enough to be able to feed an instruction tape into an automated mask-defining machine and to be able to test the MLCC devices 100 (if so desired by the firmware developer) after production to assure that the mask-defined interconnection array 114 interconnects input and output terminals of the logical function blocks 112 in substantially the same way as the user programmed (soft-wired) interconnection array 14 (FIG. 2) and that each of the LFB's 112 operates on an individual basis as intended. The LFB's 112 of the MLCC chip may be internally "hard wired" and/or "soft wired" as desired.

It will be apparent upon comparison of FIGS. 2 and 3A that substrate area consumed by the memory section 16 of the LCA 10 is not required in the MLCC structure 100 because there are no pass transistors 14a-14j (or other means for forming soft-routed wiring matrices) to be controlled and no memory cells for controlling such pass transistors. Thus, the die size of a monolithic semiconductor substrate 113, that is used for forming the MLCC structure 100, may be made smaller than that of a comparable chip having the LCA structure 10. Since the manufacturing yield of multi-die wafers tends to increase when die size is reduced, the per chip cost of the product can be reduced as a consequence.

When a choice is provided to firmware developers to use both of the LCA device 10 and MLCC device 100, the firmware developers can choose to test market a specific ASIC product by manufacturing a small number of suitably configured LCA devices 10. The developers can switch to the mask-configured device 100 at a later date, without having to change printed-circuit board designs, if and when demand for the product grows.

Figure 11:
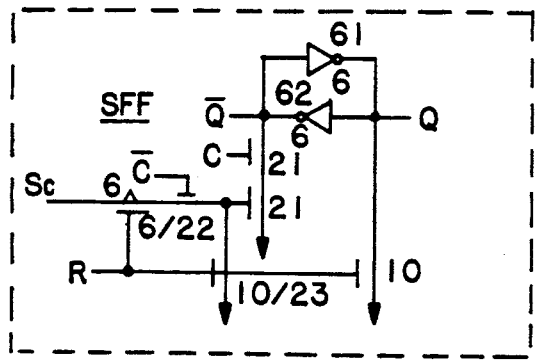
Figure 2:
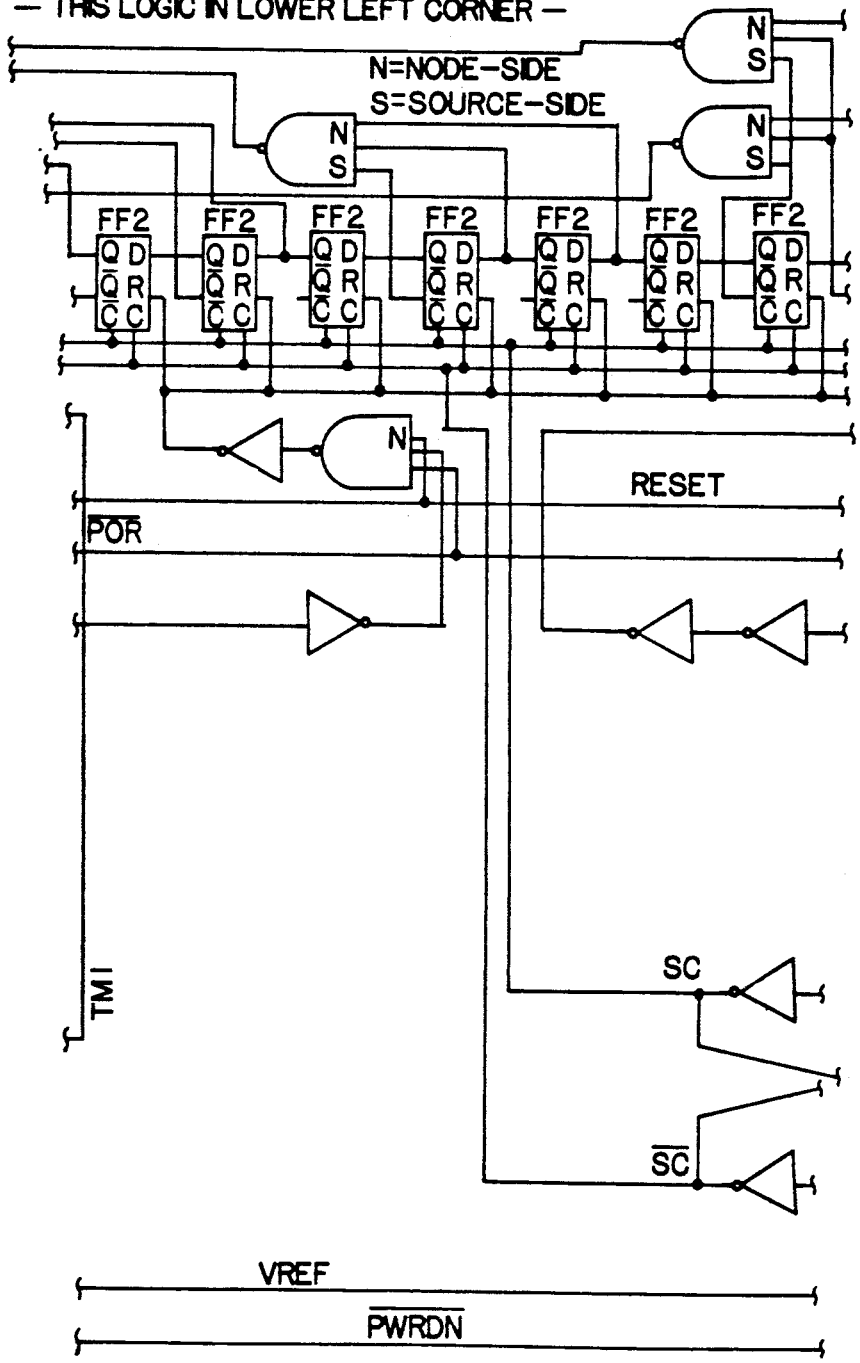
Figures 3, 11:
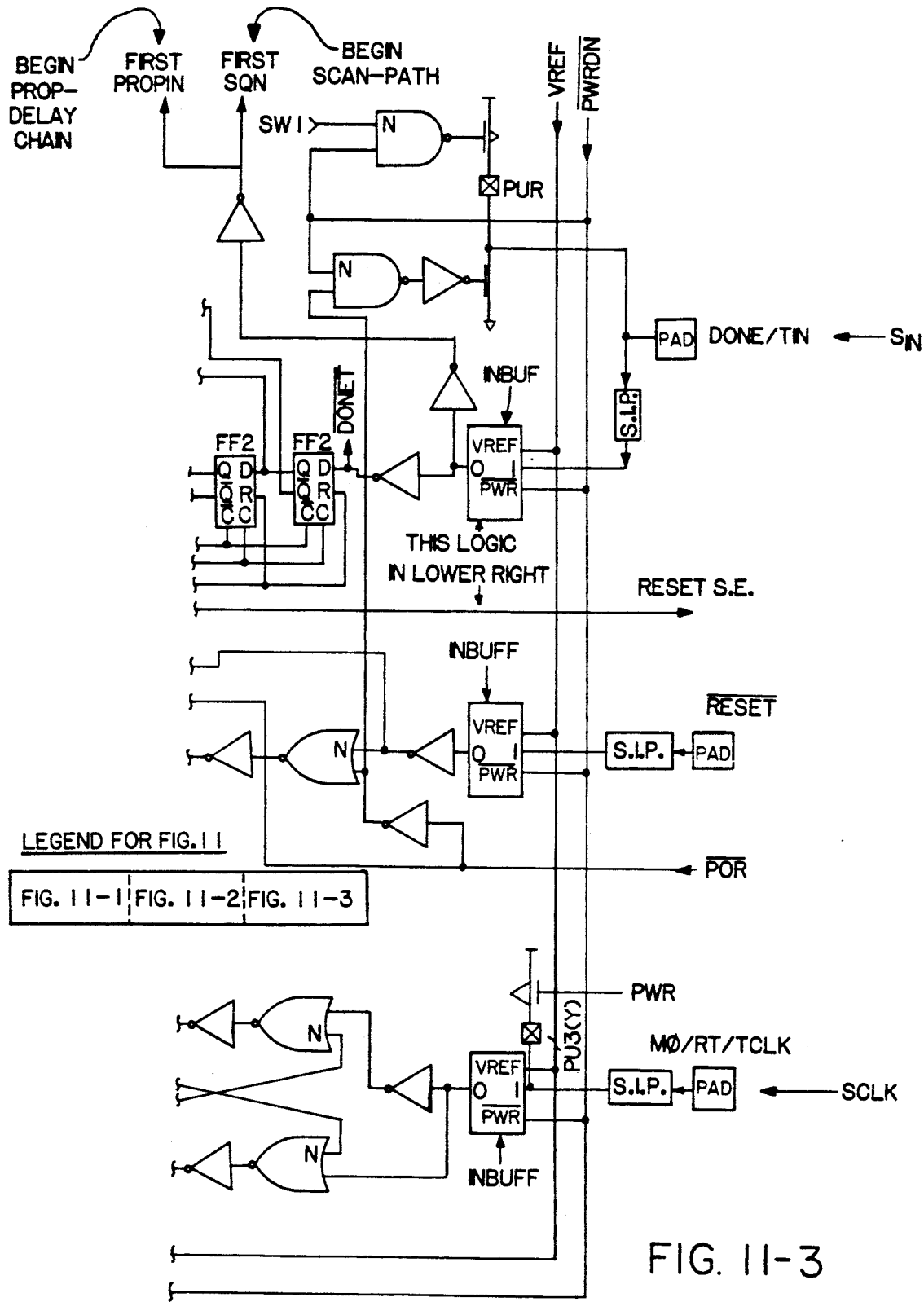

It will be apparent from the earlier discussion regarding the UCI and MCI approaches, that once a large number of devices (i.e., more than 1000) are to be manufactured, the MLCC structure 100 of FIG. 3 can begin to have many advantages over the LCA structure 10 of FIG. 2. The MLCC structure 100 can be designed to have fewer active components than the LCA structure 10 and thus fewer yield problems. There is no memory section 16 in the MLCC structure 100 which could potentially have a defect and thus render the overall circuit 100 nonfunctional. There are no interconnection matrices based on pass transistors 14a, ..., 14j which could fail.

It would appear that a mask-configured substitute for the LCA device 10 could be made simply by replacing turned ON ones of the pass transistors 14a-14j with metal shorting-lines and omitting such metal shorting-lines at locations where turned OFF transistors were situated. But conversion from a "soft-wired" version of a design to a "hard-wired" version is not so straightforward.

One problem associated with replacing the LCA device 10 with the MLCC device 100 is that the signal propagation delays of the pass transistors 14a-14j will not be replicated in the MLCC device if signal routing lines composed only of low resistance metal are substituted for turned ON ones of the pass transistors 14a-14j. The pass transistors 14a-14j each have RC time constant characteristics that can be significantly different from the time constant characteristics of highly conductive metal lines. Race condition problems that may have been avoided in the user produced LCA device 10, because of signal transmission delays that were inherently provided by the pass transistors 14a-14j, may crop up unexpectedly when the pass transistors are replaced by all-metal routing lines. While there are many techniques for avoiding race condition problems, there is no guarantee that firmware developers will take advantage of such techniques or that they might not want to intentionally create a race sensitive circuit. The hardwired device should accordingly duplicate substantially all timing idiosyncrasies of the soft-wired device.

Figure 3B:
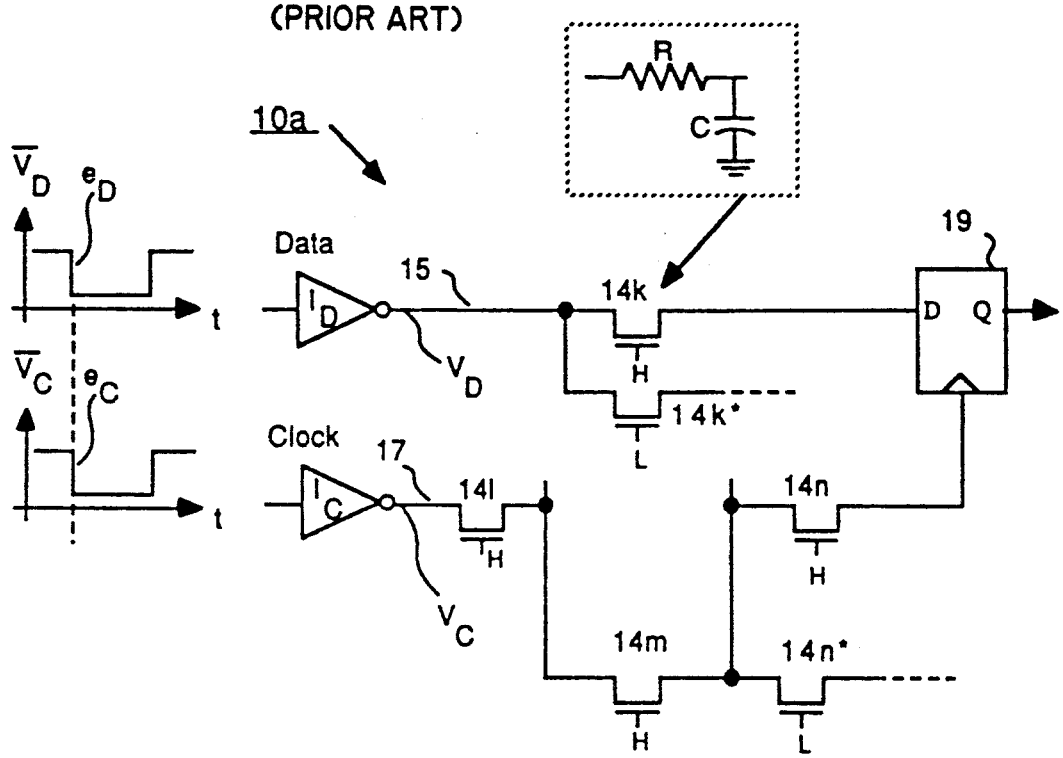
FIG. 3B a first flip flop circuit which may be formed in the configurable IC chip of FIG. 2.

By way of example, the UCI device may be soft-wired to include a flip flop circuit 10a, such as shown in FIG. 3B. The flip flop circuit 10a comprises respective data signal and clock signal outputting elements (inverters) $I_D$ and $I_C$, a data routing path 15 for routing a data signal ($V_D$) which is output by element $I_D$ (the data routing path 15 being formed of a single pass transistor 14k); a clock routing path 17 for routing a clock signal $V_C$ which is output by element $I_C$ (the clock routing path 17 being formed of multiple pass transistors, 14l, 14m and 14n, connected in series); and a flip flop 19 having clock and data input terminals respectively coupled to output ends of the clock routing and data routing paths, 15 and 17. The routing paths 15 and 17 are established by placing logical highs (H) at the gates of pass transistors which are to act as closed switches (i.e., 14k, 14l, 14m, 14n) and placing logical lows (L) at the gates of transistors (i.e., 14k' and 14n') which are to be nonconducting. These gate levels are provided by user-accessible SRAM memory cells (not shown).

Inherent resistances and capacitances along the clock routing path 17, including those of transistors 14l-14n, may act to delay the arrival time of a clock signal edge $e_C$ by a substantial amount relative to the arrival time of a data signal edge $e_D$ so that a data signal (pulse) $V_D$ can arrive at the data input terminal of the flip flop 19 well before a concurrently generated clock signal (pulse) $V_C$ arrives at the clock input terminal of flip flop 19, even if the signals ($\overline{V_D}$, $\overline{V_C}$) are generated concurrently at their sources. The signal delaying action of transistors 14l, 14m and 14n can provide needed time for the data signal $V_D$ to settle into either a valid H or L level before a clock pulse edge $e_C$ arrives. While such use of the time delay characteristics of the pass transistors is not the preferred way for avoiding race problems, it nonetheless is a valid means for avoiding race problems and thus cannot be discounted from the design of a substitute chip. If a corresponding flip flop circuit (not shown) were to be formed in the MLCC device to have a clock routing path defined entirely by low resistance, low capacitance, signal routing means, the resulting MLCC clock routing path might not delay the clock signal edge $e_C$ by a sufficient amount of time relative to the transmission time of the data signal edge $e_D$ and the flip flop circuit of the MLCC device may react undesirably to data edge noise rather than to a settled data level.

Figure 3C:
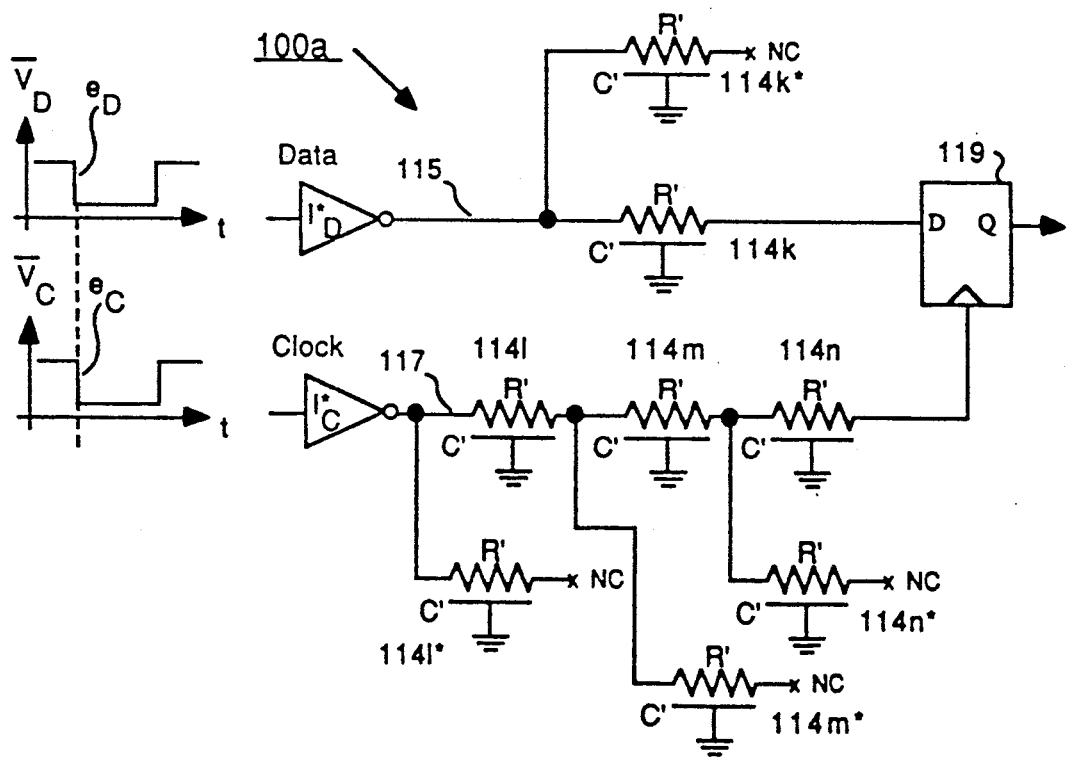
FIG. 3C shows a second flip flop circuit which may be formed in the metallization layer configured IC chip of FIG. 3A to correspond to the first flip flop circuit of FIG. 3B.

In accordance with one aspect of the invention, the interconnection matrix 114 of the MLCC 100 (FIG. 3A) is formed, as indicated in FIG. 3C, to include signal routing paths having resistive-capacitive metal and/or resistive-capacitive polysilicon signal routing segments, 114k, 114l, 114m and 114n. The resistive-capacitive routing segments 114k-114n, are designed to have time constant characteristics $R'C'$ that are roughly the same order of magnitude as the time constant characteristics RC of the respectively replaced pass transistors 14k-14n (e.g., $RC/10 \leq R'C' \leq 10RC$). Preferably, the roughly equivalent $R'C'$ time constant of each resistive-capacitive signal routing segment, 114k-114n, is equal to or greater than approximately one third of the RC time constant of each of the corresponding one or more replaced pass transistors, 14k-14n, but less than one times the RC time constant of the replaced pass transistor/transistors ($RC/3 \leq R'C' < RC$). Intentional inclusion of these resistive-capacitive segments 114k-114n allows the MLCC 100 to mimic the timing characteristics of the UCI device (although not necessarily to have identical characteristics) so that phase relations of dynamic signals in the UCI device can be at least somewhat preserved in the MLCC device 100 (i.e., $R'C' = RC/3$).

Figures 3E, 3F:
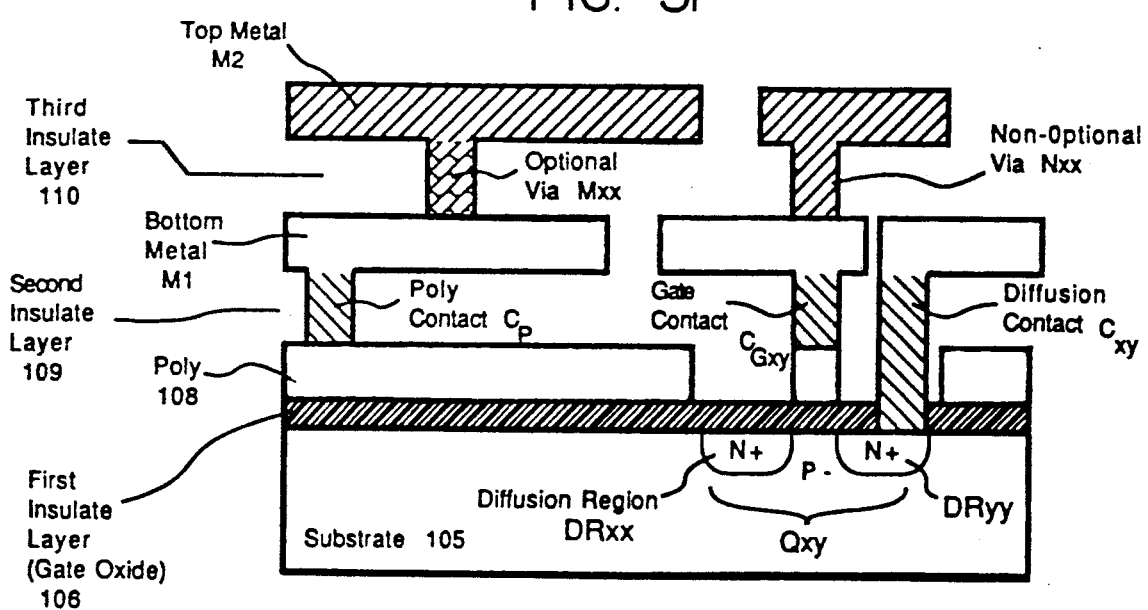
FIG. 3E is, a table of allowed interconnects for the interchange structure of FIG. 3D.
FIG. 3F is a cross-sectional view showing the layering of components in an integrated circuit chip incorporating the structure of FIG. 3D.

A multi-plane metalized interconnect structure 100b for selectively implementing the resistive signal routing segments is shown in the top plan view of FIG. 3D. The interconnect structure 100b is formed on a monocrystalline silicon substrate 105 (FIG. 3F). Eight terminal lines, L1 through L8, enter the interconnect structure 100b by way of respective polysilicon resistive segments P1 through P8. The polysilicon resistive segments P1-P8 are U-shaped regions of a polysilicon layer 108 (FIG. 3F) that are suitably doped (or left intrinsic) to each provide a desired $R'C'$ time constant. Polysilicon contacts $C_p$ (represented in FIG. 3D by dark square areas) are provided at the ends of the U-shaped segments P1-P8 for coupling those segments to bottom metal strips such as the bottom metal lines B1 through B10 shown in FIG. 3D. A plurality of vias including nonoptional (not programmably excludible) vias N1 through N7 (represented by darkened circles) and mask-selectable, optional (programmably included or excluded) vias M13, M15, M16, M17, M18, ..., M67, M68 (which are arranged as shown in FIG. 3D, and represented by unfilled circles) connect the bottom metal lines B1-B10 to a plurality of top metal lines such as the lines T1, T2, T5, T6 and T7 shown in FIG. 3D. (For the sake of illustrative clarity, some of the optional vias Mxx are unlabeled. It should be noted that the optional via numbering system corresponds to the numbers of the crossing top and bottom metal lines, that is, it has the form $M_{TB}$.)

The mask-selectable, optional vias M18 through M68 are programmably included in or excluded from an insulation layer 110 (FIG. 3F) that is interposed between a bottom, first metal layer M1 and a top, second metal layer M2 so as to implement the interconnect table shown in FIG. 3E. It can be seen from the table of FIG. 3E that any one of the eight lines L1-L8 can be connected to as many as five of the other seven lines entering the eight-wire interchange structure 100b thereby providing a large number of signal routing possibilities.

FIG. 3F is a generalized cross-sectional view showing the layering relationship between the various components of FIG. 3D. The structure 100b is provided on a silicon substrate 105. Diffusion regions $DR_{xx}$ and $DR_{yy}$ can be provided in the substrate 105 so as to define one or more field effect transistors $Q_{xy}$. A first insulation layer 106, composed of thin gate oxide (i.e., less than 500 Angstroms thick), is formed on the substrate 105 to space a polysilicon layer 108 above the substrate. A portion of the polysilicon layer can define the gate of $Q_{xy}$. A second, thicker insulation layer 109 (represented as an electrical gap area) is provided above the polysilicon layer 108 to separate the polysilicon layer 108 from an overlying, bottom, metal layer M1. Conductive contacts $C_P$ and $C_{Gxy}$ can be provided through the second insulation layer 109 to join selected portions of the bottom metal layer M1 with the polysilicon layer 108. Other contacts, i.e. $C_{xy}$, can be provided through the first insulation layer 106, the polysilicon layer 108 and the second insulation layer 109 to couple the diffused regions, i.e. $DR_{yy}$, to additional portions of the bottom metal layer M1.

A third insulation layer 110 (represented as an electrical gap area) is provided above the bottom metal layer M1 to space top metal layer M2 away from the bottom metal layer M1. Mask-programmable, optional vias Mxx and nonoptional vias Nxx are provided through the third insulation layer 110 to couple selected portions of the top metal layer M2 with portions of the bottom layer M1. Selective inclusion or exclusion of the optional vias Mxx may be used to route signals through signal routing means such as the interconnect structure 100b shown in FIG. 3D and to thereby define a circuit. The terminal lines L1-L8 can, by way of example, be interconnected in accordance with the interconnection table shown in FIG. 3E to link a first elongated line which extends in an integrated circuit along a first direction to a second elongated line which extends in a different direction.

Those skilled in the art will appreciate that the optional and nonoptional vias, Mxx and Nxx, may be formed in many different ways. Typically, a via is formed by: depositing (or growing) insulative material directly on the first metal layer, M1; forming (i.e., etching) a hole at a select location through the deposited insulation material; and forming (i.e., depositing) the second metal layer M2 directly on top of the insulation material belonging to the third insulation layer 110 so that the metal material of the second metal layer M2 fills the hole in the insulation material of third insulation layer 110 and thereby forms a contiguous via connecting a portion of a metal strip in the second (top) metal layer M2 to a metal strip in the first (bottom) metal layer M1. Vias can be optionally formed or not formed by selectively defining (e.g., etching) through-holes or not defining such holes (e.g., masking) in the insulation material at predetermined locations of the third insulation layer 110.

The capacitance C' of the resistive-capacitive segments 114k-114n (or P1-P8) may be provided mainly by portions of the resistive elements R' that are in close proximity with the substrate 105 (i.e., less than 500 Angstroms away). Those skilled in the art will appreciate that the resistive elements R' and capacitive elements C' of FIG. 3C may be formed in many other ways. Relatively resistive materials can be used in the formation of connection strips within the metal layers M1 and M2 and/or lightly doped diffusion regions can be formed in the substrate 105 to define resistive regions. The embodiment 100b of FIG. 3D is but one way of realizing resistive-capacitive routing lines that emulate the time delay characteristics of the replaced routing transistors 14k-14n (FIG. 3B).

In the preferred method for manufacturing the embodiment 100b of FIG. 3D, the bottom and top metal conduction strips, B1-B10 and T1-T8, of metal layers M1 and M2 are defined to have fixed shapes (constant mask patterns) from one chip to the next while the optional vias, Mxx are selectively (programmably) included in or excluded from the third insulation layer 110 in accordance with user provided interconnection data. Preferably, a software conversion package (which may be referred to as an "interconnection translator") is prepared for operation in a preselected computer environment and the interconnection translator is used to transform a user's UCI configuration data (i.e., the data that had been loaded into the memory section 216 of a user-configured LCA device 10 as shown in FIG. 2), into a via inclusion/exclusion data file (i.e. a CALMA file) that is to be used for programmably defining the insulation/via layer 110 of FIG. 3F. The above LCA to MLCC data conversion and automated via selection steps are advantageous in that it is possible to have a manufacturing process wherein only one masking step changes from batch to batch; the changing mask being the one defining the insulation/via layer 110. Remaining masking steps remain unchanged even though MLCC devices of different ASIC designs may be produced with each batch.

While the above disclosed use of programmably selected resistive routing lines solves the problem of how to create different signal delay times at portions of a circuit where such delays are critical, there is still the problem of testing the MLCC structure 100. As explained earlier, the MLCC 100 may require the generation of an extraordinarily large number of input signal combinations and analysis of a large number of output signal combinations in order to fully verify its functionality.

Figure 4A:
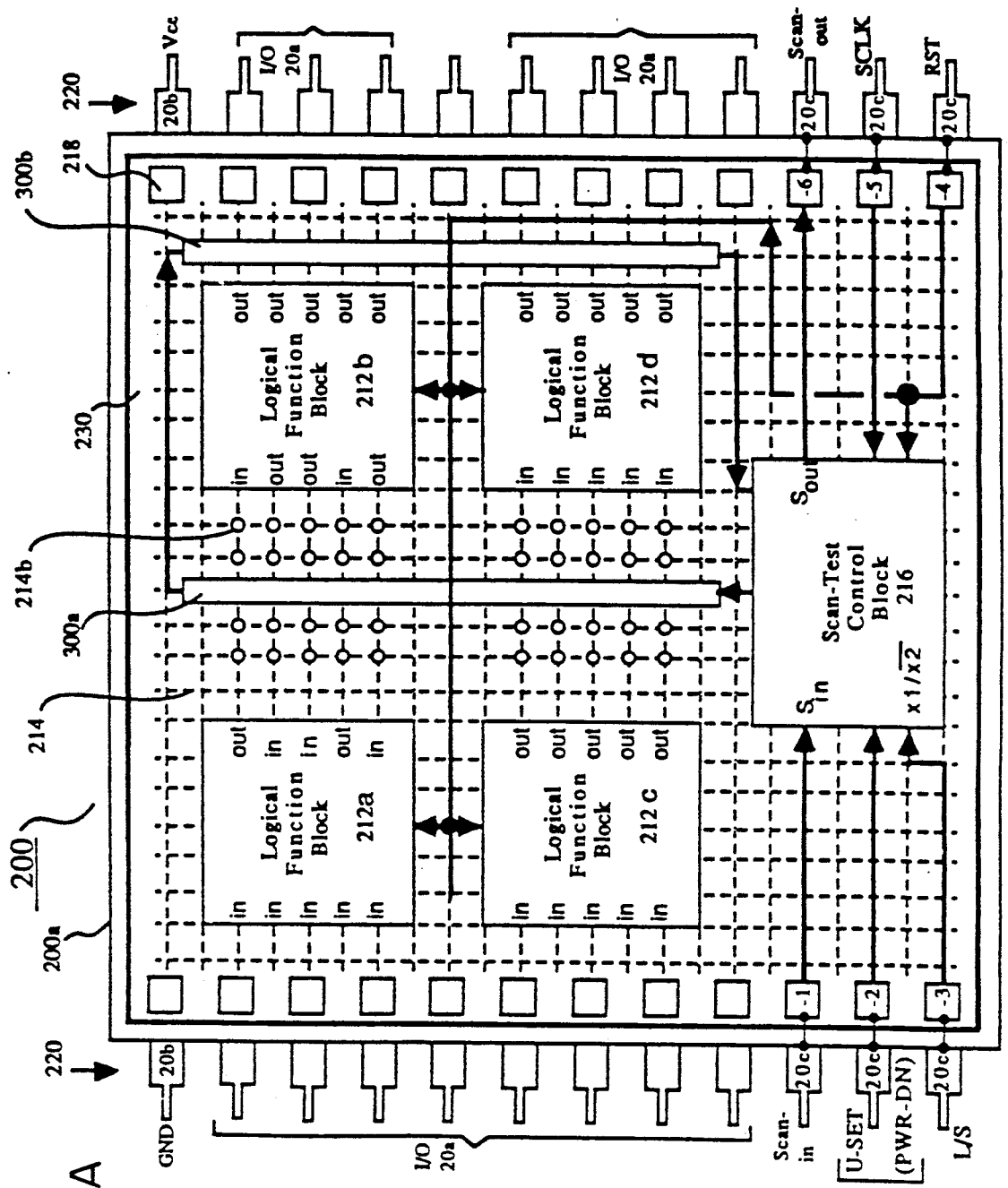
FIG. 4A is a block diagram showing how serial chains of scan test blocks may be interposed between logic function blocks of a metallization, layer configured chip to test the logic function blocks independently of one another.

Referring to FIG. 4A, there is shown a block diagram of a second metallization layer configured chip (MLCC) 200 which includes plural scan testing chains 300a, 300b and a scan-test control block 216, for individually testing the functionality of each of multiple logical function blocks 212a-212d contained therein. The scan testing chains 300a and 300b are preferably located between adjacent logical function blocks 212 so as to monitor or alter logic levels occurring at intermediate nodes positioned between those logical function blocks. This is diagrammatically shown for the case of scan-test chain 300a and should be understood to be the case for chain 300b as well. (Connections between IC pins 220 and core logic function blocks 212 are preferably provided by programmable input/output blocks (IOB's, not specifically shown)).

The scan testing chains 300a, 300b and scan-test control block 216 are operated by means of a set of six scan-test control pins, 20e-1 through 20e-6 (the last digit of each referenced pin appears on the adjacent pad 218 to which the pin is connected). The scan test control pins 20e of FIG. 4A correspond to the reset pin RST of FIG. 2 plus the five mode-select pins 20c of FIG. 2 but they provide different functions.

Referring to FIG. 4A, one of the scan-test pins, 20e-5, supplies an oscillating scan-test clock signal SCLK to the control block 216. The control block 216 uses the scan-test clock signal SCLK to generate nonoverlapping latch clocks, $\phi_1$ and $\phi_2$ (See FIG. 8), which are supplied to the chains 300a and 300b to control the shifting of test vector signals through the chains. Two of the scan test pins, 20e-1 and 20e-6, function as respective scan-in and scan-out signal terminals for carrying serial scan-in and scan-out signals, $S_{in}$ and $S_{out}$. A serial scan path is defined through the chip 200 from the scan-in pin 20e-1 to the scan-out pin 20e-6. Pin 20e-3 supplies a load/shift command signal, L/S, to the control block 216 for switching the MLCC 200 between various modes including a data-receive mode in which data output by the LFB's 212 is loaded into the scan chains 300a and 300b, and a data-shift mode in which data held within the scan chains, 300a and 300b, is serially shifted along the scan path. Mode control pin 20e-3 (L/S) is used in combination with the scan-in pin 20e-1, a U-SET pin 20e-2 (to be described) and RST (reset) pin 20e-4 to switch the MLCC chip 200 from a normal-use mode to a test mode.

In the normal-use mode, data moves asynchronously from the output terminal of a first LFB (i.e. 212a) to the input terminal of a second LFB (i.e. 212b) as if the scan chains 300 were not interposed between these output and input terminals. A normal user of the MLCC chip 200 can be left unaware of the existence of the scan chains 300.

Figures 1, 4B:
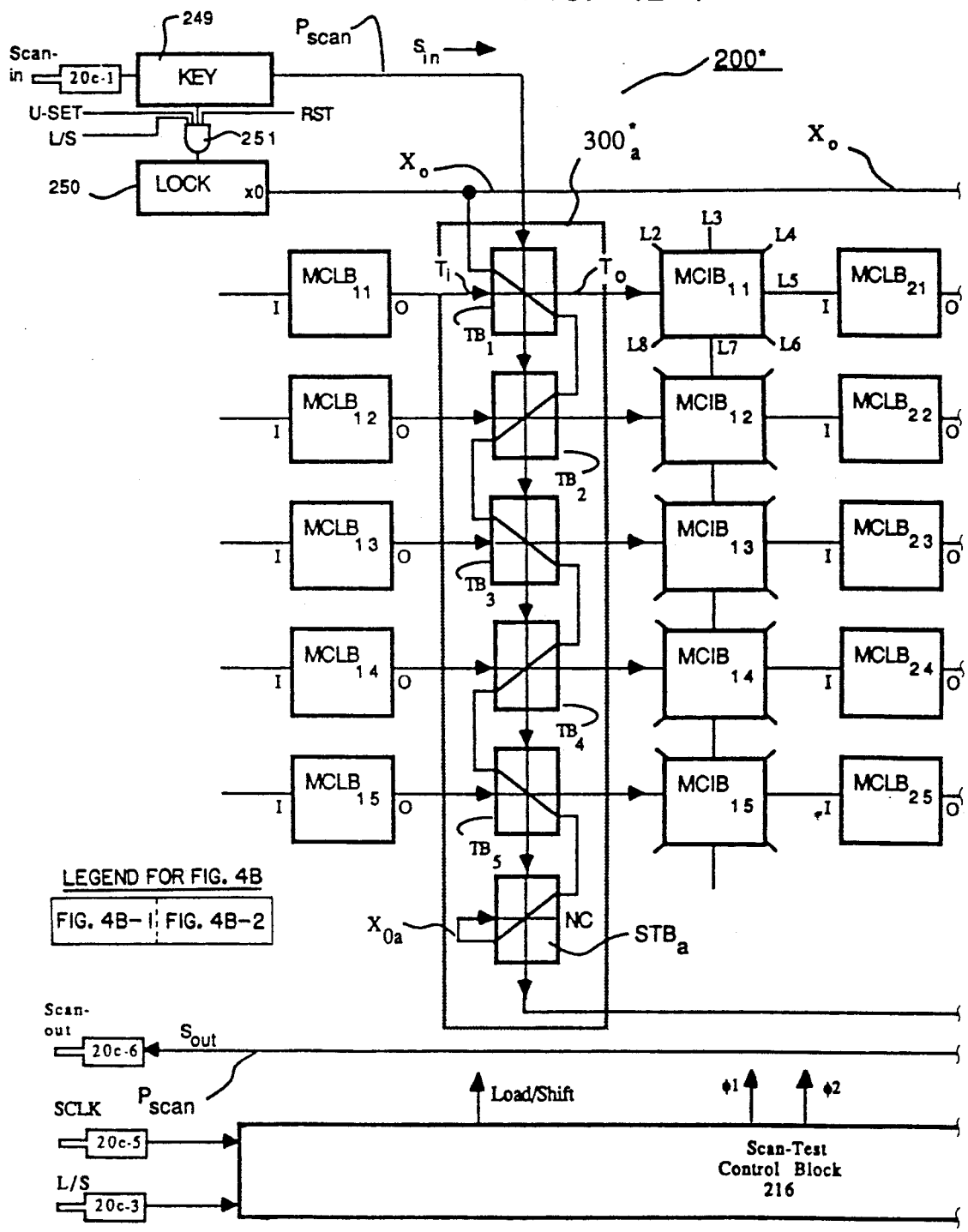
Figure 4B:
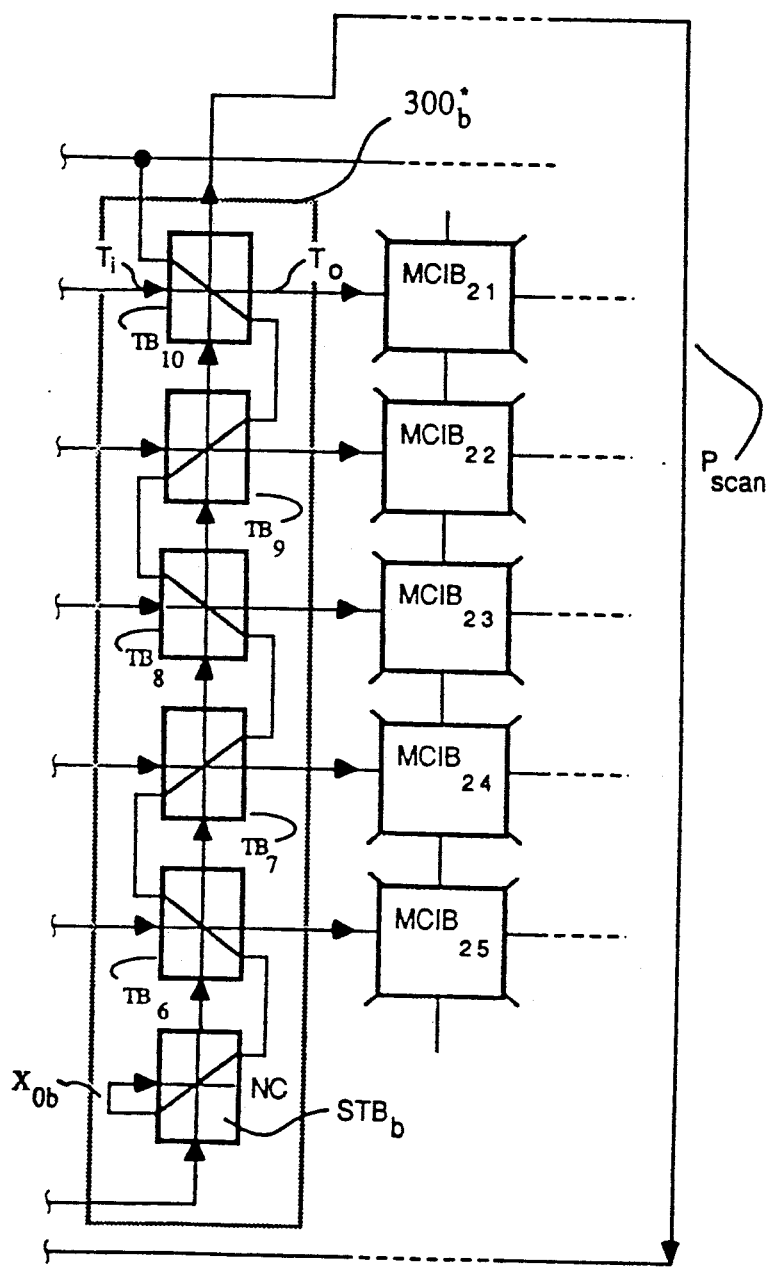
Figure 2:
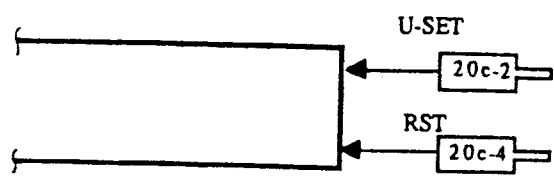

In the test mode, the normal signal-routing paths between the output and input terminals of the LFB's 212 are broken and data output from the LFB's 212 is received instead by storage elements (not shown) of the scan chains 300 while test-vector data that has been serially loaded into the scan chains 300 is used as the input data for the input terminals of the logical function blocks 212. A special lock and key arrangement is preferably used to prevent normal users from accidentally switching into the test mode (refer to FIG. 4B-1. When the MLCC chip 200 is switched from the normal-use mode to the test mode, an integrity verifying procedure may be used to test the integrity of control lines (i.e., transistor gate lines) that control the scan test chains 300, as will be explained when FIGS. 4B-1 and 4B-2 are described.

A universal-set/power-down pin 20e-2 U-SET/(PWR-DN) is provided for switching internal circuitry of the MLCC chip 200 into a low power, standby-mode in which the circuitry stops drawing static (D.C.) current from the power supply pins $V_{cc}$ and GND (20b). This standby-mode can be entered into from the normal-use mode. A host circuit determines when the MLCC chip 200 does not need to be used by the host and places a suitable PWRDN level on pin 20e-2 to conserve power usage. When the chip 200 is switched to a test-mode (i.e., scan test mode), the same pin 20e-2 functions as a "master" or universal set (U-SET) pin for setting all user-controllable flip-flops in the logical function blocks 212 to output binary high (H) levels. It will be seen later, that the power down function (PWR-DN) can be used in combination with the global reset pin RST to test for undesirable contention conditions within the chip 200 and to detect such contention conditions (which indicate a circuit flaw) simply by measuring the current draw at the $V_{cc}$ or GND pins of the chip 200 while it is in the low-power, standby mode.

It should be noted that the functions of the scan test pins 20e of FIG. 4A and the signals to be applied to these pins 20e are generally different from the functions/signals associated with the corresponding configuration pins 20c of FIG. 2 (with the exception of the RST pin). Pin 20c -6 of FIG. 2, which provided only a signal input function (MD1) in the UCI chip 10, is replaced at its physical location by pin 20e-6 (scan-out) and the latter operates as a signal output terminal during testing. Pin 20c -3 (CCLK), which was designed to receive an oscillating clock signal in FIG. 2 is replaced at its location by pin 20e-3 (L/S) which is designed to receive a generally static (non-oscillating), mode-selecting level. The L/S signal level remains static during relatively long periods of time when data is being shifted through the scan chains 300. Pin 20c -5 (MD0) of FIG. 2, which was designed to receive a relatively static mode-selecting level, is replaced at its location by pin 20e-5 (SCLK), which is designed to receive an oscillating scan clock signal.

The purpose of this scrambling of the pin functions for corresponding pin locations is to prevent users from inadvertently activating the scan test mode of the chip 200 in situations where activation of the scan test mode would be undesirable. Because the overall package of the hard-wired chip 200 is similar to that of the soft-wired chip 10, the former might be confused with the programmable chip 10 and an attempt might be made to reconfigure it. However, if the configuration signals (i.e., CCLK, MD0, MD1) are applied, it is unlikely that the chip 200 will switch into a scan-test mode. An oscillating signal (SCLK) is required on pin 20e-5 of chip 200 in order to unlock a lock and key type of test-mode enabling circuit (249 and 250 of FIG. 4B-1, to be described later) and activate the scan test mode, as will be explained in more detail later. If the generally static, MD0 signal of FIG. 2, is accidentally connected to pin 20e-5 (SCLK) of chip 200, it is unlikely that a necessary unlock sequence will be generated to switch the chip 200 out of the normal-use mode into the scan-test mode. If the oscillating CCLK signal of FIG. 2 is inadvertently connected to the L/S pin 20e-3 of the chip 200, this nonstatic signal prevents the chip 200 from sustaining a signal shifting operation required for loading a serial key word needed for activating the scan-test mode. The scan-out pin 20e-6 of the chip 200 remains in a high impedance, tristate mode during normal-use and does not become an output pin until the scan-test mode of the chip 200 is activated (as will also be explained later). Thus, if the chip 200 is inadvertently inserted into a circuit designed for receiving the UCI chip 10 of FIG. 2, the user will not notice any significant difference in functionality except for the loss of ability to reconfigure the logical functions of the hard-wired chip 200.

FIGS. 4B-1 and 4B-2 are schematic diagrams of one embodiment 200* of the device shown in FIG. 4A. The embodiment 200* comprises an array of mask configured logic blocks $MCLB_{11}$–$MCLB_{xy}$ (i.e., $MCLB_{25}$)

which are integrally formed on a semiconductor substrate (not shown) together with corresponding scan-test blocks $TB_1$–$TB_x$, and metal-configured interconnection blocks, $MCIB_{11}$–$MCIB_{xy}$. The metal-configured logic blocks, $MCLB_{11}$–$MCLB_{xy}$, are shown to each have respective input and output terminals I and O. (While only one input/output terminal is shown for each MCLB, it should be understood that more than one I/O terminal for each MCLB is well within the contemplation of the invention, and in such a case, plural test blocks TB are to be used for interrupting signal-routing paths between the plural output and input terminals of such metal configured logic blocks.)

Test blocks $TB_1$–$TB_5$ are shown interposed between the output terminals 0 of a first set of the metal-configured logic blocks, $MCLB_{11}$–$MCLB_{15}$, and the input terminals I of a second set of the metal-configured logic blocks, $MCLB_{21}$–$MCLB_{25}$. Special test blocks $STB_a$ and $STB_b$ are provided at the bottom of the subsets $MCLB_{11}$–$MCLB_{15}$ and $MCLB_{21}$–$MCLB_{25}$ for testing the continuity of branch control lines $X0a$ and $X0b$ passing through these subsets. The function of these control lines will be explained shortly.

The metal configured interconnection blocks, $MCIB_{11}$ through $MCIB_{xy}$, can be formed in many different ways to interconnect spaced apart logic blocks $MCLB_{xy}$ of the array. By way of example, each of the interconnection blocks $MCIB_{xy}$ can comprise one or more resistive interconnect structures, similar to the structure 100b of FIG. 3D. Some of the interconnection blocks $MCIB_{xy}$ may be configured to link neighboring metal-configured logic blocks one to the other (i.e., $MCLB_{11}$ to $MCLB_{21}$) while others of the interconnection blocks may be configured to interconnect nonneighboring MCLB's through a series of long distance connection lines ("long lines", not shown).

When the embodiment 200* is to be operated in a normal-usage, nontest mode, a first binary level (i.e., a logic high H) is placed on a main control line $X_0$ and passed to all the individual test blocks, $TB_1$–$TB_{10}$ (and special test blocks, $STB_a$ and $STB_b$), by way of branch lines $X0a$ and $X0b$ to hold each of the test blocks $TB_x$ in a normal-use, signal pass-through mode. In the normal-use, signal pass-through mode, signals from the output terminals O of respective logic function blocks $MCLB_{11}$–$MCLB_{15}$ and $MCLB_{21}$–$MCLB_{25}$ are allowed to pass asynchronously (that is, without reliance on a synchronizing clock signal) through the test blocks $TB_1$–$TB_{10}$ (in the horizontal direction of FIGS. 4B-1 and 4B-2 from primary input terminals $T_i$ of the test blocks $TB_x$ ('x' denoting an arbitrary integer here) to primary output terminals $T_o$ of the test blocks $TB_x$ and from there, through the interconnect blocks $MCIB_{xy}$ to the subsequent circuitry. A user of the embodiment 200* can be left unaware that the scan test chains 300a* and 300b* (each comprised of test blocks $TB_x$ and a special test block STB) are at all present within the chip. This is because no synchronizing clock pulses or other special control signals are needed for passing data through the test blocks $TB_x$ during normal-use.

When the main control line $X_0$ is switched to a second binary level (i.e., a logic low L), by means of a special key-and-lock mechanism 249/250 which will be explained shortly, each of the test blocks $TB_1$–$TB_{10}$ is switched into a test mode wherein the output signals of the corresponding logic function blocks, (i.e. $MCLB_{11}$–$MCLB_{15}$ and $MCLB_{21}MCLB_{25}$) are blocked from passing asynchronously (directly) to subsequent circuitry (i.e., to $MCIB_{11}$–$MCIB_{15}$ and $MCIB_{21}$-$MCIB_{25}$). This isolates the logic blocks $MCLB_{11}$–$MCLB_{25}$ one from the next for individual testing. Test stimuli can be applied to the input terminals of individual logic blocks and the responses of the logic blocks can be individually monitored according to well known scan testing techniques.

The embodiment 200* includes a special control-line test system for testing the integrity of the main control line $X_0$, and branches thereof, $X0a$ and $X0b$. The test system comprises a lockable control signal providing means 250 for providing one of low and high logic levels (L and H) on the main control line $X_0$; a control unlock means (key) 249 for unlocking the control signal providing means 250 to thereby switch the chip 200* from a normal-use mode to the test-mode; and a test signal detecting means (denoted as special test blocks $STB_a$ and $STB_b$) which is coupled to distal ends of the branches, $X0a$ and $X0b$, of the control line $X_o$ for detecting successful transmission of one of the low (L) and high (H) mode-setting levels from the lock means 250 to all parts of the control line branches, $X_{0a}$ and $X_{0b}$.

Preferably, as shown in FIGS. 4B-1 and 4B-2, , the test signal detecting means comprises a plurality of special test blocks, $STB_a$ and $STB_b$, each coupled as shown to an individual one of the branches, $X0a$ and $X0b$, so as to be loaded with control signal data emanating from the distal ends of respective control line branches, $X0a$ and $X0b$, the distal ends being opposed to originating ends of the branches where a control signal x0, placed on main control line $X_0$, originates. Each special test block STB is serially included in a serial scan path $P_{scan}$ which includes the normal test blocks $TB_x$ of the scan-testing chains 300a* and 300b*. The special test blocks, $STB_a$ and $STB_b$, have substantially the same internal structure as the normal test blocks $TB_x$ with the exception that internal components necessary for outputting a signal to a primary output terminal $T_o$ of the normal test blocks can be omitted because no connection (NC) is made to such a primary output terminal $T_o$ in the case of the special test blocks.

The control unlock means (key) 249 comprises a shift register of predetermined length and suitable combinatorial logic (not shown) coupled thereto for detecting a unique, prespecified sequence of ones and zeros in a serial bit stream supplied through the scan-in pin 20e-1. The unlock means 249 is configured such that the prespecified sequence has to be loaded into the shift register of the same unlock means 249 in order to unlock the lockable control signal providing means 250. Preferably an AND gate 251 (or equivalent) is interposed between key means 249 and the lock means 250, as shown in FIG. 4B-1, so that the prespecified unlock sequence will be effective only when the reset pin RST and/or some other suitable pins of the chip (i.e., U-SET, L/S) are properly activated at the same time. The key and lock mechanism (249 and 250) prevents users from inadvertently initiating the test mode when such initiation is not desired.

Upon initiation of the test mode, a low logic level (L) is provided on the main control line X0 in synchronism with the scan clock signal SCLK. This control signal level (L) can be generated by the $x_0$ control signal providing means 250 (which in the preferred embodiment includes a lockable, mode holding latch) or the control level can be created externally of the chip 200* and passed into the main control line $X_0$ through suitable x0 control signal injecting means, i.e., a probe pad. (The x0 control-signal providing means does not have to be part of a complex key/lock mechanism and can instead be simply a pad coupled to the $X_o$ control line.)

The continuity of each of the control line branches, $X0a$ and $X0b$, is verified if a high control level (H) is successfully loaded into each of the special test blocks, $STB_a$ and $STB_b$ while the chip 200* is still in the normal-use mode; and after a predetermined number of shift operations are performed by the scan path $P_{scan}$ to shift in the test-mode; enabling key, the test-mode establishing control level ($x0=L$) is successfully loaded into each of the special test blocks, $STB_a$ and $STB_a$. Successful loading of the high (H) and low (L) control signal levels into each of the special test blocks at corresponding time slots is subsequently detected at the scan-out pin 20e-6 as part of the scan-out signal $S_{out}$.

The special test blocks $STBa$, $STBb$, are preferably spaced apart along the serial scan path $P_{scan}$ and spaced away from the scan-out pin 20e-6 so that there is sufficient room along the scan path for shifting all the test-mode activating bits (unlock sequence) serially into the control unlock means 249 before data from the special test blocks begins to emerge from the scan-out pin 20e-6. If the main control line $X_o$ and its branches are properly formed during chip fabrication, both the normal-use high level (H) of the $X_o$ control line and the newly established low level (L) on the control line $X_o$ should be sequentially loaded into each of the special test blocks, $STB_a$, $STB_b$ and other STB's (not shown) during the test-mode activation operation and then sequentially output through the scan path. The sequence (H) . .... (H) ..... (H) ..... should appear within the shifted out scan signal $S_{out}$, while the chip is in normal-use mode, each parenthesis enclosed sequence subset, (H), representing the H level which should be loaded into a particular one of the special test blocks $STBa$, $STBb$, etc. when a parallel-load command (on the L/S line) is applied to the special and nonspecial test blocks ($STX_x$ and $TB_x$ respectively) during the normal-use mode. The sequence (L) ..... (L) ..... (L) ..... should later appear in the scan-out signal $S_{out}$ as the scan clock pulses are applied after the chip 200* switches from the normal-use mode to the test mode, the parenthesis enclosed subsets, (L), of the output sequence representing the low levels which should be parallel-loaded into each of the special test blocks $STB_x$ when a parallel-load command (L/$\overline{S}$) is issued during the test mode. If any of the control branches, $X_{oa}$, $X_{ob}$, etc. is not properly formed (due to a manufacturing defect) then one of the parenthesis enclosed high and/or low levels in the $S_{out}$ out output sequence (H) ..... (H) ..... (H) ..... -- ..... (L) ..... (L) ..... (L) should float to an opposed level in the case where there is an open circuit along one of the control branches $X_{oa}$, $X_{ob}$, etc.; or one of the STB-produced high and low levels of the output sequence (H) .... -- ..... (L) will be pulled to an opposed low or high level in the case where one of the control branches is shorted to an active pull up/down line and such opens or shorts will be indicated by a missing (H) or (L) subset in the output signal $S_{out}$.

With respect to the structuring of the scan path, it should be appreciated that aside from the illustrated key means 249, test blocks $TB_x$ and special test blocks STB, the scan path $P_{scan}$ can, of course, include other serially-connected signal-shifting means for serially shifting signals through the chip 200* if so desired.

Figure 5:
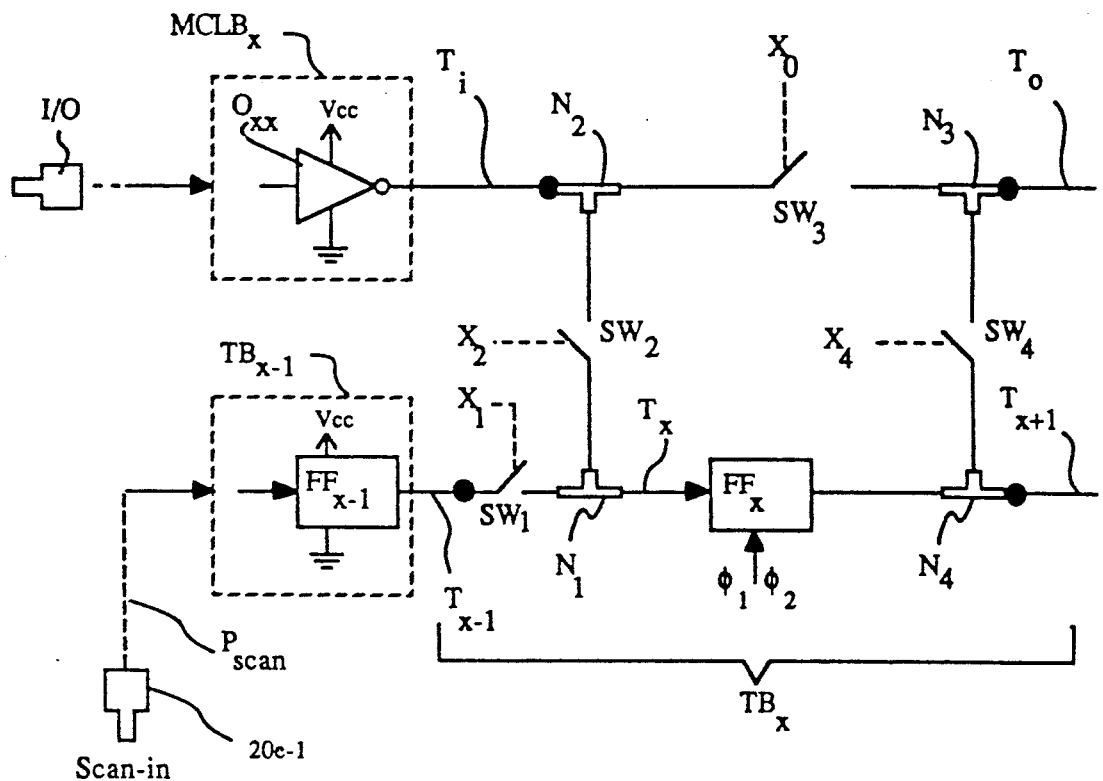
Figure 1:
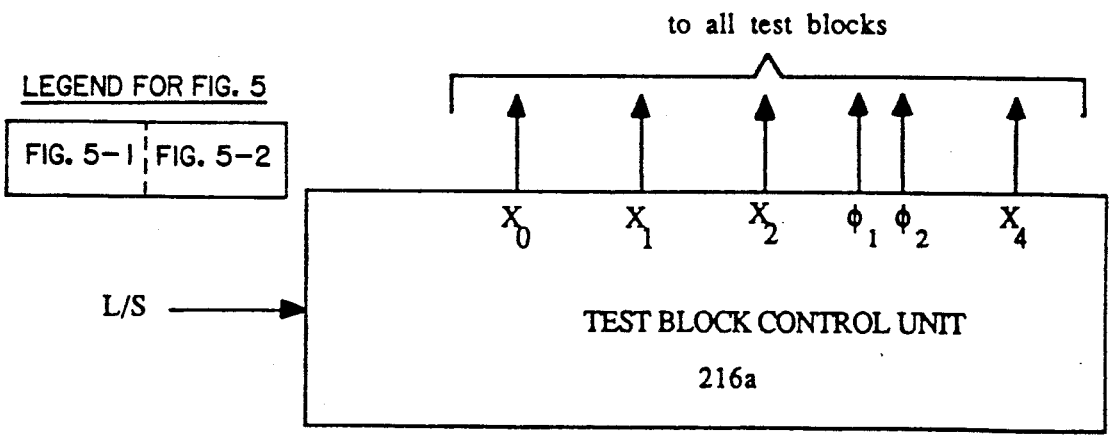
Figures 2, 5:
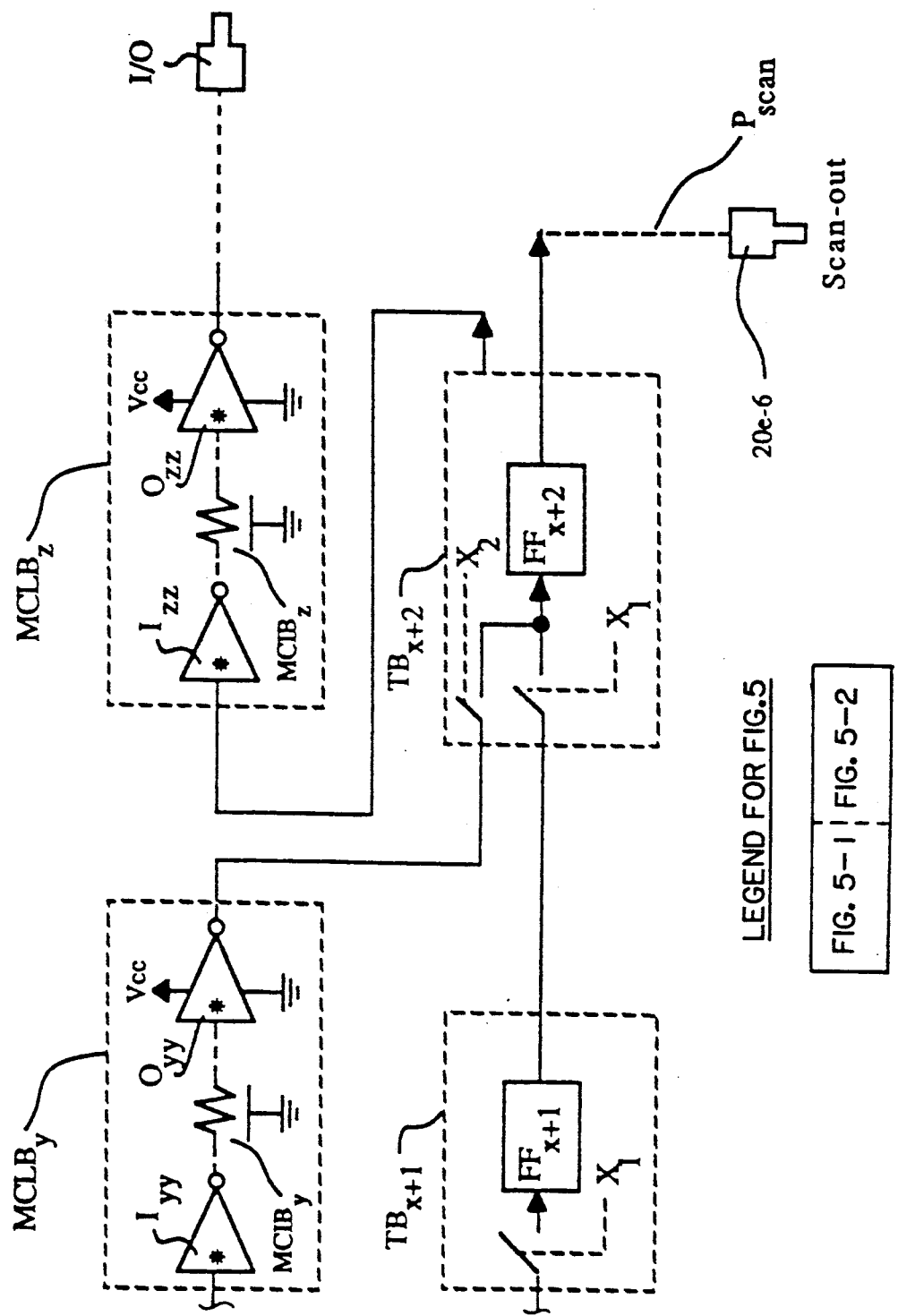

Once the integrity of the main control line $X_0$ and the branch control lines, $X0a$, $X0b$, etc. is verified; the integrity of internal data shifting/storing portions in each test block $TB_x$ may be checked. FIGS. 5-1 and 5-2 are block diagrams showing the architecture of one test block portion $TB_x$ in accordance with the invention that may be used in the scan testing network of FIGS. 4B-1 and 4B-2. The test block $TB_x$ of FIGS. 5-1 and 5-2 comprises first through fourth electronically actuatable switches, $SW_1$-$SW_4$; a digital data storing means $FF_x$ (i.e., a flip flop) for storing scan test data; first through fourth test-block network-forming means (nodes) $N_1$-$N_4$ for coupling the switches $SW_1$-$SW_4$ and the storing means $FF_x$ one to the other as shown; and first through fourth test-block interconnect means (terminals), $T_i$, $T_o$, $T_{x-1}$ and $T_{x+1}$, for connecting the test block $TB_x$ to other circuitry (i.e., to other test blocks, $TB_{x-1}$ and $TB_{x+1}$, and to various logic blocks $MCLB_x$ and interconnect blocks $MCIB_x$).

The above recited first through fourth test-block interconnect means (terminals), $T_i$, $T_o$, $T_{x-1}$ and $T_{x+1}$ function respectively as a primary input terminal $T_i$ for receiving digital signals from the output stage $O_{xx}$ of a first logic function block (i.e., $MCLB_x$); a primary output terminal $T_o$ for transmitting digital signals to the input stage $I_{yy}$ of a second logic function block (i.e., $MCLB_y$); a serial input terminal $T_{x-1}$ for receiving scan-test signals from the output stage $FF_{x-1}$ of a previous scan path element (i.e., another test block $TB_{(x-1)}$); and a serial output terminal $T_{x+1}$ for outputting scan test signals to a subsequent scan path element (i.e., a third test block $T_{Bx+1}$). Each test block also includes an internal terminal $T_x$ for coupling one end of the first switch $SW_1$ and one end of the second switch $SW_2$ to a data receiving line of the storing means $FF_x$.

The above recited network forming means (nodes $N_1$-$N_4$) of the test block $TB_x$ respectively function as: (1) a first signal conducting entity $N_1$, which is shared by switches $SW_1$, $SW_2$ and the storing means $FF_x$ and is arranged so that signals being transmitted through any one of the switches $SW_1$, $SW_2$ and storing means $FF_x$ must pass through it (through node $N_1$); (2) a second signal conducting entity $N_2$, which is shared by switches $SW_2$, $SW_3$ and primary input terminal $T_i$, and through which signals must pass when being transmitted through any one of the switches $SW_2$, $SW_3$ and primary input terminal $T_i$; (3) a third signal conducting entity $N_3$ which is shared by switches $SW_3$, $SW_4$ and primary output terminal $T_o$ and through which signals must pass when being transmitted through any one of switches $SW_3$, $SW_4$ and primary output terminal $T_o$; and (4) a fourth signal conducting entity $N_4$ which is shared by switch $SW_4$, the storing means $FF_x$ and the serial output terminal $T_{x+1}$, the fourth signal conducting entity being configured such that signals passing through any one of the fourth switch $SW_4$, the storing means $FF_x$ and serial output terminal $T_{x+1}$ must pass through the fourth signal conducting entity $N_4$.

Figures 1, 7:
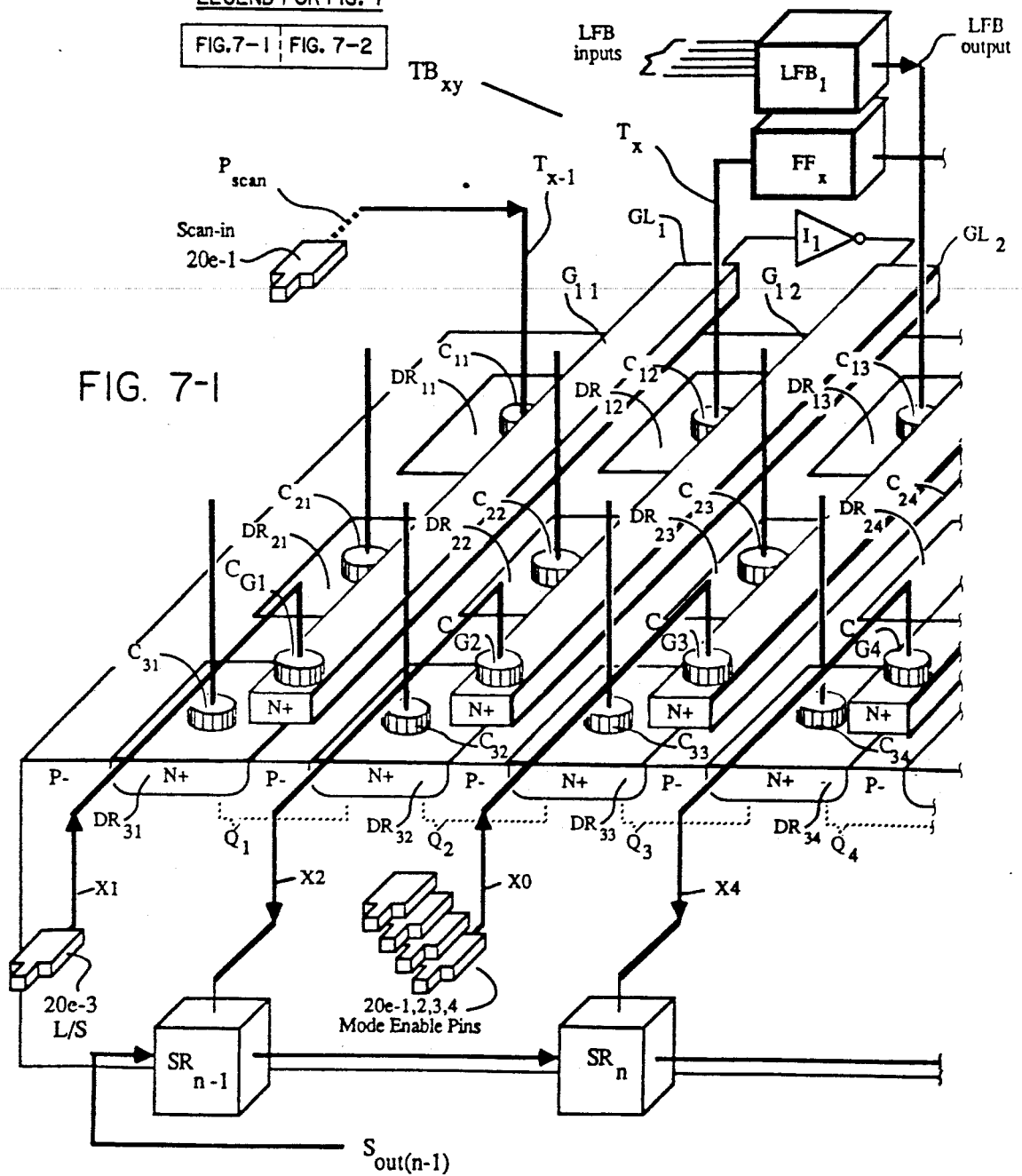
Figures 2, 7:
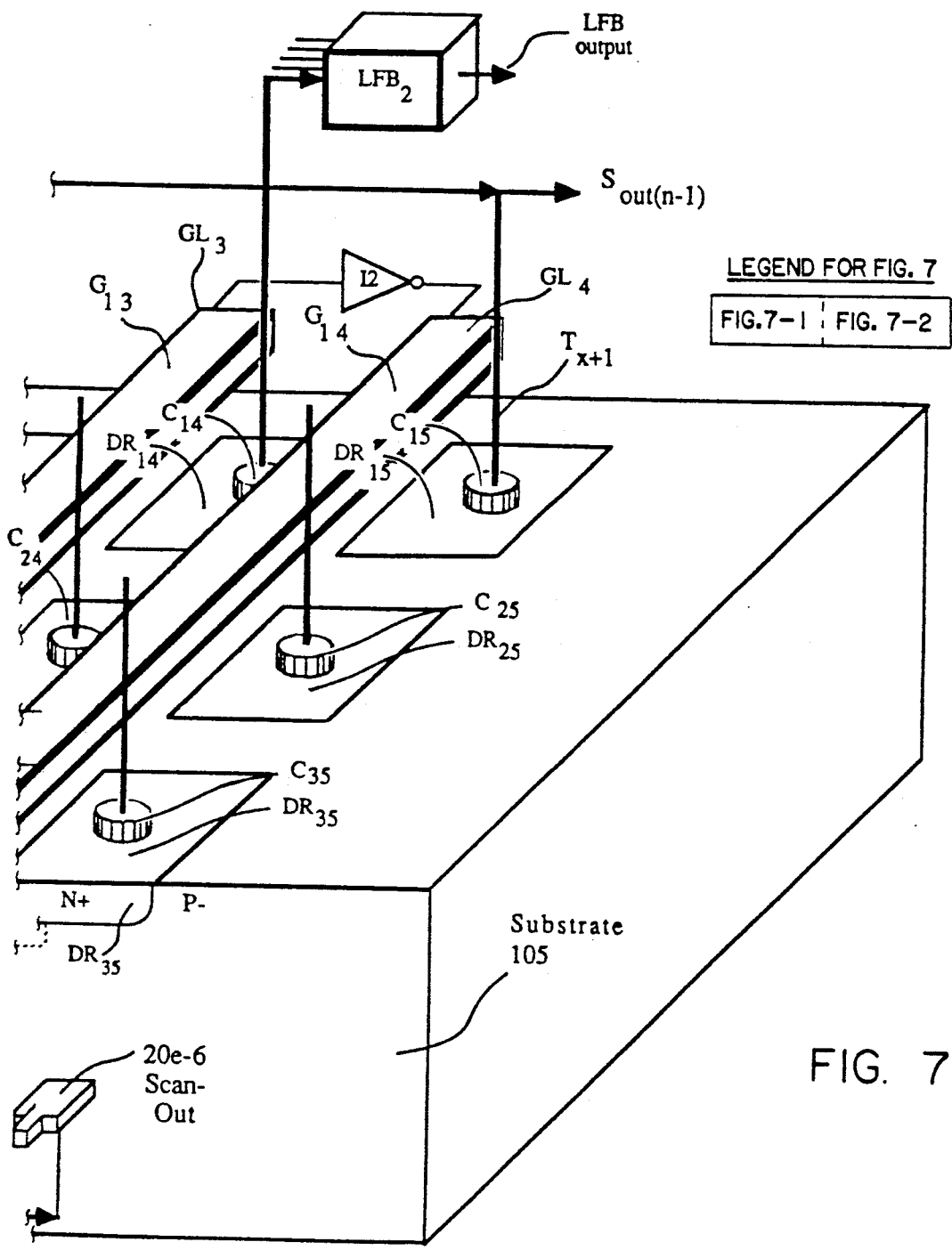

Hereafter, the first through fourth signal conducting entities $N_1$-$N_4$ will be referred to as "nodes" for the sake of brevity. It should be understood that the term "node", when used in conjunction with these entities $N_1$-$N_4$, defines something more than a point that can be charged to a voltage level, it defines a signal conducting entity having at least two spaced apart points between which digital logic signals must pass in order to be conducted "through" the node N. The nodes $N_1$-$N_4$ are preferably integral portions of a monolithic semiconductor body having regions which define major portions of the electronically actuatable switches $SW_1$-$SW_4$. By way of example, the nodes $N_1$-$N_4$ could be the source/drain or emitter/collector regions of switching transistors forming the switches $SW_1$-$SW_4$. The second node $N_2$ is preferably a single semiconductor region which is common to the second and third switches pairs $SW_2$-$SW_3$ while the third node $N_3$ is preferably another unitary semiconductor region which is common to the third and fourth switches $SW_3$-$SW_4$. As an example, FIGS. 7-1 and 7-2 show perspective views of a structure $TB_{xy}$ having such commonly utilized semiconductor regions.

During testing, the third switch $SW_3$ of FIG. 5-1, which is controlled by main control line $X_0$, remains open (nonconductive) while the other three switches $SW_1$, $SW_2$, and $SW_4$ are selectively actuated by signals on respective, subsidiary control lines $X_1$, $X_2$, and $X_4$ to perform the following functions: (a) shift scan-path signals from one test block $TB_x$ to a subsequent test block $TB_{(x+1)}$ or other serial element along the scan path $P_{scan}$; (b) receive signals from the output stage $O_{xx}$ of a first logical function block $MCLB_x$ and inject those signals into the scan path $P_{scan}$; and (c) pass signal levels that are stored in the storing means $FF_x$ into the input stage $I_{yy}$ of a second logical function block $MCLB_y$.

It should be appreciated at the outset here, that the designation of the first and second logical function blocks, $MCLB_x$ and $MCLB_y$, as physically separate blocks in this part of the discussion, is for the most part arbitrary and that output stage $O_{xx}$ and input stage $I_{yy}$ can belong to a single, physically united, logical function block $MCLB_{x+y}$ rather than to two spaced-apart, separate logic blocks.

In a first phase of testing ($SW_3$ is open); the first switch $SW_1$ is switched closed in all the test blocks $TB_{x-1}$, $TB_x$, $TB_{x+1}$, etc., while switch $SW_2$ remains open. A first series of binary test bits (i.e., a test vector such as 10101100 . . . ) is shifted into the input side of the scan path $P_{scan}$ through the scan-in pin 2-e-1. This series of test bits is shifted through all the data storing means $FF_{x-1}$, $FF_x$, $FF_{x+1}$, etc., of the test blocks (by suitable operation of a Load/Shift control signal [L/S] supplied to the storing means of each test block from a test block control unit 216a), and a matching set of binary test bits is tested for at the scan-out pin 20e-6. Successful completion of this first phase verifies the operability of the sequentially arranged storing means $FF_{x-1}$, $FF_x$, $FF_{x+1}$, etc.; the signal conducting capabilities of the first and fourth signal conducting nodes, $N_1$ and $N_4$ in all test blocks; the ability of all first switches $SW_1$ to pass signals; the continuity of the serial terminals $T_{x-1}$, $T_x$, $T_{x+1}$, etc. and the ability of the second switches $SW_2$ to block signals. (If $SW_2$ fails to block signals, contention can occur between the output stages of $MCLB_x$ and $TB_{x-1}$.)

If for some reason both of switches $SW_1$ and $SW_2$ are simultaneously but undesirably closed (i.e., because of a manufacturing defect), a contention fault will develop at the first node $N_1$ in situations where $MCLB_x$ and $TB_{x-1}$ are outputting opposed logic levels (H and L). Appropriate design of the test vectors can maximize the probability that if it could at all occur within any one of the $SW_1$-$SW_2$ switch pairs of a large number of test blocks such a contention will occur during testing. Contention faults which could occur during subsequent normal-use should be preferably detected during the first phase of testing and defective chips having such contention problems should be immediately discarded without adding cost for further testing. In the case where the output stage $O_{xx}$ of each logic block $MCLB_x$ is "registered" so it includes a flip flop (i.e., $0^*_{xx}$ of FIG. 6) which is responsive to the universal reset (RST) pin of the chip, a potential contention condition across switch $SW_2$ can be easily created by charging the first node $N_1$ high with an appropriate scan-test input vector and by resetting the output stage $0^*_{xx}$ of the logic block $MCLB_x$ with the RST p n to thereby drive the second node $N_2$ low. More will be said about this technique later.

Referring still to FIGS. 5-1 and 5-2, in a second phase of testing, predetermined test vector bits are serially loaded (by appropriate sequencing of shift block signals $\phi_1$ and $\phi_2$) into the storing means, $FF_{x-1}$, $FF_x$, $FF_{x+1}$, etc; the first switches $SW_1$ are then opened, the second and fourth switches, $SW_2$, $SW_4$, are closed ($SW_3$ remains open); and signals output from the storing means, $FF_{x-1}$, $FF_x$, $FF_{x+1}$, etc., are given time to charge their corresponding third nodes $N_3$ to valid binary levels for applying the test vector bits (stimuli) to the input stages $I_{yy}$ of their corresponding next logic blocks $MCLB_y$. Signals (responses) output from the output stages $O_{xx}$ to the second nodes $N_2$, are then allowed to pass through the second switch $SW_2$ and loaded into the storing means $FF_x$ by suitable pulsing of the $\phi_1$ and $\phi_2$ shift clock signals. The second switches, $SW_2$, are then opened; the first switches $SW_1$ are closed again, and the output data (responses) of the output stages $O_{xx}$, as received by the storing means $FF_x$, are shifted out along the scan path $P_{scan}$ to be detected at the scan-out pin 20e-6. Successful completion of this phase verifies the signal passing capabilities of all the terminals, $T_i$, $T_o$, $T_{x-1}$, $T_x$ and $T_{x+1}$; all the signal conducting nodes $N_1$ through $N_4$; switches $SW_1$, $SW_2$ and $SW_4$; and the data storing means $FF_x$ as well as the stimulus/response functionality of the individual logical function blocks (i.e., $MCLB_x$, $MCLB_y$, etc.).

It should be noted that no attempt has yet been made to pass a signal through the third switch $SW_3$, but nonetheless, the signal conducting capabilities of the second and third nodes, $N_2$, $N_3$, which capabilities are crucial to the ability of the third switch $SW_3$ to pass signals, have been indirectly verified by passing signals through a circumventing signal path which is sequentially composed of: terminal $T_i$, node $N_2$, switch $SW_2$, storing means $FF_x$, node $N_4$, switch $SW_4$, node $N_3$, terminal $T_o$, a subsequent logical function block, $MCLB_y$, and thereafter either subsequent test block, i.e. $TB_{x+2}$, or a subsequent I/O pin.

Figure 6:
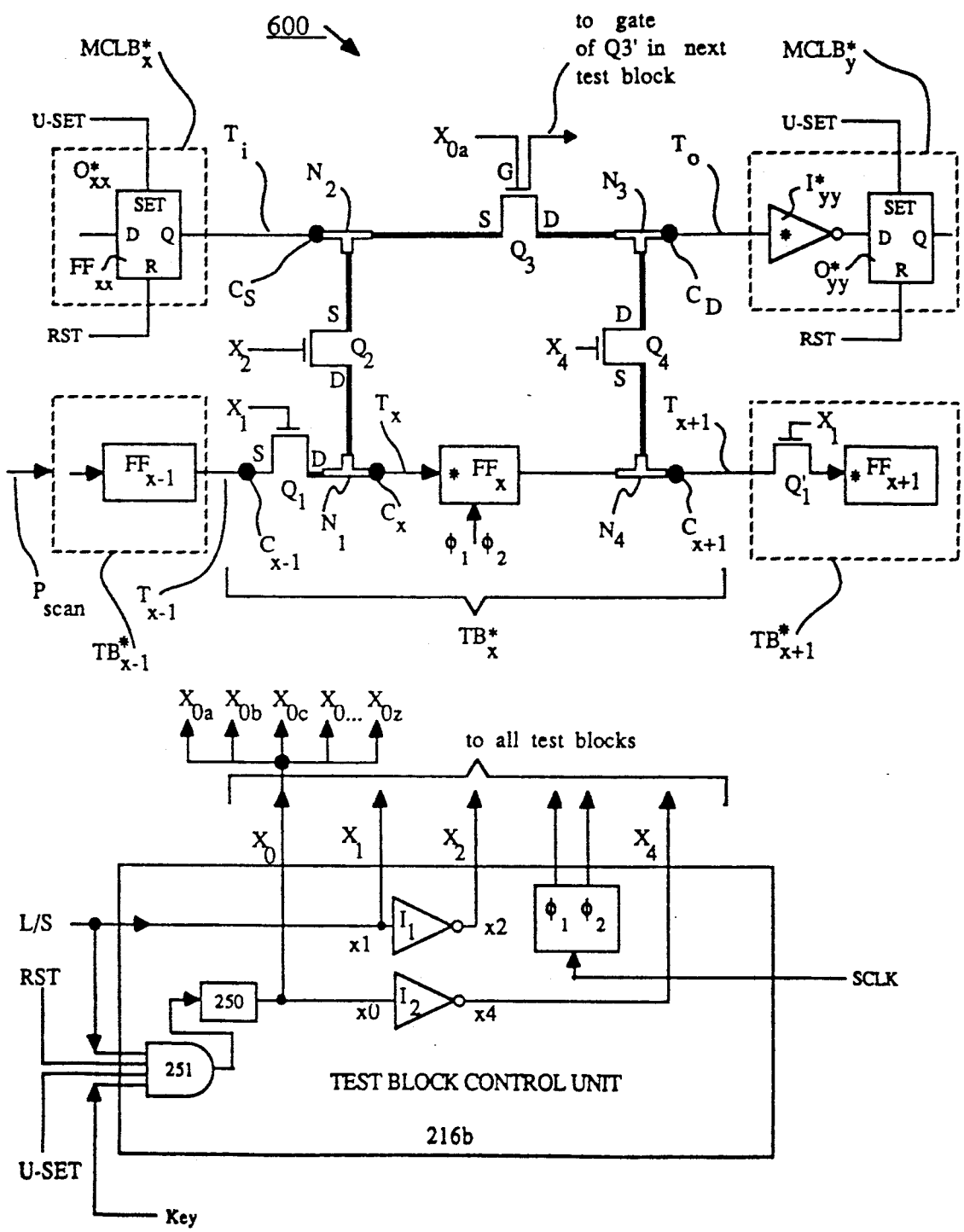
FIG. 6 is a schematic diagram of an FET pass-transistor version of the scan test circuit shown in FIG. 5.

The first through fourth electronically actuatable switches, $SW_1$-$SW_4$, may be formed of many known switching devices including field effect pass transistors, CMOS (complementary metal-insulator-semiconductor) transmission gates and bipolar pass transistors. FIG. 6 shows a preferred embodiment 600 in which these switches $SW_1$-$SW_4$ are respectively formed of N-channel fie)d effect pass transistors $Q_1$ through $Q_4$ (all of equal size). The pass transistors $Q_1$-$Q_4$ each comprise source and drain regions, S and D, that are integrally formed in a semiconductor substrate (not shown in FIG. 6) together with the logical function blocks, $MCLB_x^*$ and $MCLB_y^*$, and remaining portions of the scan test path $P_{scan}$. Those skilled in the art will appreciate that the terms "source" and "drain" are interchangeable when used in conjunction with field effect pass transistors and are used to designate one or the other of the signal input and output ports of a pass transistor. Such artisans will also appreciate that N-channel pass transistors are well suited for passing positive-logic, binary lows (pull-down voltages) and that such transistors disadvantageously drop a threshold voltage $V_T$ (i.e., 0.6V-1.5V) when passing binary highs (pull-up voltages). Furthermore, they will appreciate that complementary type, P-channel pass transistors exhibit the reverse characteristics, that is, P-channel pass transistors easily pass binary highs but disadvantageously drop a threshold voltage when attempting to pass binary lows.

If contention occurs between two pass transistors of the same type, where a first of the transistors is attempting to pass a binary low and thereby charge a common node to the logic low level while the other of the transistors is attempting to pass a binary high and thereby charge the same common node to the logic high level; the low-passing transistor will overpower its opponent in the case where both transistors are N-channel type and the transistor trying to pass a binary high will overpower its opponent in the case where both pass transistors are of the P-channel type. This phenomenon is mentioned here because it plays a role in resolving a first contention condition that could occur at node $N_3$ if both of transistors $Q_3$ and $Q_4$ were to be simultaneously (because of a manufacturing defect) attempting to pass opposed signals and a second contention condition which could occur at node $N_1$ if both of transistors $Q_1$ and $Q_2$ were to be simultaneously attempting (again because of a manufacturing defect) to pass opposed signals.

The possibility of such contentions at node $N_1$ has already been discussed with respect to the aforementioned first phase of testing. In specific regard to the embodiment 600 of FIG. 6 it can be seen that if output stage $O^*_{xx}$ is outputting a low voltage level (i.e., a logic low, L) the data storing means (flip flop) $FF_{x-1}$ is outputting an opposed, high voltage level (i.e., a logic high, H); and by reason of either a design or manufacturing flaw, both of transistors $Q_1$ and $Q_2$ are conducting, then (in the case where both of transistors $Q_1$ and $Q_2$ are N-channel devices) the low passing transistor, $Q_2$, will overpower the high passing transistor, $Q_1$, and a logic low (L) will appear at the input terminal $T_x$ of flip flop $FF_x$ instead of the expected logic high (H). The effects of this contention can be detected during the initial phase of testing and defective chips can be rejected before additional time is wasted testing the chips further.

As shown in FIG. 6, output stage $O^*_{xx}$ is preferably a "registered" output having a flip flop $FF_{xx}$ with a reset terminal R coupled to the global reset line RST of the overall chip (600) and further with a set terminal SET coupled to the universal set line U-SET of the chip. When the test mode is initially entered by activating the RST line and unlocking the lock means 250 (see also FIG. 4B), the registered outputs of all logic blocks MCLB will be automatically reset to thereby place a low level (L) on the primary input terminals $T_i$ of each test block $TB^*_x$. The flip flops, $FF_{x-1}$, $FF_x$, $FF_{x+1}$, etc., of all the test blocks are then set (i.e., by shifting in a sequence of highs H into the scan path) to thereby place a high level (H) on the serial input terminal $T_{x-1}$ of each test block and thus, a potential contention condition is created for the first and second switching transistors, $Q_1$ and $Q_2$, of all the test blocks $TB^*_x$. If $Q_1$ and $Q_2$ are simultaneously conducting, the contention may be detected as previously explained by shifting out the data of the test block flip flops $FF_{x-1}$, $FF_x$, $FF_{x+1}$, etc. and noting that they contain binary zeroes (forced by the overpowering action of $Q_2$) instead of the binary ones originally loaded into them (either serially through the scan path or in parallel by means of a test-block flip-flop set line [not shown]). Other methods by which such contentions may be easily detected will be discussed later.

Because each of the pass transistors $Q_1-Q_4$ drops one threshold voltage $V_T$ when attempting to pass a binary one (H level), the switching levels of active components (i.e., $FF_x$, $I^*_{yz}$ and $FF_{x+1}$) receiving signals passed through the pass transistors $Q_1-Q_4$ should be adjusted to compensate for the level shift. If no adjustment is made, static current might undesirably flow through CMOS inverters driven by input voltages different from the voltage levels of their power and ground rails. One method for so doing is to set the threshold voltages of FET transistors (particularly P-channel FET's for the case of FIG. 6 where $Q_1-Q_4$ are N-channel pass transistors) in the active components to a predetermined, shifted level which is different from that used for active components which receive digital signals directly through metal lines rather than through a pass transistor. (This can be done by doping the FET channel regions with different concentrations of impurities or leaving such channels intrinsic.) The input terminals of level adjusted, active components are marked with an asterisk (*) in FIG. 6 to indicate such level shifting. (Incidentally, asterisks are also used to denote the optional adjustment of switching levels in FIGS. 5-1 and 5-2 for active components that are driven through resistive-capacitive interconnects rather than directly but this has to do with dynamic rather than static considerations.)

Referring to the four "nodes" of FIG. 6, the first node $N_1$ is preferably structured such that it simultaneously serves as the drain region D of both the first and second pass transistors, $Q_1$ and $Q_2$; the second node $N_2$ is structured such that it simultaneously serves as the source region S of the second and third pass transistors, $Q_2$ and $Q_3$; and the third node $N_3$ is structured such that it simultaneously serves as the drain region D of the third and fourth pass transistors, $Q_3$ and $Q_4$. Shared source/drain regions are schematically indicated in FIG. 6 by thickened lines. If desired, the sharing of source and drain regions may be optionally extended for connecting the fourth node $N_4$ to subsequent test blocks. That is, the fourth node $N_4$ can further define the source S of the first pass transistor $Q_1'$ in subsequent test block $TB_{x+1}$ so that node $N_4$ is shared by $Q_4$ and $Q_1'$. Otherwise, substrate contacts $C_{x+1}$ and metalized connecting lines $T_{x+1}$ may be used to interconnect test blocks one to the next to thereby define the scan path $P_{scan}$.

The embodiment 600 of FIG. 6 includes a test block $I_1$ control unit 216b which connects to and is shared by all the test blocks, $TB^*_{x-1}$, $TB^*_x$, $TB^*_{x+1}$, etc. The control unit 216b comprises a first inverter $I_1$ coupling the $X_1$ control line to the $X_2$ control line so that opposed control signals, x1 and X2, will be respectively generated thereon, and a second inverter $I_2$ coupling the $X_0$ main control line to the $X_4$ control line so that opposed control signals, x0 and x4, will be respectively generated thereon.

During the testing mode, the main control line $X_0$ is always held low (e.g. at ground) and the $X_4$ control line is always pulled high (e.g. at +5 volts). The levels, x1, x2, on respective control glines $X_1$ and $X_2$ are always opposite to each other so that only one of pass transistors $Q_1$ and $Q_2$ should be turned ON at any given time. If by reason of a manufacturing flaw, $Q_1$ and $Q_2$ are simultaneously turned ON, this can be detected by the previously described contention detection method.

The main control line $X_0$ or branches thereof $X_{oa}$, $X_{ob}$ are threaded serially through the gates G of the third pass transistors i.e., $Q_3$, $Q_3'$, etc. in all the test blocks $TB^*_x$, $TB^*_{x+1}$, etc., so that the continuity of those gates can be tested as previously described using the special test blocks $STB_a$, $STB_b$.

Referring to FIGS. 7-1 and 7-2 a possible layout 700 for plural test blocks $TB_{xy}$ that are arranged in a x-by-y matrix, is shown schematically in perspective view. In the layout 700, plural gate lines $GL_1$ through $GL_4$ are arranged in close proximity to one another (i.e., less than 5 microns apart) as shown. The gate lines $GL_1$–$GL_4$ are preferably composed of heavily doped (N+ or P+) polysilicon and are supported above a monocrystalline silicon substrate 105 (preferably the same substrate 105 shown in FIG. 3F) by a thin gate oxide layer 106 (not shown in FIGS. 7-1 and 7-2. Rows of first through fifth diffusion regions, $DR_{11}$–$DR_{15}$, $DR_{21}$–$DR_{25}$, and $DR_{31}$–$DR_{35}$ are implanted in matrix-like fashion into the substrate 105 using the polysilicon gate lines $GL_1$–$GL_4$ as implant masks, to define in each row, respective first through fourth pass transistors $Q_1$–$Q_4$ as indicated. Respective ohmic contacts $C_{11}$ through $C_{35}$ are made to the respective diffusion regions $DR_{11}$–$DR_{35}$.

In FIGS. 7-1 and 7-2, the full circuitry of only one test block, $TB_{xy}$, is shown positioned over the row of diffusion regions $DR_{11}$–$DR_{15}$ while the circuitry of other test blocks is not shown. It should be apparent that the same test block circuitry of $TB_{xy}$ is to be replicated along the rows comprising of diffusion regions $DR_{21}$–$DR_{25}$, $DR_{31}$–$DR_{35}$ and so forth. The illustration of these other test block circuits is intentionally omitted to prevent cluttering in the illustration of FIGS. 7-1 and 7-2. It will be apparent to those skilled in the art that the same test block circuitry layout can also be step repeated to the left and right of the illustrated matrix of diffusion regions $DR_{11}$–$DR_{35}$ by adding more diffusion regions and gate lines, but again, such circuitry is omitted for the sake of simplicity.

Diffusion-region contact $C_{11}$ and the conductor $T_{x-1}$ emanating vertically therefrom correspond to the source contact $C_{x-1}$ and the serial input terminal $T_{x-1}$ shown in FIG. 6. Conductor $T_{x-1}$ couples the first switching transistor $Q_1$ to a previous serial element $(TB_{x-1})$ of the scan path $P_{scan}$. The scan-in pin 2-$e$-1 is schematically shown to be serially coupled to the contact $C_{11}$ through the scan path $P_{scan}$.

Some portions of FIGS. 7-1 and 7-2 are schematically illustrated as being elevated above the substrate 105 or of otherwise being spaced apart from the substrate 105 but it should be apparent to those skilled in the art that these portions may actually be defined within the substrate 105 or integrally attached to the substrate 105. They are shown separated away from the substrate merely for the sake of illustrative convenience. The remaining correspondence between FIGS. 6, 7-1, and 7-1 should, for the most part, be obvious and thus it will not be elaborated on. Diffusion regions $DR_{12}$–$DR_{15}$ and substrate contacts $C_{12}$–$C_{15}$ respectively correspond to the signal conducting nodes $N_1$–$N_4$ of FIG. 6 and the contacts, $C_x$, $C_S$, $C_D$ and $C_{x+1}$ attached thereto.

Portions of the elongated gate lines $GL_1$–$GL_4$ that overlie lightly doped channel regions (P-) between the diffusion regions of each row, define respective gate electrodes $G_{11}$–$G_{14}$ of the transistors $Q_1$–$Q_4$ of each row. A first gate contact node $C_{G1}$ is shown attached to one end (forward end) of the first gate line $GL_1$ to supply a first control signal x1 to that gate line $GL_1$. An opposed (rearward) end of the first gate line $GL_1$ is shown coupled to the input side of inverter $I_1$. An output terminal of inverter $I_1$ is shown coupled to an adjacent (rearward) end of the second gate line $GL_2$ to supply a second control signal $X_2$ to that gate line $GL_2$ while an opposed (forward) end of the second gate line $GL_2$ is coupled to a continuity-detecting shift register $SR_{n-1}$ (i.e., a special test block STB) included in the scan path $P_{scan}$ for testing the continuity of the first and second gate lines $GL_1$ and $GL_2$.

A second gate contact $C_{G2}$ is shown in FIG. 7-1 to be contacting the forward end of the second gate line $GL_2$ and connecting that forward end to the data loading terminal (X2) of the continuity-detecting shift register $SR_{n-1}$. The positioning of this second gate contact $C_{G2}$ at the forward end of gate line $GL_2$ is selected more for illustrative and symbolic convenience rather than as an indication of its actual placement. At least one contact needs to be made to the second gate line $GL_2$ in order to charge that gate line to the desired control level x2. Those skilled in the art will appreciate that the second gate contact $C_{G2}$ could be located at the rearward end of the second gate line $GL_2$ to couple the output terminal of inverter $I_1$ to the rearward end of $GL_2$ and that the forward end of the second gate line $GL_2$ may be capacitively coupled to the data input stage of the continuity-detecting shift register $SR_{n-1}$ rather than being coupled directly by means of a metal contact. (E.g., the second gate line $GL_2$ could form the gate of an input FET transistor in the shift register $SR_{n-1}$.) This is mostly a matter of design choice.

It will be furthermore appreciated, that the rearward end of the first gate line $GL_1$ can also be capacitively coupled to the input of the first inverter $I_1$ in the same manner. The decision of whether to use one or two metal contacts for each of the gate lines, $GL_1$ and $GL_2$, is not important here; what is important, is that the arrangement provides a serial conduction path for checking the continuity of either or both of the first and second gate lines, $GL_1$ and $GL_2$, and the operable coupling of those gate lines to the X1 and X2 control lines. The continuity of the first and second gate lines, $GL_1$ and GL, may be proven by feeding a series of high and low voltage levels through the L/S mode selecting pin 20$e$-3, passing these levels through the control line $X_1$, through the first gate contact $C_{G1}$, from the forward end of the first gate line $GL_1$ to the rearward end thereof, through the first inverter $I_1$, from the rearward end of the second gate line $GL_2$ to the forward end thereof, through the second gate contact $CG_2$, through the $X_2$ control line, loading the thusly transmitted levels into the continuity-detecting shift register $SR_{n-1}$, shifting them through the serial scan path $P_{scan}$, and out of the scan-out pin 20$e$-6. Successful completion of such a test verifies the proper formation of all the elements involved in the serial conduction path including gate electrodes $G_{11}$ and $G_{12}$ and assures that the gate electrodes will receive suitable control levels (either above or below the threshold voltages of the transistors). If there is a break in the continuity of the serial conduction path, the output bits emanating from the scan-out pin 20e-6 will tend to float to an arbitrary level rather than to levels corresponding to the H and L input bits presented at the signal originating end of the serial conduction path, i.e., at L/S pin 20e-3. If a portion of the serial conduction path is incorrectly shorted to an active pull up/down line, this defect will also be indicated by a mismatch between data fed into the serial conduction path and data read out from the same through the serial scan path.

It can be seen from the symmetry of FIGS. 7-1 and 7-2 that the same testing strategy is to be used for verifying the continuity of the third and fourth gate lines, $GL_3$ and $GL_4$. Predetermined voltage levels are fed into the test-mode activating pins 2-e-1 through 2-e-4, passed through the lock means 250 (not shown) to the $X_0$ control line, through a third gate contact $C_{G3}$ (which is shown contacting the forward end of gate line $GL_3$), from the forward end of the third gate line $GL_3$ to the rearward end thereof, through the second inverter $I_2$, from the rearward end of the fourth gate line $GL_4$ to the forward end thereof, through a fourth gate contact $C_{G4}$ (which is symbolically shown contacting the forward end of gate line $GL_4$ even though in practice it might be at the rearward end thereof), through the $X_4$ control line, into a second continuity-detecting shift register $SR_n$, through the scan path $P_{scan}$, and finally out of the scan-out pin 20e-6.

Careful study of FIGS. 7-1 and 7-2 will show that the disclosed structure of the test block $TB_{xy}$ can verify, not only, the signal conducting capabilities of the five diffusion regions $DR_{11}$–$DR_{15}$ corresponding to the source/drain elements of switching transistors $Q_1$–$Q_5$, but also whether proper contact has been made to those diffusion regions by respective metal contacts $C_{11}$ through the $C_{15}$. When a test output signal is passed from the output stage of the first logical function block $LFB_1$ into the storing means (flip flop) $FF_x$ and injected from there into the scan path $P_{scan}$, such an output signal must flow through substrate contacts $C_{13}$ and $C_{12}$. When a test input signal is to be shifted through the scan path $P_{scan}$, loaded into the flip flop $FF_x$, and injected therefrom into an input line of the second logical function block $LFB_2$, such a signal must pass sequentially through substrate contacts $C_{11}$, $C_{12}$, $C_{15}$ and $C_{14}$. Thus, successful testing of the individual operations of the first and second logical function blocks, $LFB_1$ and $LFB_2$, simultaneously verifies the continuity of the connections (i.e. contact $C_{13}$) between the output of the first logical function block $LFB_1$ and the source (diffusion region $DR_{13}$) of the third pass transistors $Q_3$ and also the continuity of the connection between the drain (diffusion region $DR_{14}$) of the third pass transistor $Q_3$ and the input line of the second logical function block $LFB_2$ (i.e. through substrate contact $C_{14}$). If the third pass transistor $Q_3$ becomes conductive as intended when the main control line $X_o$ (and its branch, gate line $GL_3$) goes high, there should be no reason why signals from the first logical function block $LFB_1$ will not successfully pass to the second logical function block $LFB_2$.

From the above, it can be seen that all portions of the third pass transistor $Q_3$, namely; the gate line $GL_3$, the source $DR_{13}$ and the drain $DR_{14}$, may be tested for their ability to pass signals even though the third pass transistor $Q_3$ is never actually turned on (rendered conductive). The signal conducting abilities of switching transistors $Q_2$ and $Q_4$, which are formed simultaneously with and positioned at opposed sides of switching transistor $Q_3$, are verified by successful completion of the scan testing. It is quite reasonable to assume during testing that, because transistors $Q_2$ and $Q_4$ operated properly (i.e. at desired threshold voltages) during scan testing, the interposed and closely proximate third pass transistor $Q_3$ will operate properly after testing when the $X_0$ control line is driven high (+5 volts).

There is one aspect of the third pass transistor $Q_3$ which may appear to have not been tested for in the above described procedure. That aspect is whether the source region $DR_{13}$ and drain region $DR_{14}$ of transistor $Q_3$ are unintentionally merged to form a short circuit through that transistor. But this condition can also be detected simultaneously with normal scan testing. Referring back to FIG. 6, it can be seen that if the output stages $0*_{xx}$ of logic block $MCLB*_x$ ($LFB_1$) is outputting a pull-down voltage (a binary zero), while the output stage of storing means $FF_x$ is simultaneously outputting a pull-up voltage (a binary one), while control line $X_4$ is being held low, and while the source and drain of the third pass transistor $Q_3$ are unintentionally shorted together; that the pull-down voltage (binary zero) from output stage $0*_{xx}$ will pass directly through transistor $Q_3$ without any loss (threshold drop) and it will thus overpower the pull-up voltage (binary one) being supplied to the third node $N_3$ through the fourth transistor $Q_4$. This occurs because the latter N-channel pass transistor, $Q_4$, exhibits a loss of at least one threshold voltage $V_T$ when attempting to pass the binary one from the storing means $FF_x$ as explained earlier. The output level of output stage $0*_{xx}$ will thus overpower the output level of flip flop $FF_x$. Such a contention condition will show up as a fault during the testing of the second logical function block $MCLB*_y$ ($LFB_2$).

It is worthy to note here that an unintentional shorting between the source and the drain of the third pass transistors $Q_3$ constitutes a "fail-safe" type of defect because, even though such a fault may prevent full use of the scan testing chains, it nonetheless allows normal-use signals to pass from the output stage $O_{xx}$ of the first logical function block to the input stage $I_{yy}$ of the second logical function block $LFB_2$ so the overall circuit (600) might still operate as intended in the normal-use mode.

Figure 8:
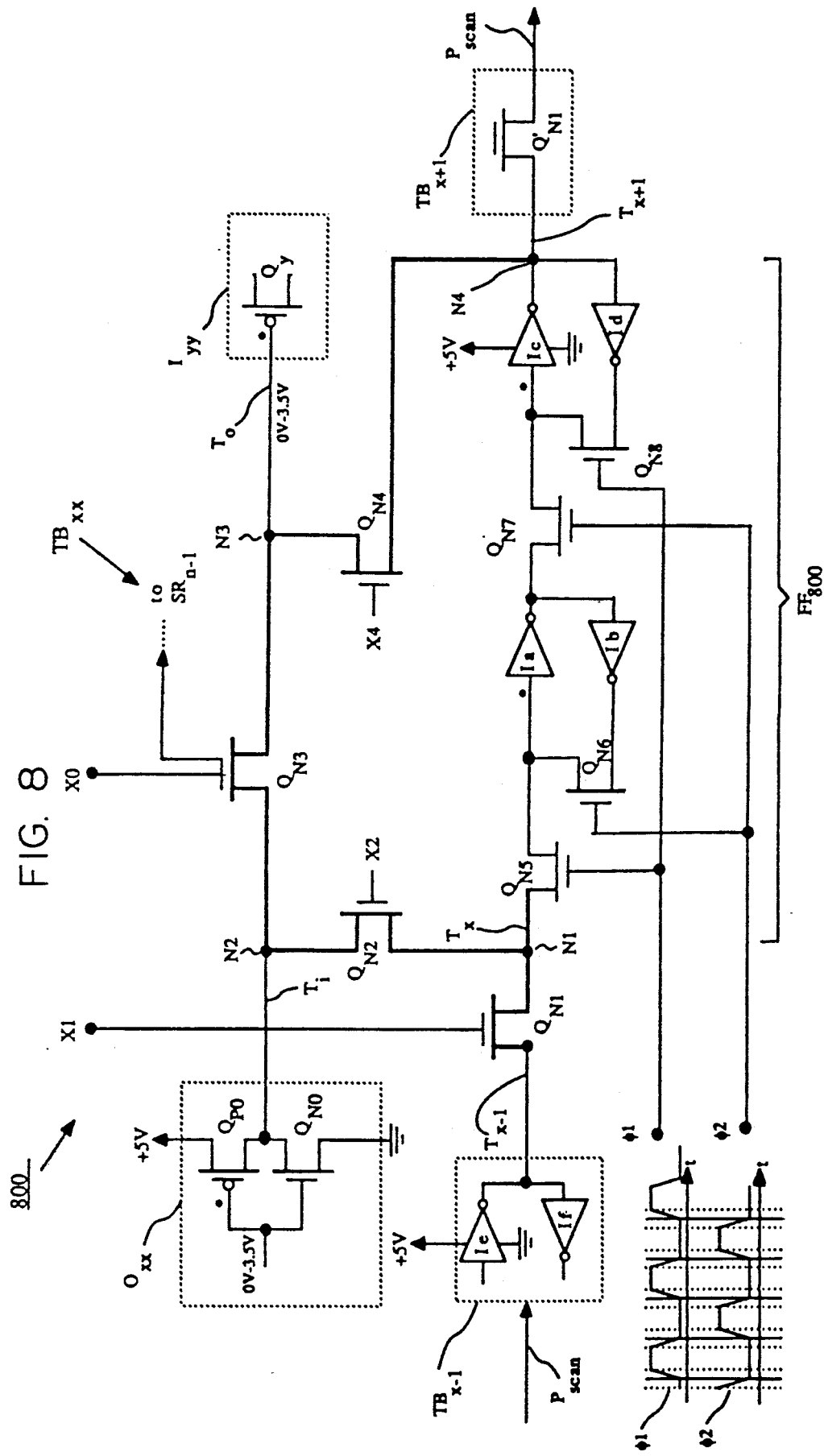
FIG. 8 is a schematic diagram of a CMOS embodiment of the test block.

A CMOS embodiment 800 of the test block structure is schematically shown in FIG. 8. Like reference numerals are used for all elements similar to those previously described. First through fourth pass transistors $Q_{N1}$–$Q_{N4}$ are N-channel enhancement type FET's of equal size. The illustrated inverters, $I_a$, $I_b$, $I_c$, $I_d$, $I_e$, $I_f$, are all CMOS devices having the same complementary P-channel and N-channel structure shown for output stage $O_{xx}$ ($Q_{PO}$ is a P-channel device and $Q_{NO}$ is an N-channel device). Inverters $I_b$, $I_d$ and $I_f$ have a lower current output capability than respective inverters $I_a$, $I_c$ and $I_e$ so that the output state of feedback inverters $I_b$, $I_d$ and $I_f$ can be overridden by a new input signal when the states of the their respective memory latches are to be switched. A master-slave flip flop $FF_{800}$ is defined by a master latch formed of inverters $I_a$, $I_b$ and pass transistors $Q_{N5}$, $Q_{N6}$; and a slave-latch formed of inverters $I_c$, $I_d$ and pass transistors $Q_{N7}$, $Q_{N8}$.

The switching level of inverter $I_a$ is adjusted (indicated by *) to compensate for the threshold drop $V_T$ of pass transistor $Q_{N5}$ and either of $QN_1$ or $Q_{N2}$. Nonoverlapping clock phases $\phi_1$ and $\phi_2$ are supplied to the gates of the latch setting transistors $Q_{N5}$, $Q_{N7}$ and the loop closing transistors $Q_{N6}$, $Q_{N8}$ for controlling the load, store and shift operations of the flip flop $FF_{800}$.

The switching level of inverter $I_c$ is suitably adjusted (indicated by *) to compensate for the threshold drop of each of pass transistors $Q_{N7}-Q_{N8}$ by appropriate adjustment of the threshold voltage of the P-channel transistor (i.e., corresponding to $Q_{P0}$) in the inverter or by other suitable means known in the art. The switching level of input stage $I_{yy}$ of the next logical function block receiving signals passed through the pass transistor $Q_{N3}$ is also suitably adjusted to compensate for the threshold voltage drop of transistor $Q_{N3}$. The reason behind threshold adjustment may be appreciated by referring to the detailed CMOS inverter shown in box $O_{xx}$ of FIG. 8. If the input signal to this inverter $O_{xx}$ swings only over the range 0 V–3.5 V (by way of example) while the source of P-channel transistor $Q_{P0}$ is at the +5 V level and while the threshold of transistor $Q_{P0}$ is not adjusted to be higher than normal, transistor $Q_{P0}$ might continue to undesirably remain conductive when the input signal at its gate rises to 3.5 V and power-consuming static current will flow from the +5 V rail to the ground rail through transistors $Q_{P0}$ and $Q_{N0}$. To avoid such a condition, the channel region of transistor $Q_{P0}$ is left in a native (intrinsic or unimplanted) state so that this transistor will have a higher than normal threshold voltage thereby causing it to cease conduction when its gate voltage rises to 3.5 V (by way of example). The channel regions of transistors which receive a full 0 V–5.0 V voltage swing at their gates are preferably implanted (adjusted) to have substantially lower threshold voltages.

Figures 1, 9:
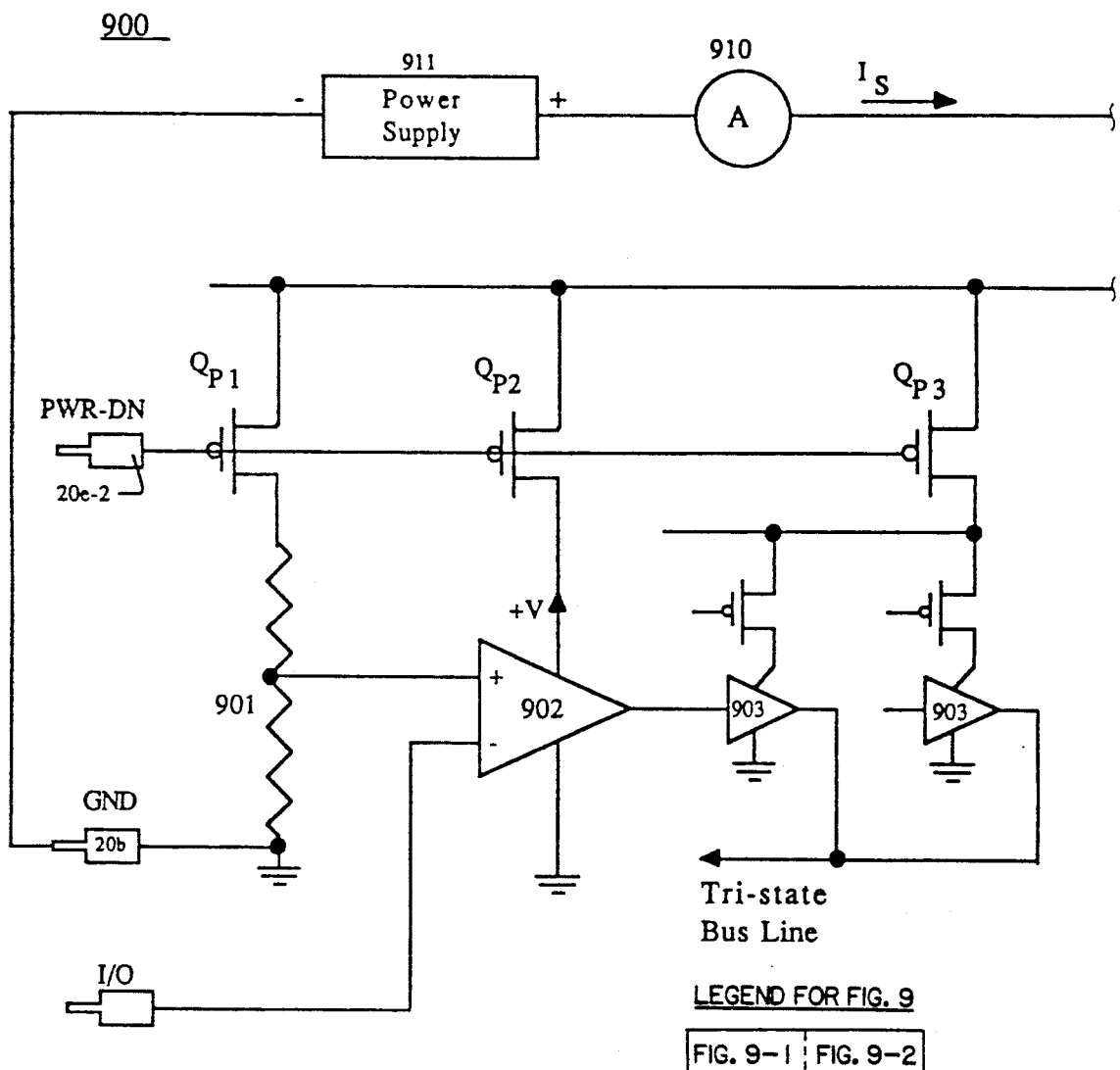
Figures 2, 9:
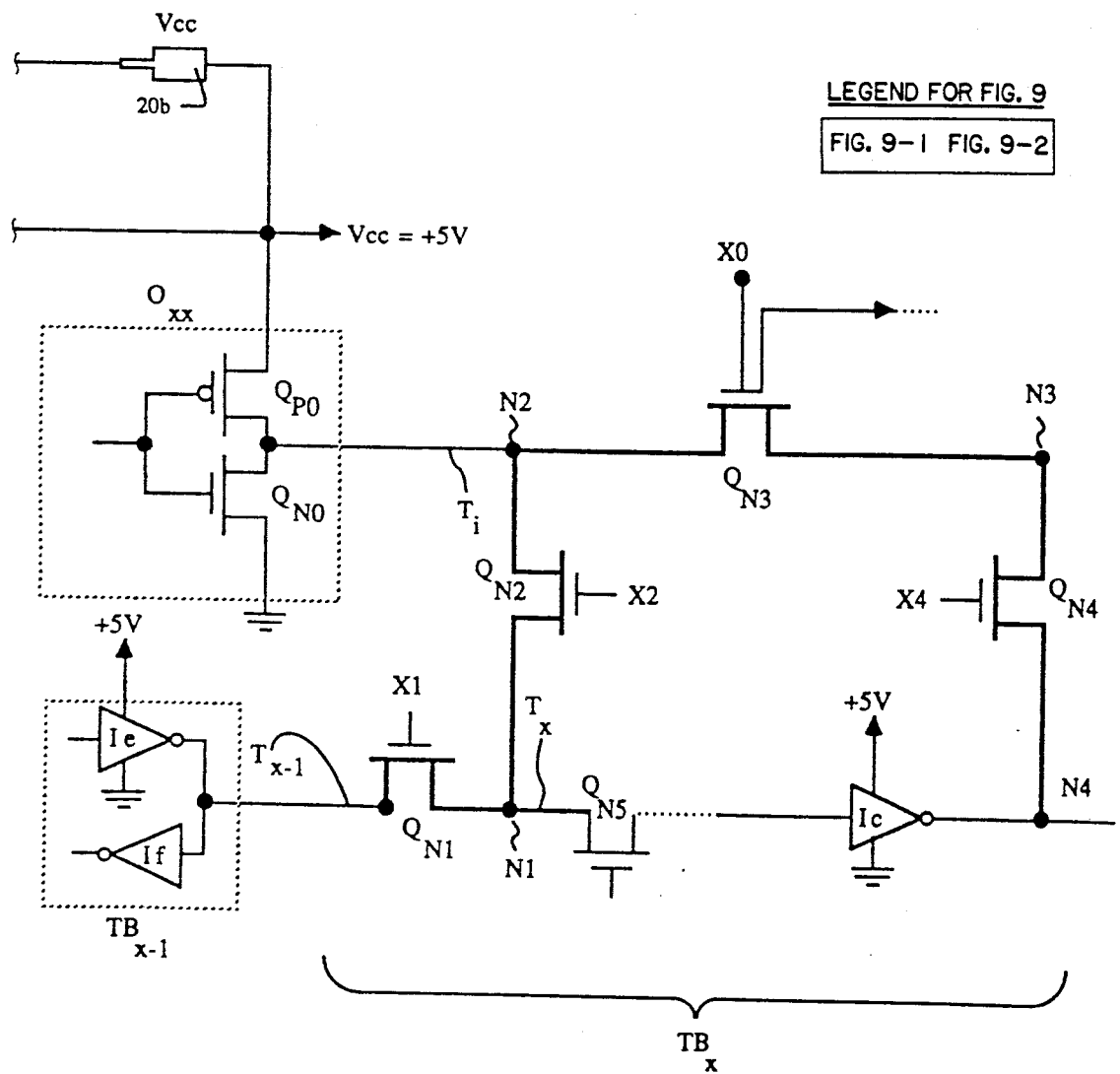

FIGS. 9-1 and 9-2 are block diagrams of a contention detecting circuit 900 in accordance with the invention. As mentioned earlier, the integrated circuit of the invention includes a power down pin PWR-DN which is used to reduce the current draw of the chip during a low power, standby mode. More specifically, in an embodiment 900 of the invention, a plurality of transistor switches $Q_{P1}$, $Q_{P2}$, $Q_{P3}$, etc., are interposed between the power rail $+V_{cc}$ of the chip and non-test portions of the circuitry within the chip which can draw static current such as, for example, a voltage dividing network 901 or a differential amplifier 902 or a set of tristatable bus drivers 903 that may be provided on the chip. When the power down pin PWR-DN is activated in the normal-use mode, the switches $Q_{P1}$, $Q_{P2}$, etc. become nonconductive and thereby prevent static current $I_s$ from flowing from the $+V_{cc}$ power rail of the chip to the ground rail through these non-test, static-current drawing circuits (i.e., voltage divider 901 and differential amplifier 902).

In the embodiment 900, power reducing switches, i.e., QPx (where x=1, 2, 3, etc.), are not inserted between the power/ground rails and the power/ground lines of CMOS inverters in the logical function blocks (i.e., $O_{xx}$) and/or of the scan test blocks (i.e., $TB_{x-1}$) Thus, if the chip is placed in the power-down (power-saving) mode and opposed output levels are generated at the output terminals of LFB output stage $O_{xx}$ and test-block inverter $I_c$, while transistor $QN_4$ is supposed to be in a nonconductive (signal-blocking) state; but due to a manufacturing defect, the fourth switching transistor $QN_4$ is undesirably passing signals at the same time that third switching transistor $Q_{N3}$ is also passing signals, a substantial amount of static current $I_s$ will flow between the power/ground rails of the chip, and this power flow can be detected simply by inserting an ammeter 910 of suitable sensitivity (or other suitable current detection means) in series with the circuit power supply 911 and one or the other of the ground or $+V_{cc}$ pins of the chip to thereby detect such current flow. If the fourth pass transistor $QN_4$ of each test block is blocking substantial current flow, as it should during the normal-use, power-down mode; no more than a small amount of leakage current (nano-amperes) should be detected by the current detection means 910. If on the other hand, a fourth pass transistor $QN_4$ in one of the test blocks $TB_x$ leaks substantial current during the normal-use, power-down mode, a flow of more than a few nano-amperes (i.e., one or more milliamperes) will be detected and such detection should be used to indicate a defective part.

With this circuit 900 and testing technique, the current blocking ability of each fourth transistor $QN_4$ in each of the test blocks of the chip can be simultaneously verified. Opposed output levels can be generated at the outputs of stages $O_{xx}$ and inverters $I_c$ of respective sets of logic function blocks (LFB's) and test blocks (TB's) by suitable design of test vectors that are shifted into the scan path and optionally with further use of the RST or U-SET functions.

Figure 10:
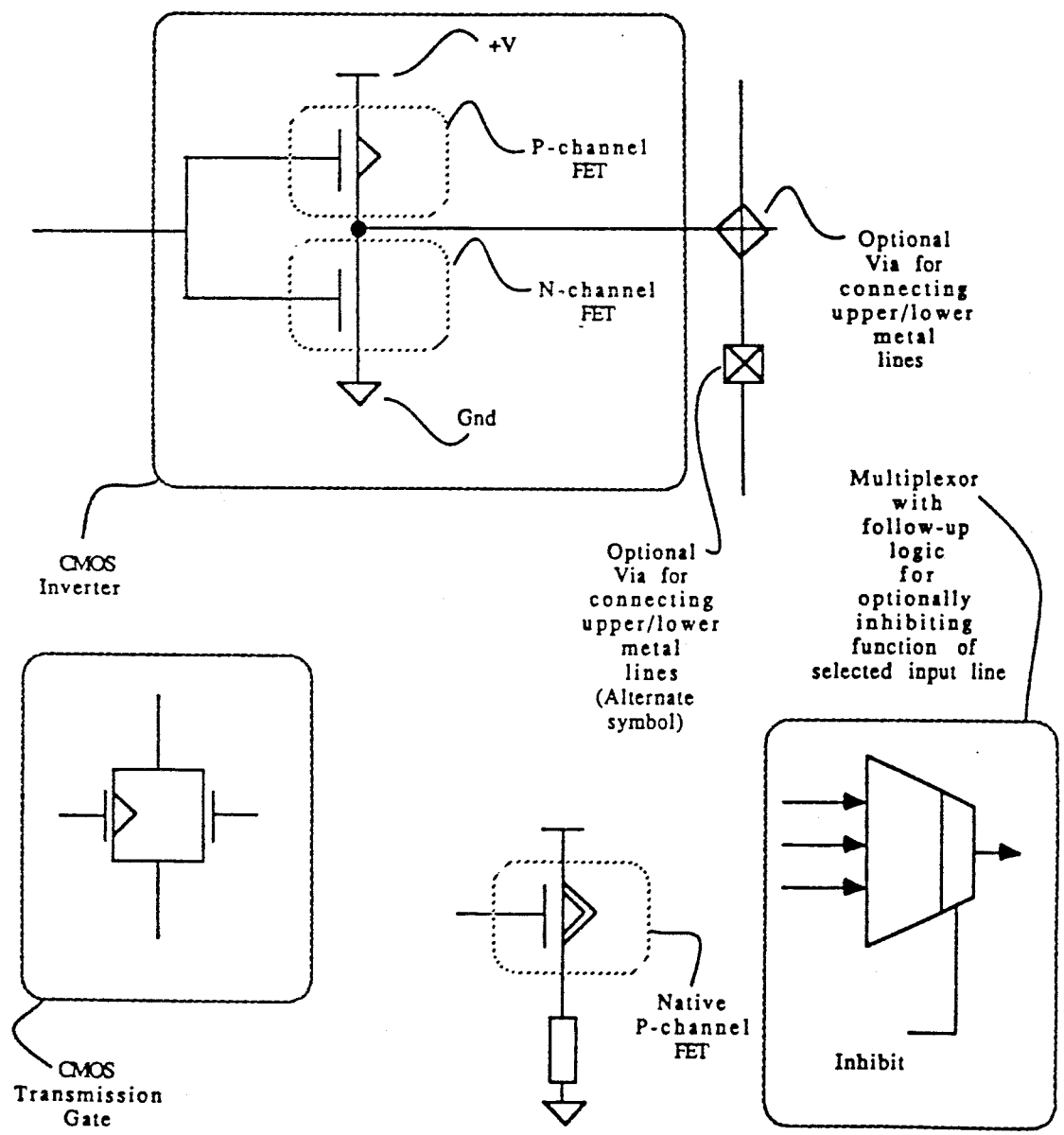
FIG. 10 is a legend for reading FIGS. 11-1 through 19.

Referring to FIGS. 10-21-4, further details of a metal configured integrated circuit in accordance with the invention will now be described. FIG. 10 is a legend for explaining the meanings of electrical symbols used in FIGS. 11-21. FIGS. 20-1 through 20-4 and 21-1 through 21-4 are presented in sections which are to be combined as indicated on their corresponding sheets. The below Table 1 describes the functions of pins/pads shown in FIGS. 11-1 through 21-4.

TABLE 1

| Pin Name | Pin Description (UCI-function)/MCLL-function |
|---|---|
| (M1/RD)/TOUT | → 3 Function pin<br>1.) Scan test output, in test mode TM1<br>2.) Part number shift output, in test mode TM2<br>3.) Prop-delay output, in TM2 |
| (CCLK)/TSW | → 5 Function pin<br>1.) Resets test mode enabling shift register, in either TM<br>2.) Controls SW2, in either TM<br>3.) Controls reset of TM clockset flip flops, in TM1<br>4.) Selects source for M1/RD/TOUT output, in TM2.<br>5.) Controls part number register, in TM2 |
| (DONE)/TIN | → 4 Function pin<br>1.) Able to go high after power-on-reset<br>2.) Scan test input, in TM1<br>3.) Test code shift register input<br>4.) Prop-delay input, in TM2 |
| (M0/RT)TCLK | → 3 Function pin<br>1.) Clocks TBLKS for scan testing, in TM1<br>2.) Clocks test mode enabling shift register<br>3.) Clocks part number shift register, in TM2 |
| (PWRDN)/USET | → 3 function pin<br>1.) Power down when not in TM1<br>2.) Universal (master) set when in TM1<br>3.) Controls reset of TM clockset flip flops, in TM1 |
| RESET | → 3 function pin<br>1.) Resets CLB & I/O cell flip-flops<br>2.) Resets test mode enabling shift register<br>3.) Resets test mode flip flop, in TM1 |

TEST MODE 1 TIMING (TM1)

Figure 14A:
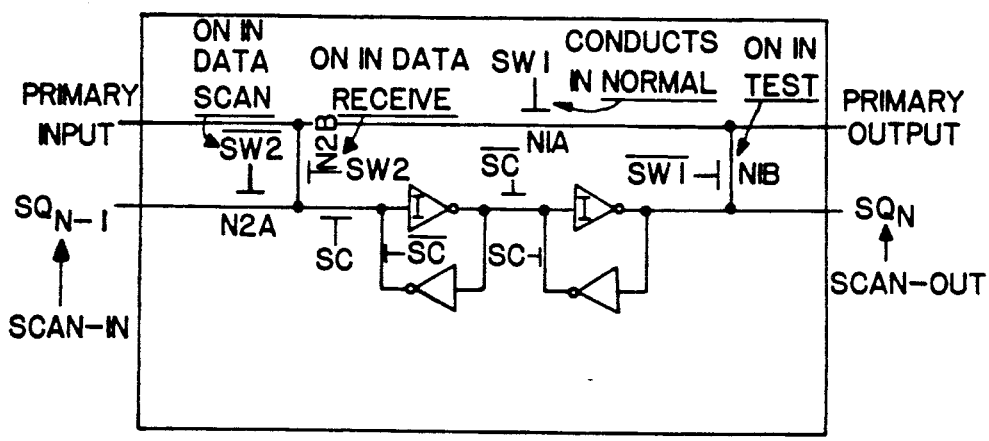
FIG. 14A a schematic of a test block circuit.
Figure 14B:
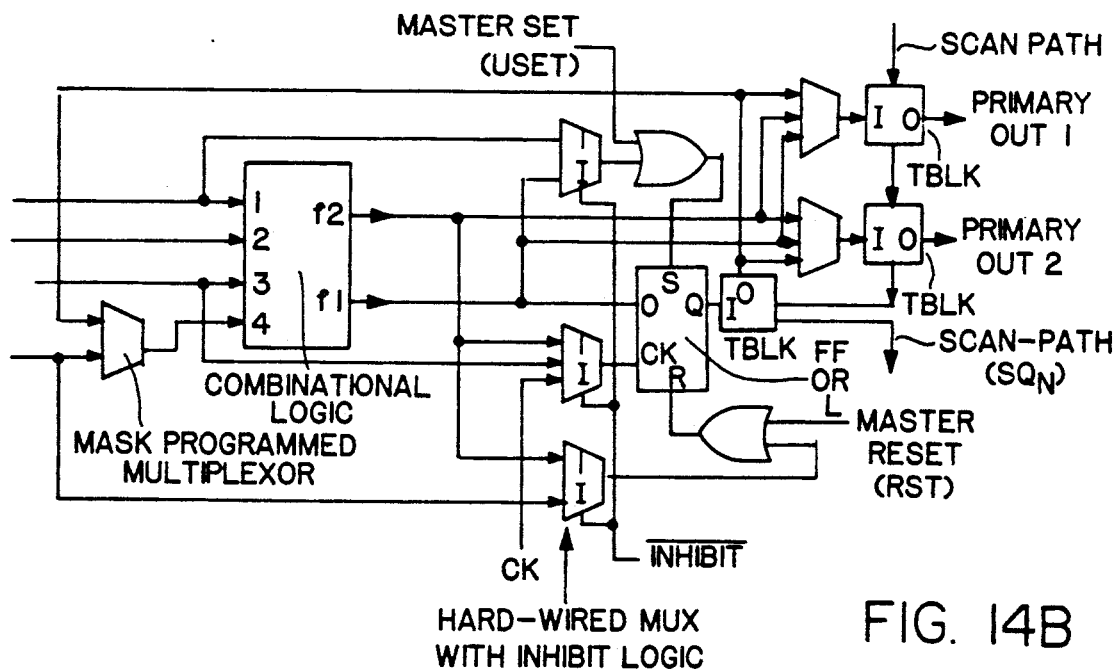
FIG. 14B is a schematic of one configurable logic block (CLB) to be used on a chip incorporating a plurality of such CLB's.
Figure 14C:
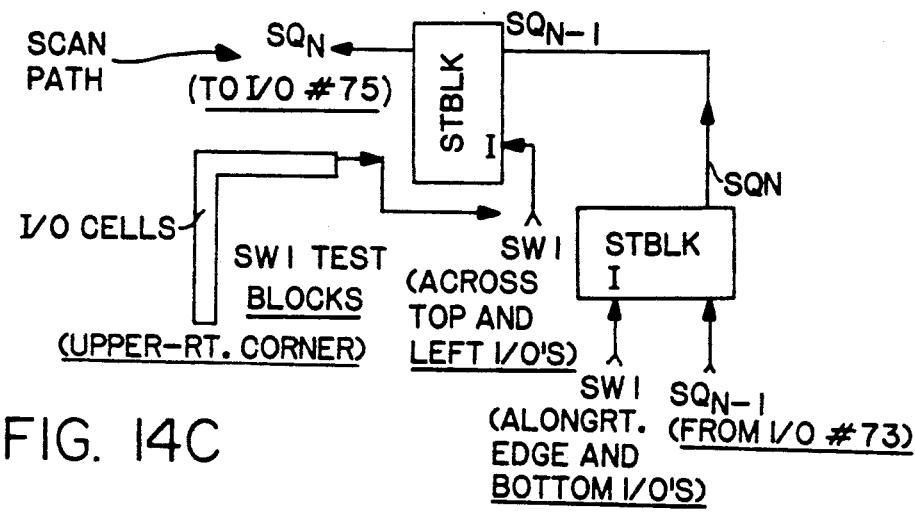
FIG. 14C is a schematic of an upper right corner circuit receiving distal ends of two SW1 subbranches.

Test mode control logic, for both of test modes TM1 and TM2, is shown in FIGS. 11-1 through 11-3. Test Mode 1 is the test mode that controls the scan test signals. Signal line SW1 puts the TBLKS into test mode. Signal line SW2 puts the TBLKS into either scan mode or data receive mode (FIG. 14A).

In order to get into the first test mode TM1, key data must be clocked into the test-mode enabling shift register (the nine FF2 flip flops in a row shown in FIGS. 11-1 through 11-3). A 010100110 key word (see timing diagram FIG. 12) must be clocked into the test-mode enabling register. RESET must be held low and CCLK/TSW must be held low during the whole time that the key data is clocked into the register. If at any time RESET is brought high or CCLK/TSW is brought high the test-mode enabling shift register will be reset. The key data is introduced on the DONE/TIN (scan-in) pad. The scan clock is introduced on the M0/RT/TCLK pad. Key data is clocked into the enabling register on the falling edges of the scan clock signal. After the correct key data has been clocked into the enabling register, the key data is decoded. On the next falling edge of the scan clock, [1] (square-bracketed numerals indicate timing points, see FIG. 12) the TM1 clockset flip-flop is set to output a high (H). The SW1 line goes low when test-mode TM1 is enabled. This puts the test blocks TBLKS in test mode.

Figures 1, 17:
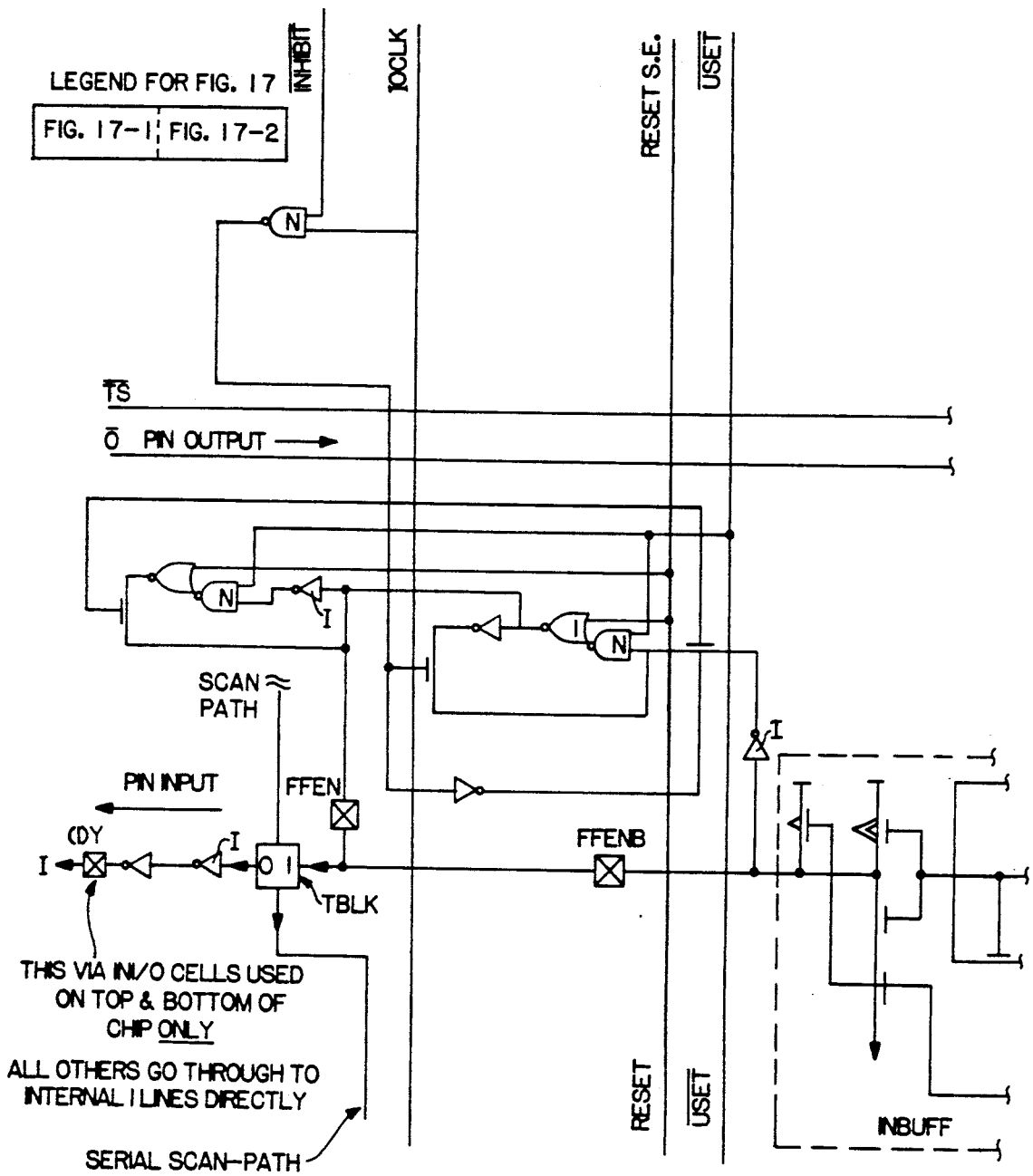
Figures 2, 17:
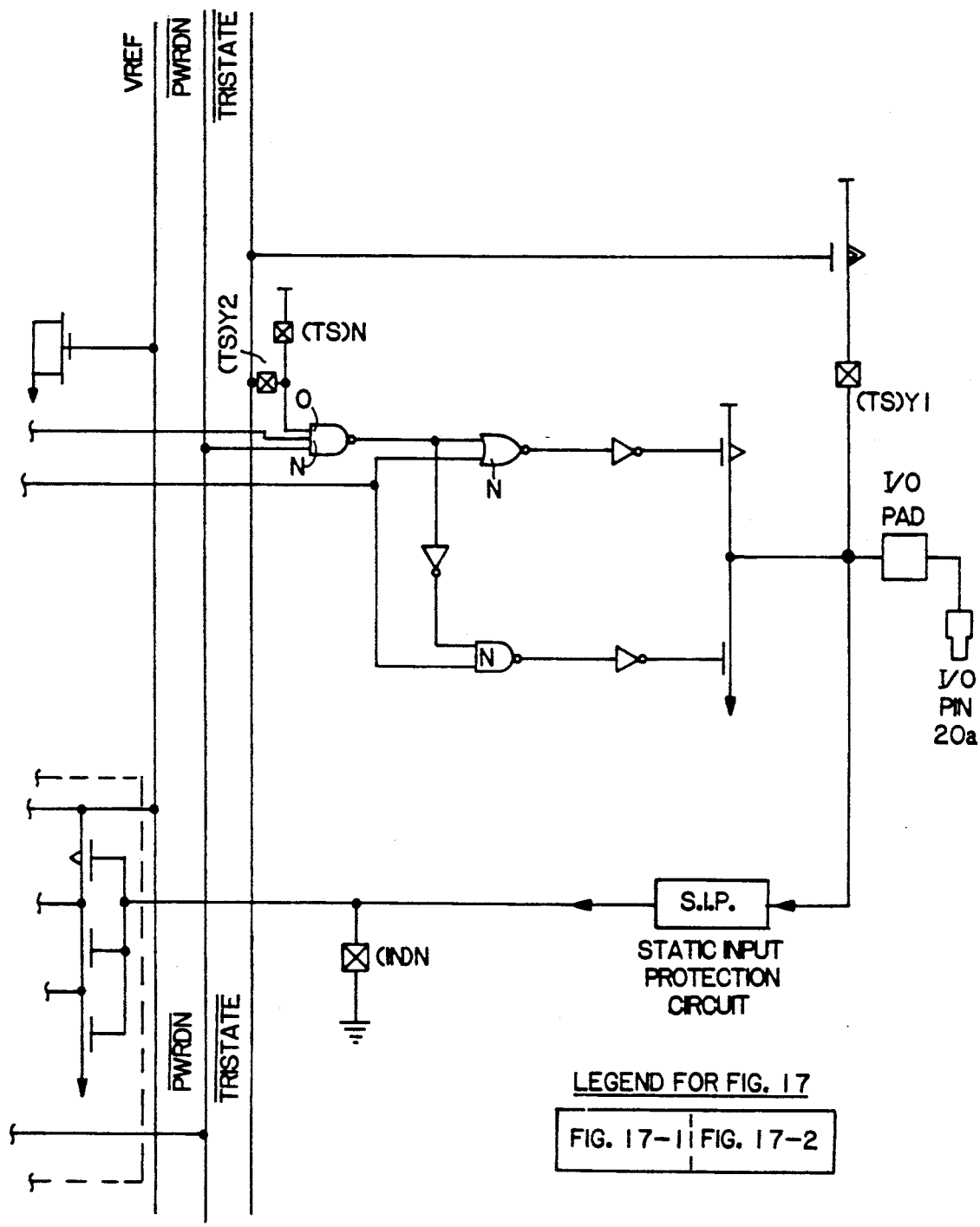
Figures 1, 18A:
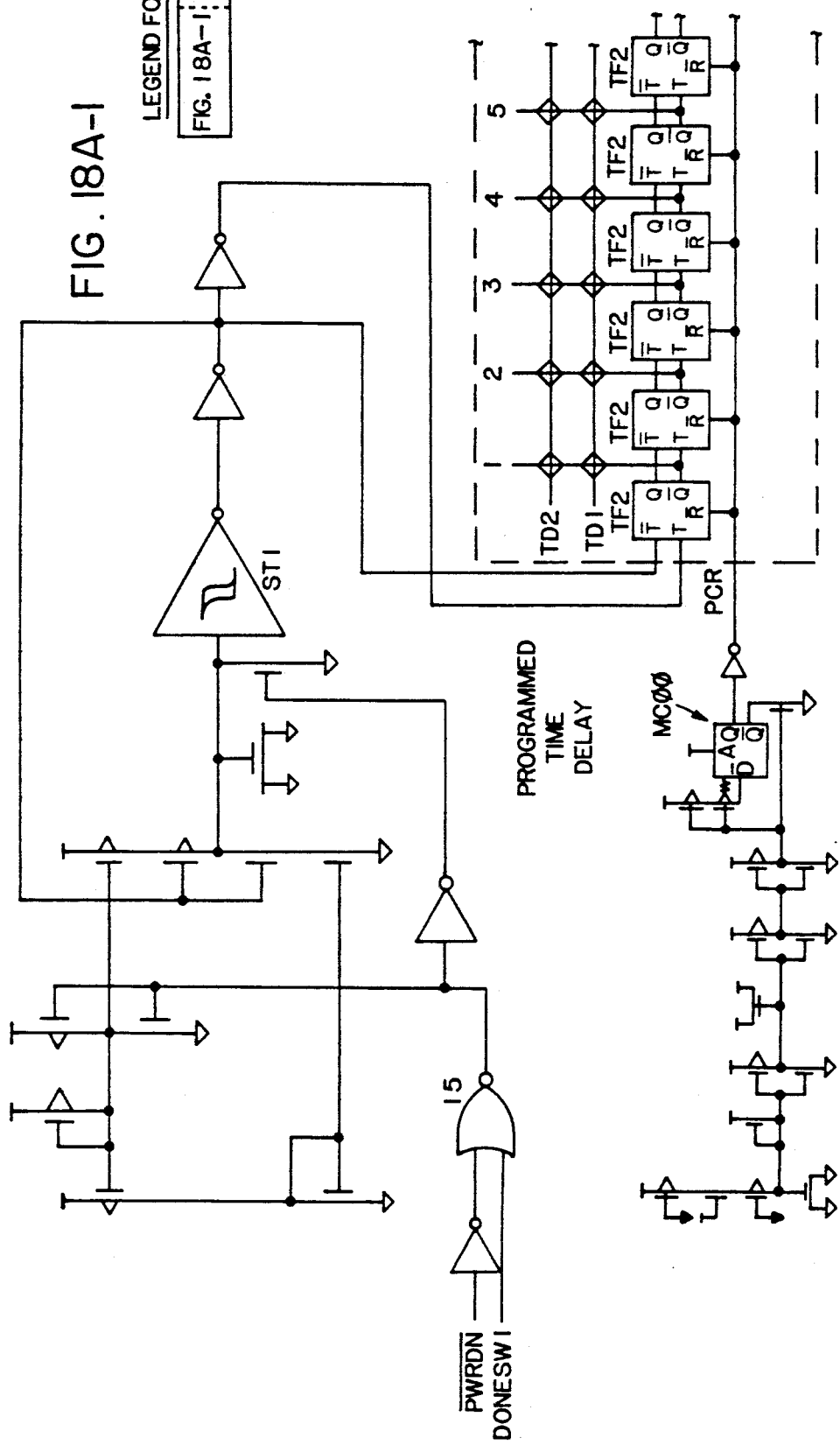
Figures 2, 18A:
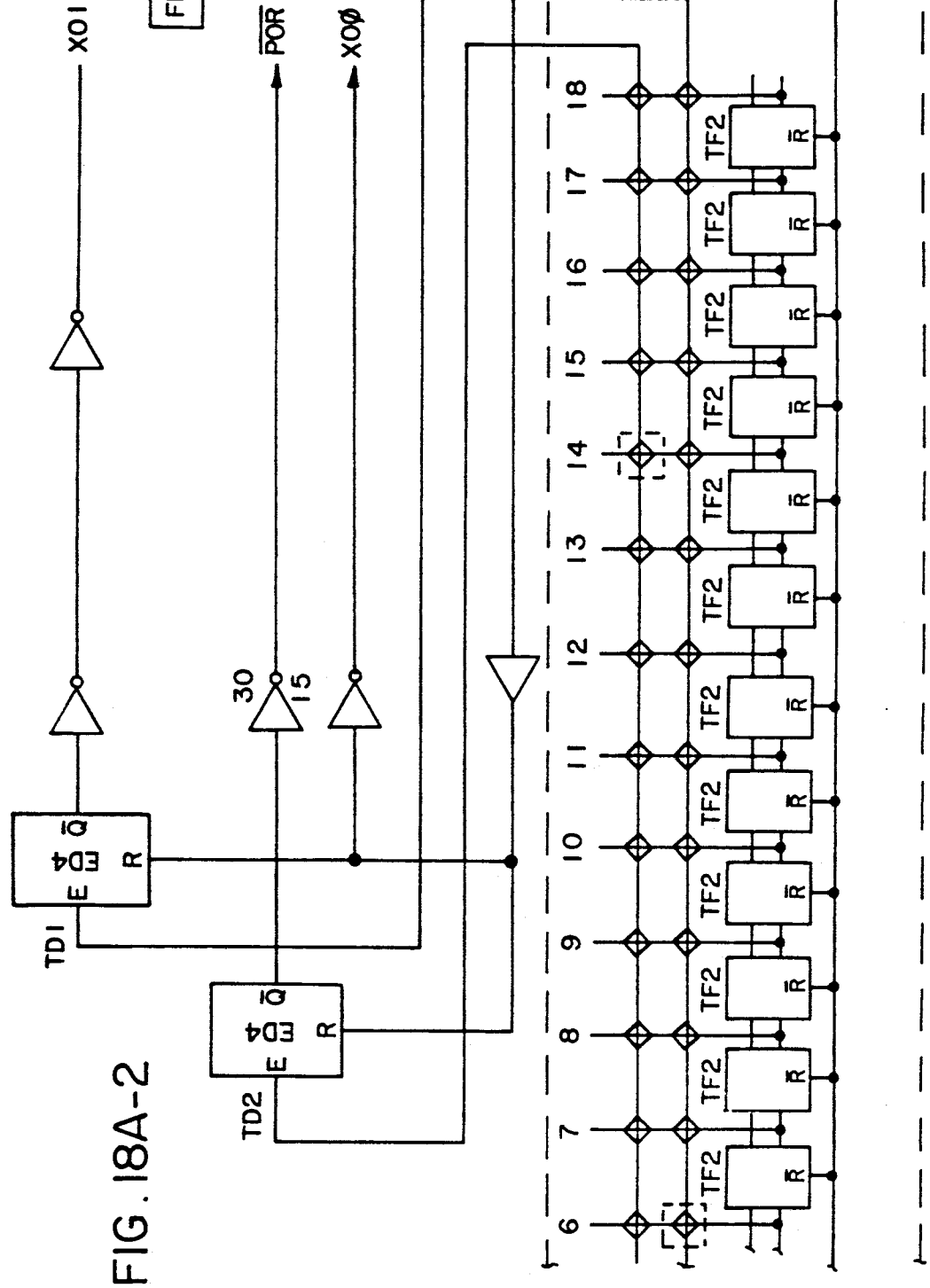
Figure 19:
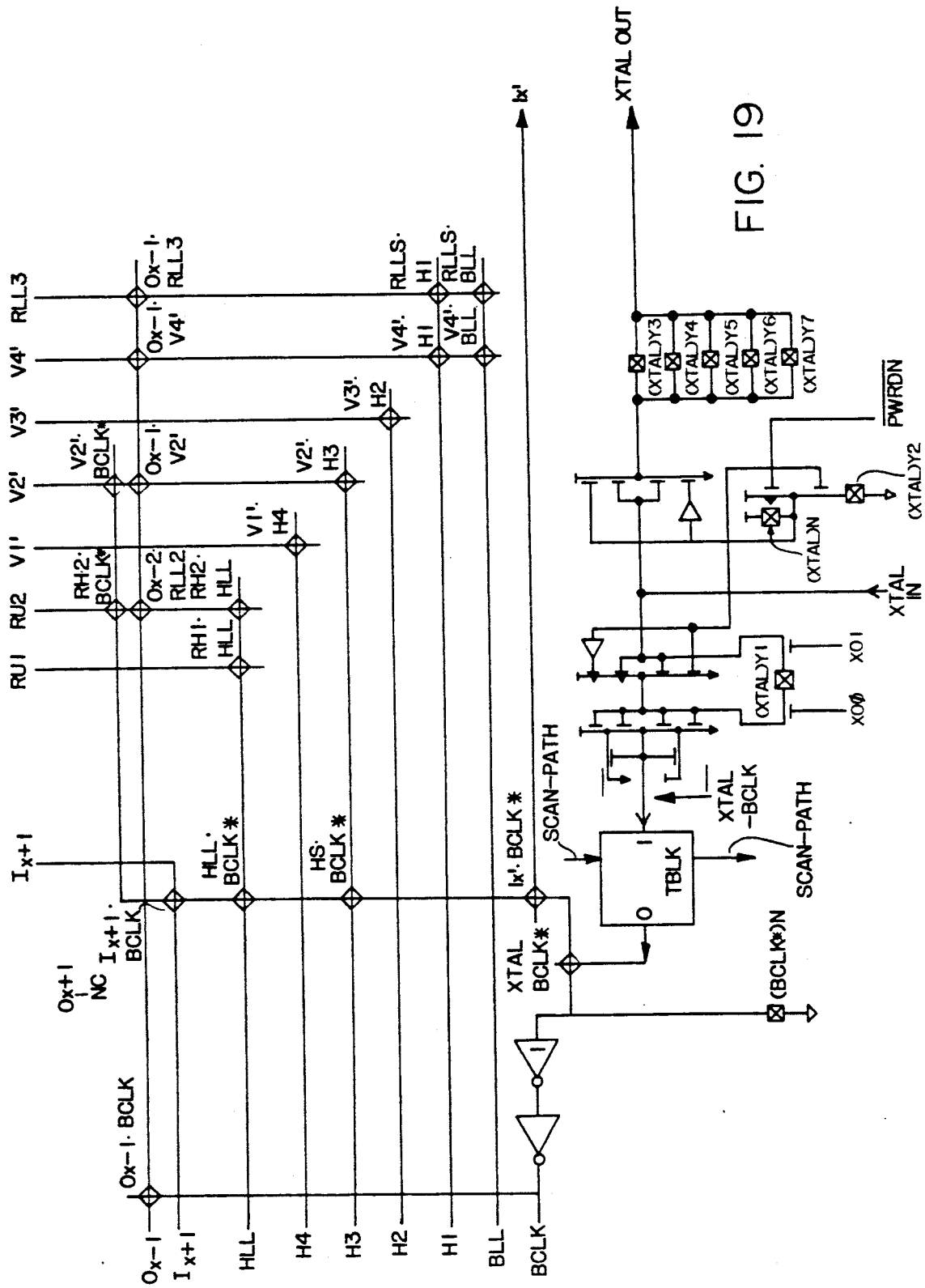
FIG. 19 is schematic of a bottom right interchange circuit.
Figures 3, 20:
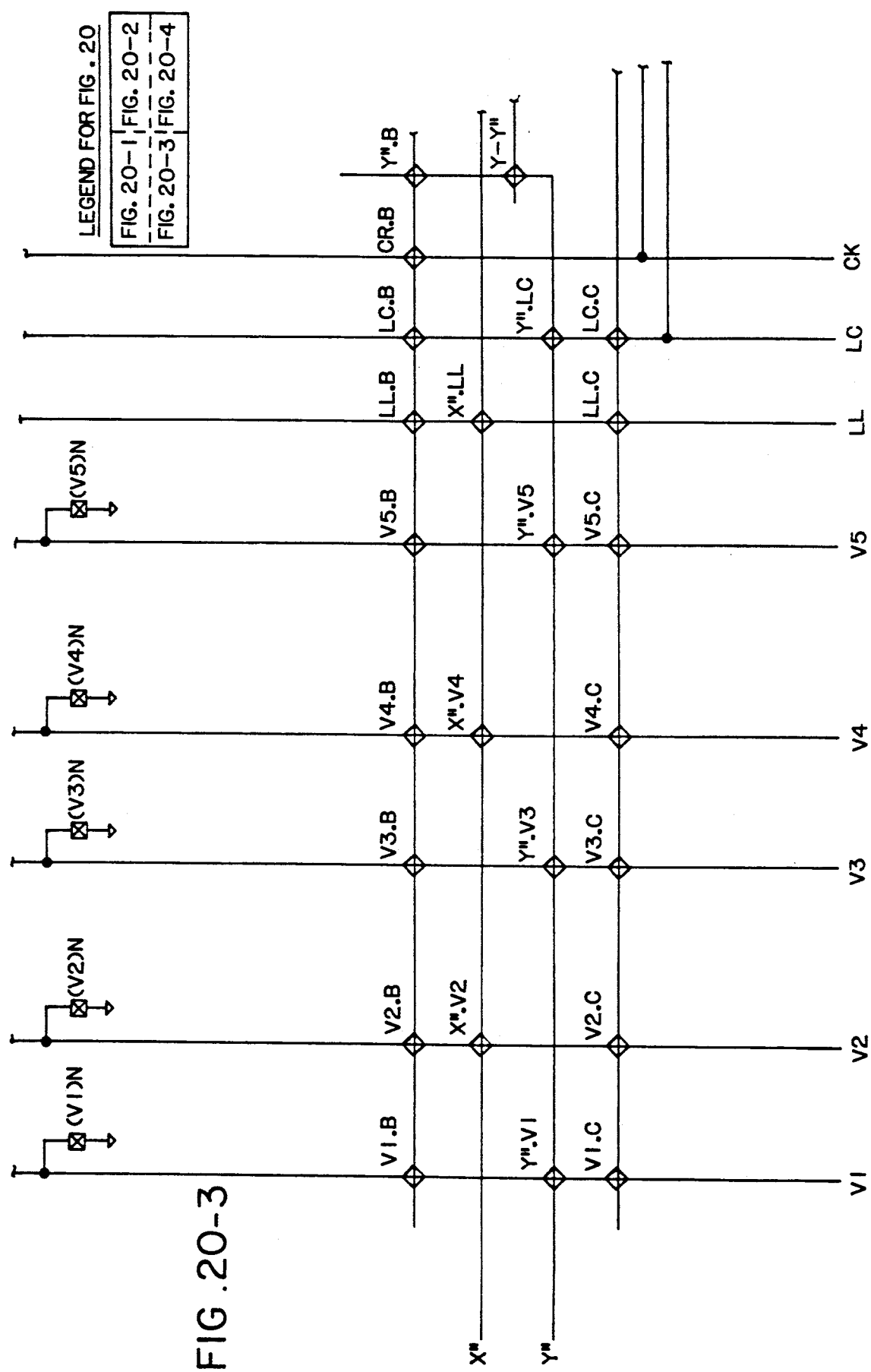
Figures 4, 20:
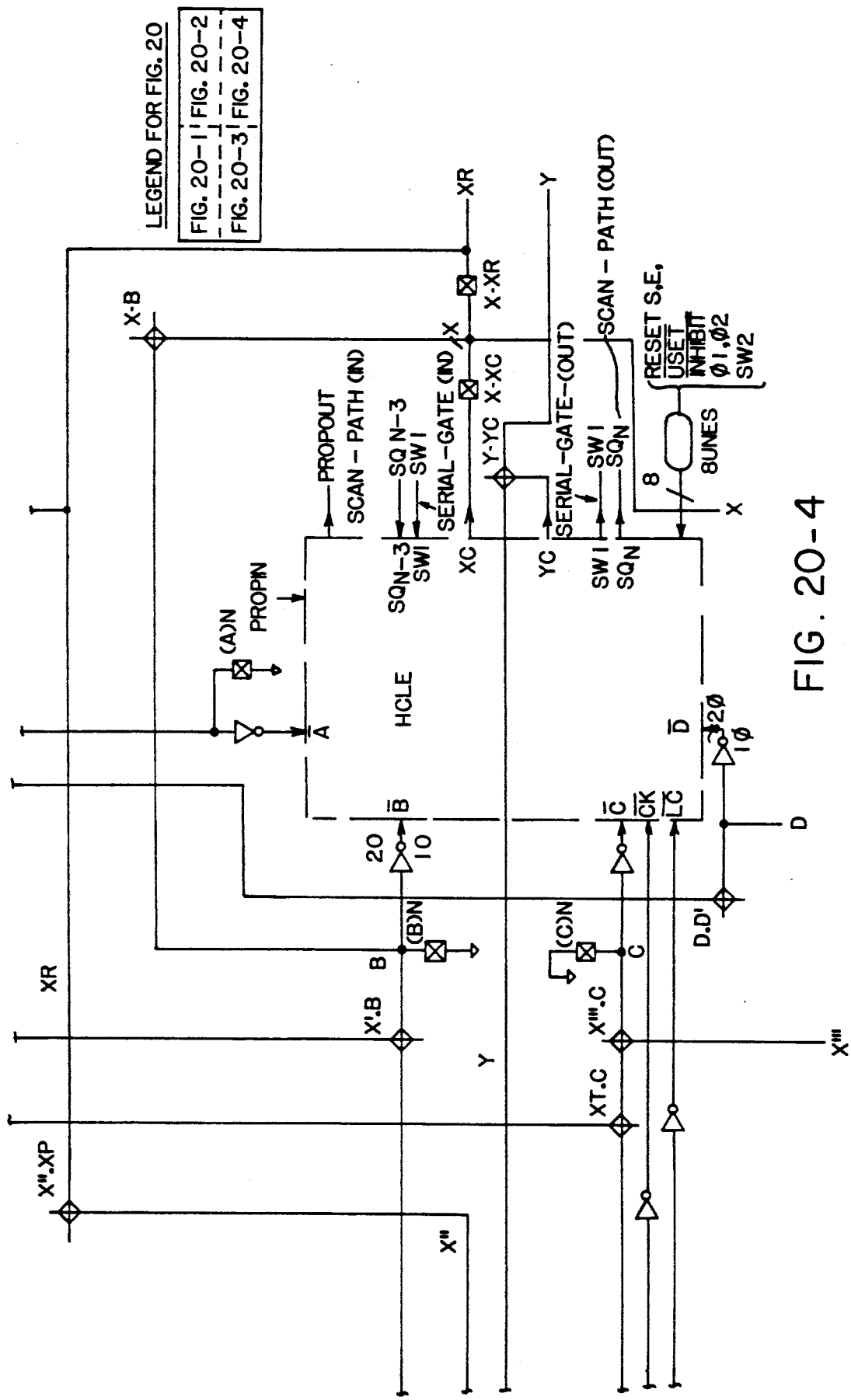
Figures 2, 21:
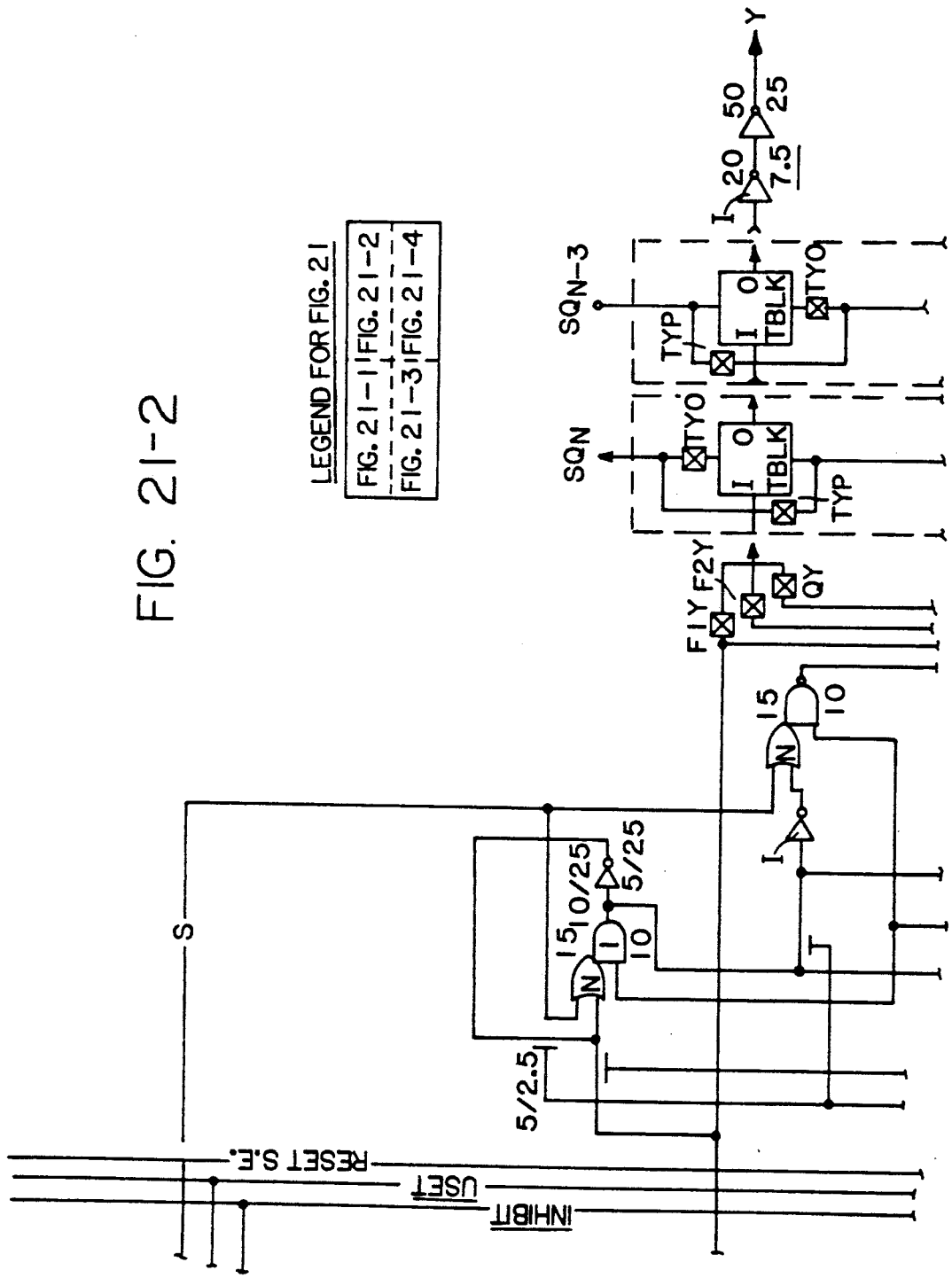
Figures 3, 21:
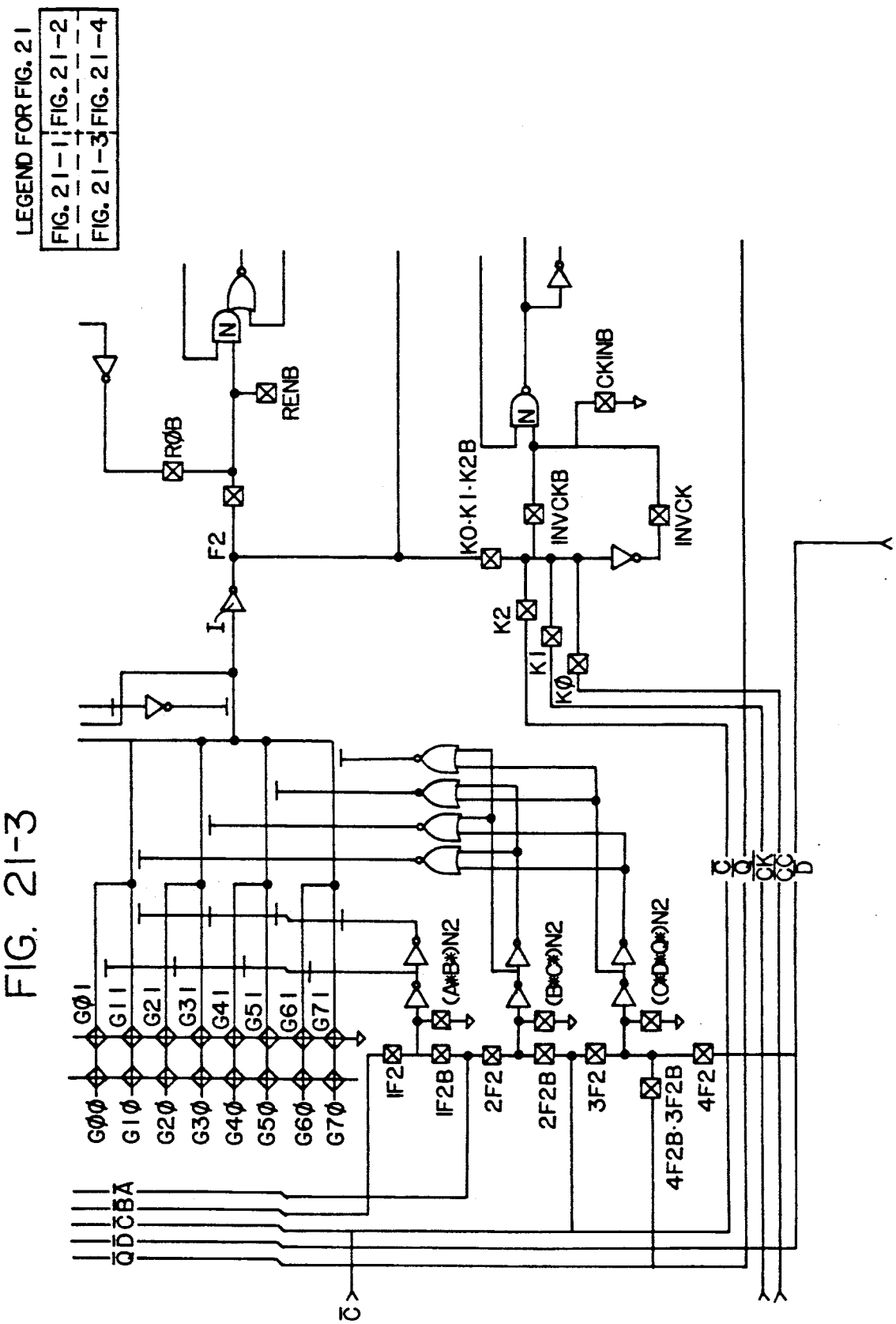

The CCLK/TSW line controls and is the opposite polarity of the SW2 line, in either of test modes, TM1 and TM2 and opposite of INHIBIT when in TM1. INHIBIT is disabled (high) when not in TM1. When CCLK/TSW goes low [4], INHIBIT will go high and SW2 will go high, putting the TBLKS in the data-receive mode. INHIBIT is used to optionally block locally-generated SET and RESET commands to the S and R input lines of flip flops in the individual hard-wired CLB's (FIG. 14B) and I/O cells (FIGS. 17-1 and 17-2).

When CCLK/TSW goes high [6], and the circuit is still in TM1, then SW2 and INHIBIT go low. This puts the TBLKS in Scan In/Out mode. It also inhibits the registered-output flip-flops in all CLBs and in all I/O cells from being reset, set or clocked by any combinational logic output. Master Set (USET) and Master Reset (RESET) are not blocked by INHIBIT (see FIG. 14B).

It should be noted that the M1/RD/TOUT line is tristated when not in any test mode. When in test mode TM1, the M1/RD/TOUT line serves as the scan output. The DONE/TIN pin is always connected to Scan-In. The M0/RT/TCLK pin is always connected to the test mode enabling shift register, the TBLKS, and the part number shift register (FIG. 16C); and is used for clocking all elements on the falling edge of the test clock (TCLK) signal.

Since the DONE/TIN pin is used both to input the TM enabling code (key word) and to scan in test-vector data during scan testing, test mode TM1 was made the dominate mode over TM2. The same test mode activating pins are used for TM1 and TM2 thereby minimizing the pin count for performing tests. When the part is in the TM1 mode, the output of the M1/RD/TOUT pin is always the output from the scan-out register. Even if the enabling code to set TM2 happens to occur during scan-in, the TM1 signal still controls the function of the M1/RD/TOUT pin. And when test mode is reset (by the RTM line), both TM1 and TM2 are reset.

The first thing to test when entering TM1 should be the continuity of the SW1 lines. At the bottom of every column of TBLKs within the chip is a "Special-TBLK" (STBLK) which is dedicated to testing the continuity of the SW1 signals for the "normal-TBLKS" above it. The upper right corner of the chip also has two STBLKs (FIG. 14C) that test separate SW1 branch lines of arrays of I/O cells (FIGS. 17-1 and 17-2) extended along edges of the chip. Since each STBLK is at the end of a long SW1 branch line, any break in the SW1 branch line, on its way through the normal TBLK's will be detected at the associated STBLK as an erroneous logic level.

When the SW2 line is high (H), the SW1 signal is clocked into the STBLKS, in data receive mode. When the SW2 line is low (L) the STBLKS are connected to the SQN scan shift lines along with the rest of the TBLK's to scan the SW1 test values out to the TOUT pin. Right after the TM1 clockset flip-flop is set [1] the CCLK/TSW line goes high [2](bringing SW2 low), locking the new SW1=0 (low) value out of and storing the old SW1=1 signals into the STBLK's through the data receive mode. The following clock cycles bring the STBLK values to the M1/RD/TOUT pin. For an 8-CLB-by-8 CLB Hard Wire chip, clock cycles (37, 38, 77, 126, 127, 162, 163, 212, 213, 262, 263, 298) after the CCLK/TSW high edge, should be checked at the output pad M1/RD/TOUT. For the 10-by-10 CLB chip, clock cycles (37, 38, 77, 138, 139, 200, 201, 262, 263, 324, 325, 386) after the CCLK/TSW high edge, should be checked for their STBLK SW1 test values. The timing diagram (FIG. 12to [3]) shows part of the sequence, including the shifted STBLK data at the M1/RD/TOUT pad.

It is very important to show that all TBLKs receive a high SW1 value when not in TM1, to prove that the chip can operate properly under normal mode. The scan sequence is repeated again during TM1, when SW1 is low, to prove that all TBLKs can be put into test mode. A low CCLK/TSW pulse [4] and a M0/RT/TCLK pulse [5] are given to draw the low SW1 values into the STBLK's. A foreshortened version of the subsequent clocking and M1/RD/TOUT pad reaction is shown after [6] in FIG. 12. Note that the DONE/TIN line goes high [2] before the previous TBLK scan sequence in order to fill all TBLKs with high values by the end of scan shifting. This assures the integrity of the low SW1 values stored in the STBLKs during TM1.

After these two SW1 continuity checks, scan testing of the UCI-LCA configuration versus MLCC configuration can resume. Test vector input data is loaded into the TBLK's in scan mode to probe functions of the hard-wired CLB's and hard-wired I/O cells as specified by a user-provided configuration file. Their reaction (or misreaction) to the test vector input data is read into the TBLK's in data receive mode and deciphered at the M1/RD/TOUT pad.

Figure 15:
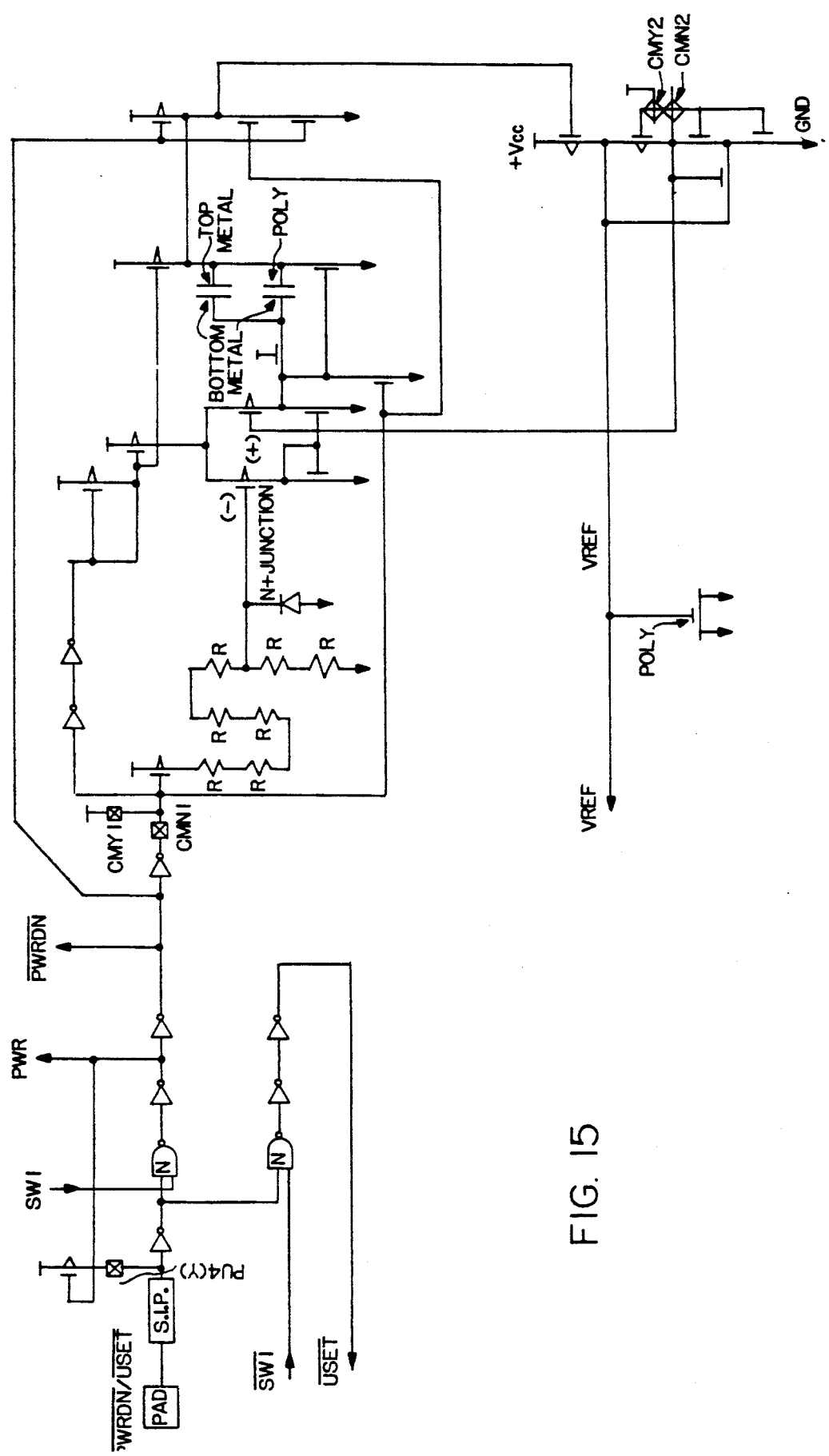
FIG. 15 is a schematic of an upper left corner circuit including a PWRDN/U-SET pad.
Figure 16A:
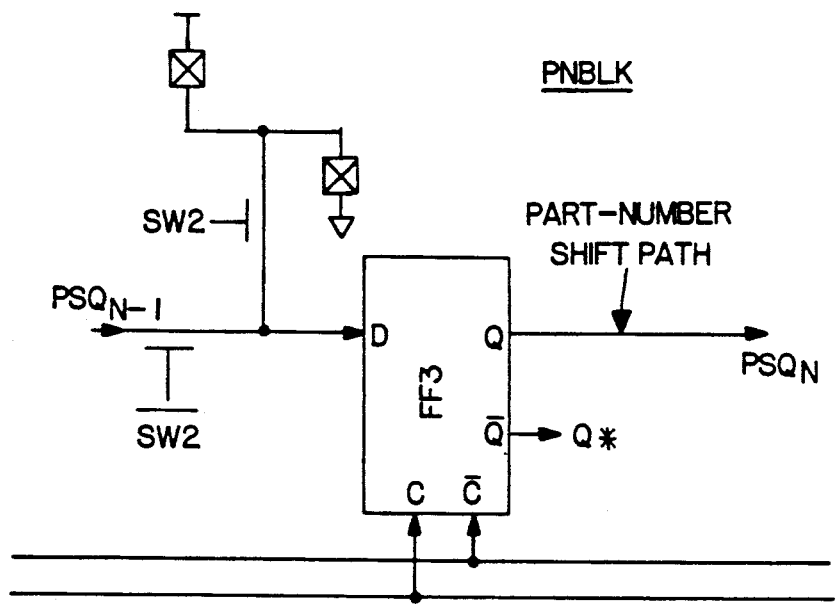
FIG. 16A is a schematic of a part number block circuit.
Figure 16B:
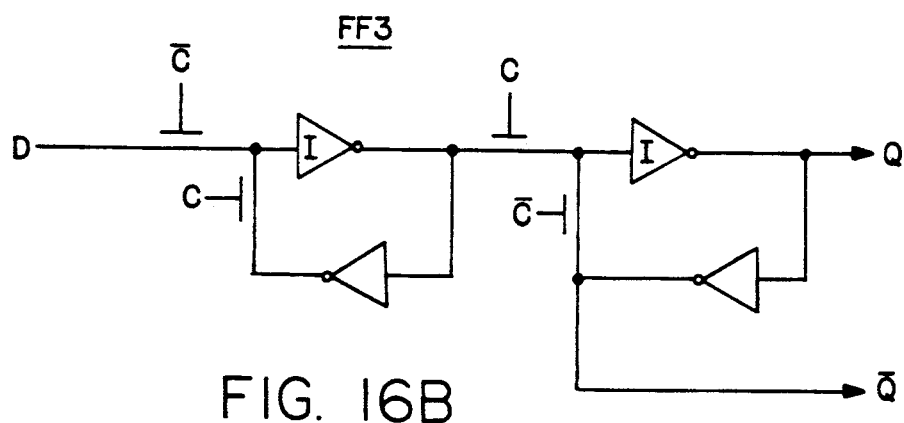
FIG. 16B is a schematic of a flip flop used in the PNBLK of FIG. 16A.
Figure 16C:
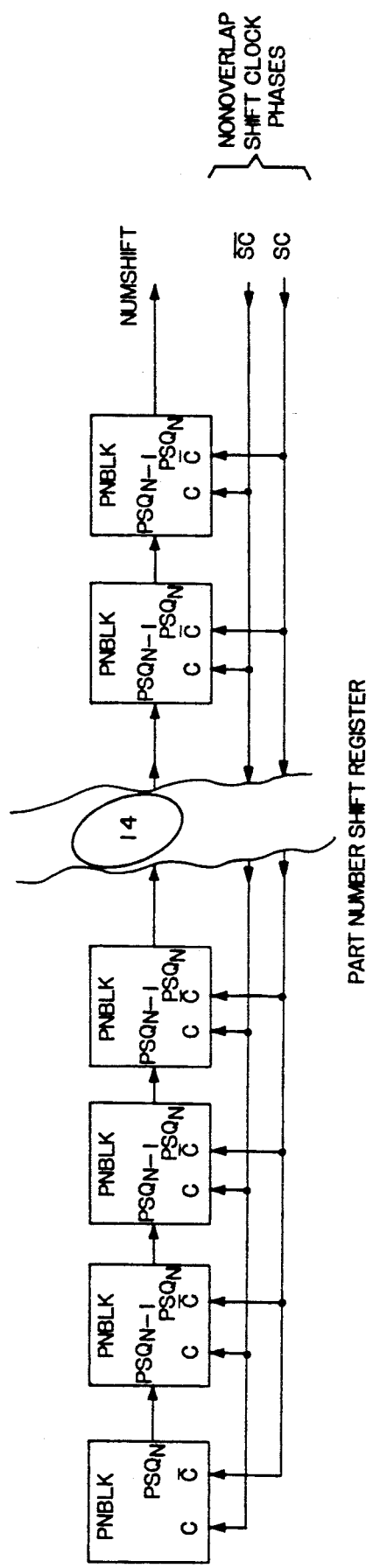
FIG. 16C is a schematic of a part number shift register incorporating a plurality of PNBLK's such as shown in FIG. 16A.

Another function of TM1 (when SW1=0) is to dedicate the PWRDN/USET pad to the Master Set function (USET) (FIG. 15). (PWRDN) is disabled, high). When USET is brought low [7] the flip-flops in all CLBs and in all I/O cells are set, regardless of the state of INHIBIT. When USET is high, no matter what the values of RESET and CCLK/TSW, the TM1 mode can not be exited. RESET and CCLK/TSW can go high [2], resetting the test code receiving shift register, but they can not reset the TM1 clockset flip-flop. The exit condition from test mode TM1 is $\overline{\text{USET}}=0$, $\overline{\text{RESET}}=0$, CCLK/TSW=1. When this is met both of the TM clockset flip flops (TM1 and TM2) are reset, the test modes are then exited, and normal chip operation can be resumed. Since $\overline{\text{USET}}$ is stuck high in TM2, you can only exit the test modes by first going back into TM1.

If both $\overline{\text{RESET}}$ and $\overline{\text{USET}}$ are low during TM1, $\overline{\text{RESET}}$ will override $\overline{\text{USET}}$ and reset all the CLB and I/O flip-flops [8]. However this should only occur during the TM exit condition.

Finally, the exit condition from the test modes is shown at [9] in FIG. 12. Note that $\overline{\text{INHIBIT}}$ defaults back to being disabled (High). Also M1/RD/TOUT goes back into a high-impedance tristate condition. The normal high states of $\overline{\text{RESET}}$ and CCLK/TSW are shown after the test modes are exited [10]. Since both must be low to enter either of test modes TM1 and TM2, their normal high state, in addition to the 9 bit wide test enabling (key) code at DONE/TIN, makes it almost impossible to accidentally fall into test mode during normal chip operation.

TEST MODE 2 TIMING (TM2)

Test Mode 2 is the test mode that controls a part number shift register (FIG. 16c) and a propagation delay testing string of inverters provided on the chip (not shown) to snake through all the CLB's in serpentine fashion. Signal SW2 controls the flip-flops in the part number shift register to either receive the part number from the H or L establishing, programmable vias (symbolized as squares with an "x" inside) or put the register in shift mode (FIGS. 16A-C) to shift out the loaded part number. SW2 also controls the output of M1/RD/TOUT (FIG. 1). When SW2 is high the part number shift register is in receive mode and the output at the M1/RD/TOUT pin is from the propagation delay (prop-delay) testing string. When SW2 is low the shift register is in shift mode and the output at MI/RD/T-OUT is from the part number shift register. Signal CCLK/TSW is the opposite polarity of SW2.

Figure 13:
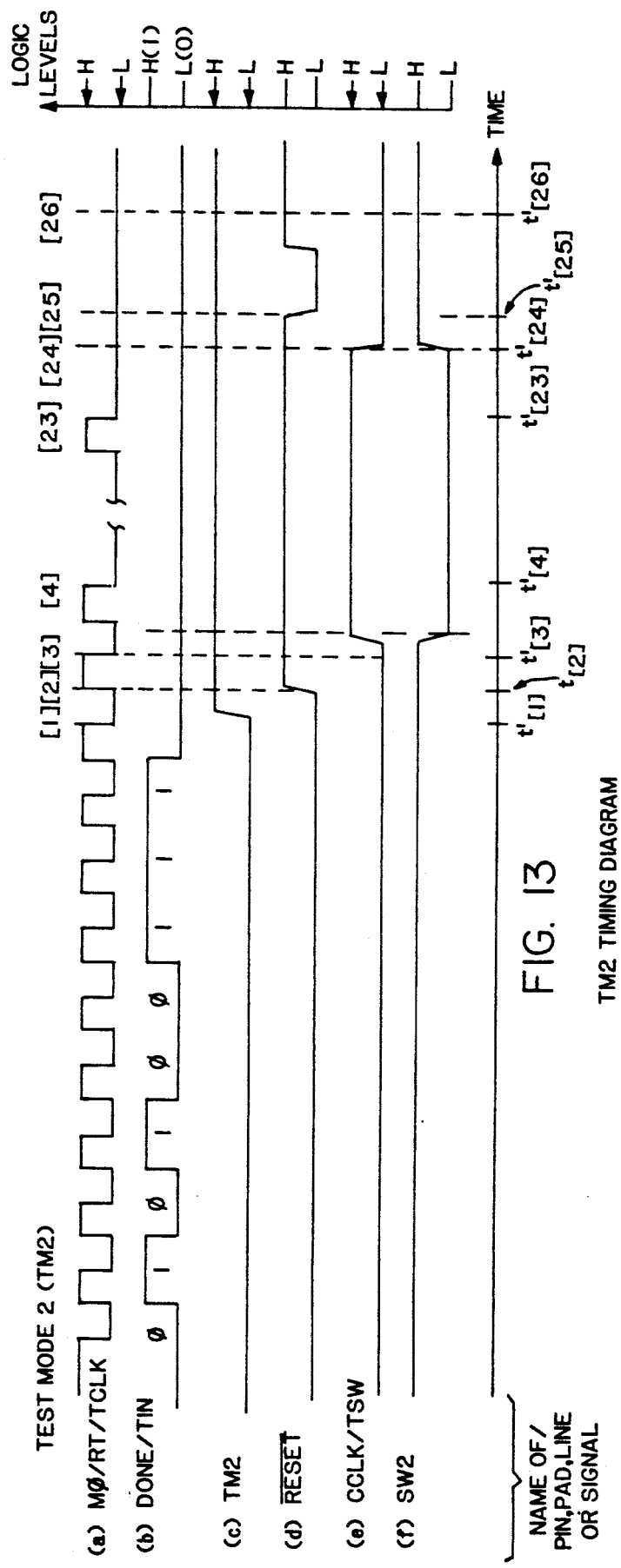
FIG. 13 is a second timing diagram for explaining the operation of the circuit shown in FIG. 11.

In order to get into TM2, mode-enabling key data must be clocked into the test mode enabling shift register. A 10100111 (see timing diagram) must be clocked into the TM enabling register. The timing diagram for TM2 is shown in FIG. 13. TM2 goes high [1] on the falling edge of the clock, after the decoding has had time to settle. As explained before, $\overline{\text{RESET}}$ & CCLK/TSW control the reset of the TM-enabling shift register. Once the TM2 clockset flip-flop has been set, $\overline{\text{RESET}}$ or CCLK/TSW can go high, resetting the TM register [2]. However, during input of the TM2 code, $\overline{\text{RESET}}$ and CCLK/TSW must be held low.

Since SW1 is high in TM2, the $\overline{\text{PWRDN}}/\overline{\text{USET}}$ pad controls $\overline{\text{PWRDN}}$, while $\overline{\text{USET}}$ is disabled high (FIG. 15). Therefore no matter what the values of $\overline{\text{RESET}}$ and CCLK/TSW, the exit condition from the test modes can not be achieved. As explained, the test modes can only be exited and normal mode reentered after TM1 is entered.

When SW2 is high the part number shift register is in data receive mode. On the next falling edge of the clock [3], the part number will be clocked into the part number blocks PNBLK of the part number shift register. CCLK/TSW should be brought high [3½] before the next falling edge of the clock [4, putting the part number shift register in shift mode and connecting the part number shift register to M1/RD/TOUT output pad. At this time the most significant bit of the part number can be read at the M1/RD/TOUT pin. At the next 19 falling edges of the clock the remaining bits of the 20 bit wide part number can be read.

When SW2 is brought high, a change on the DONE/TIN line reflects a propagation delayed change on the M1/RD/TOUT [24]. $\overline{\text{RESET}}$ low resets all CLB and I/O storage elements, as in TM1 [25].

The TM2 signal functions to untristate the M1/RD/TOUT pad, enabling the TOUT pin to function as an active output. The part remains in TM2 [26] until the key code for TM1 is entered (see FIG. 12). Then, since TM1 is the dominant mode, the high value of the TM2 signal does not matter.

PSEUDO-CONFIGURATION MODE (PCM)

If a Hardwired LCA (HLCA) is placed in a daisy chain with softwired devices, the hardwired device should be able to emulate a softwired device during a daisy-chained configuration operation even though the HLCA does not require configuration itself. Therefore, during a daisy-chained configuration operation the configuration data bitstream must be passed through the HLCA on to subsequent devices as if it were passing through a soft-wirable device, without altering the bitstream contents or sequence in time of the configuration bits.

To accomplish this a number of things are done. An oscillating timer is set to pull $\overline{\text{POR}}$ high only after a mask programmable amount of time has elapsed (i.e., either 64 us of 15 ms). This programmed time is chosen to closely match the configuration time of a softwired part. After $\overline{\text{POR}}$ goes high the DONE pin is pulled weakly to a passive high (if the via to its pullup transistor is accordingly programmed-see FIGS. 11-1 through 11-3) if no softwired parts connected to that pin pull it to an active low. $\overline{\text{TRISTATE}}$ is held low when SW1=1 and $\overline{\text{DONET}}=1$ (FIGS. 11-1 through 11-3). This tristates and applies a passive pullup to the outputs of all but three pins. Thus three pins (see FIG. 14D), as explained below, are not tristated if chosen for specific PCM functions. Thus the other pins of the HLCA, regardless of how configured, cannot interfere with connected pins of softwired parts that are being configured. It is only after $\overline{\text{DONET}}$ goes low that the HLCA can actively drive those of its pins which are configured to act as output pins.

Figure 14D:
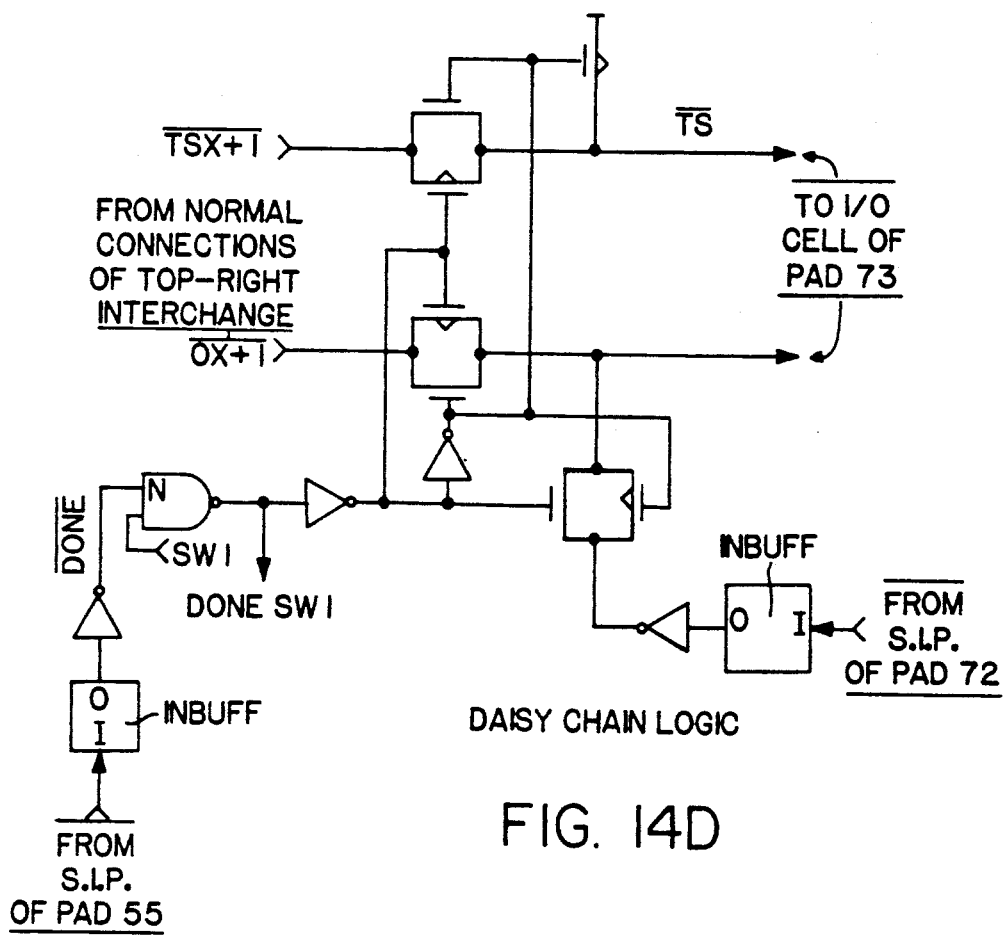
FIG. 14D is a schematic of a daisy chaining circuit for serially coupling a configurable chip (MLCC) to similar chips.

The three un-tristated pins have special functions during the PCM (pseudo-configuration mode). One is configuration-data output DOUT, Pin 73 (FIG. 14D). DOUT is connected by ay of transistor gates directly to the input of DIN (Pin 72), configuration-data input. This assures that the configuration bitstream is passed directly on to configure other devices in the daisy-chain. As shown in FIG. 14D, this is accomplished by wedging transmission-gate controlling logic between the top right edge and Pin 73. When DONE goes high, Pin 73 operates as configured. The other two un-tristated pins are HDC (High During Configuration Pin 34) and LDC (Low During Configuration Pin 36) which are pulled high and low (respectively) by SWDONE during PCM. These three output pins (P73, P34, P36) operate as described at the option of the HLCA customer. They are tristated like the rest of the pins when not specifically chosen to perform the daisy chaining operation.

The DONESW1 signal (FIG. 14D) shuts off the oscillating timer (not shown) after DONE goes high.

When $\overline{\text{PWRDN}}$ goes low all pins are disabled from functioning as an input or output and $\overline{\text{TRISTATE}}$ is pulled high to turn off pullups; making the chip appear completely dead to the outside world (FIG. 11). $\overline{\text{IN HIBIT}}$ going low pulls $\overline{\text{TRISTATE}}$ low to eliminate noise during TM1 scan testing.

Finally, since the DONE/TIN line toggles during scan testing, the SW1=0 (low setting) insures that $\overline{\text{DONET}}$ can't tristate the outputs or place pins 73, 34 or 36 into PCM mode. Therefore while in TM1 all pins are connected as configured for normal operation.

Numerous modifications and variations will become apparent to those skilled in the art once the above disclosure is fully appreciated. It is to be understood that the above detailed description of the preferred embodiments is intended to be merely illustrative of the spirit and scope of the invention and should not be taken in a limiting sense. The scope of the claimed invention is better defined by reference to the following claims.

I claim:

1. A mask-configured integrated circuit chip to be substituted for a user configured integrated circuit chip, the user configured integrated circuit chip having plural pass transistors each characterized by a first signal transmission delay, the mask-configured integrated circuit chip being pin compatible with the user configured integrated circuit chip and comprising:
   plural mask-configured routing lines for routing signals previously routed by the pass transistors of the user configured integrated circuit chip, each of the mask-configured routing lines being characterized by one or more segments having second signal transmission delays approximately equal, within an order of magnitude, to the first signal transmission delay.

2. A mask-configured integrated circuit chip according to claim 1 further comprising a layer of programmably includable shorting conductors for shorting predetermined segments of the mask-configured routing lines.

3. A mask-configured integrated circuit chip according to claim 2 further including first and second metal layers, wherein the shorting conductors are vertical vias interposed between the first and second metal layers.

4. A mask-configured integrated circuit chip according to claim 1 wherein the mask-configured routing lines include resistive polysilicon segments.

5. A mask-configured integrated circuit chip according to claim 1 wherein said second signal transmission delays are greater than or equal to approximately one-third of their corresponding first signal transmission delays.

6. A mask-configured integrated circuit chip according to claim 1 wherein the routing lines include U-shaped polysilicon segments.

7. A mask-configured integrated circuit chip according to claim 1 further comprising:
   first and second logic function blocks each having input and output terminals that are interconnected by way of said mask-configured routing lines; and
   a scan test block coupled to an output terminal of the first logic function block and coupled to an input terminal of the second logic function block.

8. A mask-configured integrated circuit for replacing an user configured integrated circuit, the original integrated circuit having logic blocks interconnected by turned-ON transistors, the turned-ON transistors each having an associated first signal propagation time, the mask-configured integrated circuit comprising:
   plural mask-configured routing lines for routing signals previously routed by the turned-ON transistors of the user configured integrated circuit, each of the mask-configured routing lines being characterized by one or more segments each having a second signal propagation time approximately equal, within an order of magnitude, to said first signal propagation time.

9. A mask configured integrated circuit as in claim 8 in which the mask configured routing lines are formed of resistive material.

10. A mask configured integrated circuit as in claim 9 in which the resistive material includes polysilicon.

11. A mask configured integrated circuit as in claim 9 in which the resistive material further includes metal.

12. A mask configured integrated circuit as in claim 9 in which the resistive material comprises substrate diffused regions.

13. A metal-interconnected integrated circuit chip to be substituted for a pass-transistor-interconnected integrated circuit chip, the latter chip having plural pass transistors each characterized by a first signal transmission delay, the metal-interconnected integrated circuit chip being pin compatible with the latter chip and comprising:
   plural resistive routing lines for routing signals previously routed by the pass transistors of the latter chip, each of the resistive routing lines being characterized by one or more segments having second signal transmission delays approximately equal, within an order of magnitude, to the first signal transmission delay;
   first and second logic function blocks each having input and output terminals; and
   a scan test block having:
   (a) a primary input terminal connected to the output terminal of the first logic function block,
   (b) a primary output terminal connected to the input terminal of the second logic function block,
   (c) a scan-in terminal for receiving scan path signals,
   (d) a scan-out terminal for outputting scan path signals,
   (e) first through fourth signal conducting nodes,
   (f) first switch means for selectively connecting the scan-in terminal to the first signal conducting node,
   (g) digital data storing means, having an input section coupled to the first signal conducting node and an output section coupled to the fourth signal conducting node, the digital data storing means being provided for storing data transmitted through the first signal conducting node and for outputting stored data through the fourth signal conducting node,
   (h) second switch means, integrally formed of the first and second signal conducting nodes, for selectively connecting the first and second signal passing nodes,
   (i) third switch means, integrally formed of the second and third signal conducting nodes, for selectively connecting the second and third signal passing nodes, and
   (j) fourth switch means, integrally formed of the third and fourth signal conducting nodes, for selectively connecting the third and fourth signal passing nodes;

wherein the primary input terminal is coupled to the second signal conducting node, the primary output terminal is coupled to the third signal conducting node, the scan-out terminal is coupled to the fourth signal conducting node.

14. A metal-interconnected chip according to claim 13 further comprising:

first through fourth control lines, operably coupled to the first through fourth witch means respectively, for switching said first through fourth switch means between node-connecting and node-disconnecting states, and continuity testing means, coupled to the scan test block, for testing the continuity of one or more of the first through fourth control lines.

* * * * *

UNITED STATES PATENT AND TRADEMARK OFFICE
CERTIFICATE OF CORRECTION

PATENT NO. : 5,068,603

DATED : November 26, 1991

INVENTOR(S) : John E. Mahoney

It is certified that error appears in the above-identified patent and that said Letters Patent is hereby corrected as shown below:

On cover page, item [56], under References Cited, change "4,293,917" to --4,293,919--.

under "OTHER PUBLICATIONS", first line, change "of Design" to --on Design--.

Col. 7, line 53, change "30" to --13--.

Col. 7, line 66, change "30" to --13--.

Col. 8, line 21, change "a a" to --a--

Col. 9, line 7, change "4,758,958" to --4,758,985--.

Col. 12, line 57, change "N7" to --N8--.

Col. 12, line 59, before "M67", insert --M64--.

Col. 12, line 64, change "T6 and T7" to --T6, T7, and T8--.

Col. 14, line 31, change "216" to --16--.

Col. 16, line 67, change "mask" to --metal--.

Col. 17, line 21, change "$X0a$ to $X0b$" --$X_{0a}$ and $X_{0b}$--.

Col. 17, line 42, change "$X0a$" to --$X_{0a}$--.

Col. 17, lines 55 and 56, change "300a *" to --300a*--.

UNITED STATES PATENT AND TRADEMARK OFFICE
CERTIFICATE OF CORRECTION

PATENT NO. : 5,068,603

DATED : November 26, 1991

INVENTOR(S) : John E. Mahoney

It is certified that error appears in the above-identified patent and that said Letters Patent is hereby corrected as shown below:

Col. 18, line 10, change "$X0a$ to $X0b$" --$X_{0a}$ and $X_{0b}$--.

Col. 18, line 19, change "$X0a$ to $X0b$" --$X_{0a}$ and $X_{0b}$--.

Col. 18, line 23, change "4B-2, ," to --4B-2,--.

Col. 18, lines 26 and 27, change "$X0a$ to $X0b$" --$X_{0a}$ and $X_{0b}$--.

Col. 18, line 29, change "$X0a$ to $X0b$" --$X_{0a}$ and $X_{0b}$--.

Col. 18, line 61, change "X0" to --$X_0$--.

Col. 18, line 63, change "$x_0$" to --x0--.

Col. 19, line 3, change "$X_o$" to --$X_0$--.

Col. 19, line 5, change "$X0a$ to $X0b$" --$X_{0a}$ and $X_{0b}$--.

Col. 19, line 12, change "$STB_a$ and $STB_a$" to --$STB_a$ and $STB_b$--,

Col. 19, line 17, change "STBa" to --$STB_a$--.

Col. 19, line 24, change "$X_o$" to --$X_0$--.

Col. 19, line 26, change "$X_o$" to --$X_0$--.

Col. 19, line 27, change "$X_o$" to --$X_0$--.

UNITED STATES PATENT AND TRADEMARK OFFICE
CERTIFICATE OF CORRECTION

PATENT NO. : 5,068,603
DATED : November 26, 1991
INVENTOR(S) : John E. Mahoney It is certified that error appears in the above-identified patent and that said Letters Patent is hereby corrected as shown below:

Col. 19, line 36, change "STBa" to --$STB_a$--.

Col. 19, line 38, change "$STX_x$" to --$STB_x$--.

Col. 19, line 47, change "L/S" to L/S--.

Col. 19, line 48, change "Xoa" to --$X_{oa}$--.

Col. 19, line 54, change "Xoa" to --$X_{oa}$--.

Col. 19, line 63, change "STB" to --$STB_x$--,

Col. 19, line 68, change "Xoa and Xob" to --$X_{0a}$ and $X_{0b}$--.

Col. 20, line 30, change "$T_{ax+i}$" to --$TB_{x+i}$--.

Col. 20, line 45, change "$T_i$," to --$T_i$;--.

Col. 22, line 8, change "$MCLB_x$" to --$MCLB_x$*--.

Col. 22, line 8, change "p n" to --pin--.

Col. 22, line 57, change "fie)d" to --field--.

Col. 23, line 36, after "low, L)", insert --and--.

Col. 24, line 56, delete "$I_1$".

UNITED STATES PATENT AND TRADEMARK OFFICE
CERTIFICATE OF CORRECTION

PATENT NO. : 5,068,603

DATED : November 26, 1991

INVENTOR(S) : John E. Mahoney

It is certified that error appears in the above-identified patent and that said Letters Patent is hereby corrected as shown below:

Col. 25, line 24, change "$DR_{35}$are" to --$DR_{35}$ are--.

Col. 25, line 52, change "2-e-1" to --20e-1--.

Col. 26, line 7, change "x1" to --X1--.

Col. 26, line 21, change "(X2)" to --$(X_2)$--.

Col. 26, line 48, change "X1 and X2" to --$X_1$ and $X_2$--.

Col. 27, line 14, change "2-e-1 through 2-e-4" to --20e-1 through 20e-4--.

Col. 27, line 32, change "$Q_5$" to --$Q_4$--.

Col. 28, line 21, change "that" to --then--.

Col. 28, line 48, change "$QN_4$" to --$Q_{N4}$--.

Col. 28, line 49, change "If" to --$I_f$--.

Col. 28, line 64, change "$QN_1$" to --$Q_{N1}$--.

Col. 29, line 52, change "$QP_x$" to --$Q_{Px}$--.

Col. 30, line 3, change "$QN_4$" to --$Q_{N4}$--.

Col. 30, line 8, change "$QN_4$" to --$Q_{N4}$--.

UNITED STATES PATENT AND TRADEMARK OFFICE
CERTIFICATE OF CORRECTION

PATENT NO.   :   5,068,603
DATED        :   November 26, 1991
INVENTOR(S)  :   John E. Mahoney It is certified that error appears in the above-identified patent and that said Letters Patent is hereby corrected as shown below:

Col. 30, line 15, change "$QN_4$" to --$Q_{N4}$--.

Col. 33, line 35, change "(FIG. 1)" to --(FIG. 11)--.

Col. 33, line 66, change "[4" to --[4]--.

Col. 35, line 55, after "wherein the", insert --mask configured".

Col. 35, line 66, change "an" to --a--.

Col. 35, line 66, change "original" to --user configured--.

Col. 38, line 2, change "witch" to --switch--.

Signed and Sealed this

Eighth Day of November, 1994

Attest:

BRUCE LEHMAN

*Attesting Officer*    *Commissioner of Patents and Trademarks*